US007224294B2

(12) United States Patent
Koyanagi

(10) Patent No.: US 7,224,294 B2
(45) Date of Patent: May 29, 2007

(54) COMPRESSING DEVICE AND METHOD, DECOMPRESSING DEVICE AND METHOD, COMPRESSING/DECOMPRESSING SYSTEM, PROGRAM, RECORD MEDIUM

(75) Inventor: Yukio Koyanagi, Saitama (JP)

(73) Assignee: Neuro Solution Corp (JP)

( * ) Notice: Subject to any disclaimer, the term of this patent is extended or adjusted under 35 U.S.C. 154(b) by 669 days.

(21) Appl. No.: 10/655,352

(22) Filed: Sep. 5, 2003

(65) Prior Publication Data

US 2005/0174188 A1   Aug. 11, 2005

Related U.S. Application Data

(63) Continuation of application No. PCT/JP02/04987, filed on May 23, 2002.

(30) Foreign Application Priority Data

Jun. 8, 2001  (JP) .............................. 2001-173884

(51) Int. Cl.
*H03M 7/34* (2006.01)
*H03M 7/38* (2006.01)
(52) U.S. Cl. .................. 341/51; 341/61; 708/290; 708/313
(58) Field of Classification Search .............. 341/51, 341/61, 65, 67, 87; 708/290
See application file for complete search history.

(56) References Cited

U.S. PATENT DOCUMENTS 5,327,125 A * 7/1994 Iwase et al. .................. 341/61

| | | | | |
|---|---|---|---|---|
| 6,515,608 B1 * | 2/2003 | Koyanagi | .................. | 341/144 |
| 6,657,567 B2 * | 12/2003 | Koyanagi | .................. | 341/60 |
| 6,735,608 B1 * | 5/2004 | Koyanagi et al. | .......... | 708/290 |
| 6,791,482 B2 * | 9/2004 | Koyanagi | .................. | 341/61 |
| 6,973,468 B2 * | 12/2005 | Koyanagi | .................. | 708/290 |

FOREIGN PATENT DOCUMENTS

| EP | 0260748 B1 | 7/1994 |
|---|---|---|
| JP | 02-205117 A1 | 5/1990 |
| JP | 2001-136073 A1 | 5/2001 |

\* cited by examiner

*Primary Examiner*—Khai M. Nguyen
(74) *Attorney, Agent, or Firm*—Connolly Bove Lodge & Hutz, LLP; Larry J. Hume

(57) ABSTRACT

A compressing device comprises plural stages of delay circuits ($1_{-1}$ to $4_{-1}$) and multiplying/adding circuits ($5_{-1}$ to $10_{-1}$) that performs weighted addition of output data from the delay circuits ($1_{-1}$ to $4_{-1}$) according to the value of a digital basic function and thereby determines thinned-out data from sampling data sequentially inputted. Since the thinned-out data is determined by the compression part using a digital basic function serving as the original of a sampling function of infinite supports defferentiable once or more times over the whole range, a compression ratio of at lease 8 can be achieved only by the simple four operations. Further, since interpolation data is determined by the decompression part by using the same digital basic function, the original data before the compression can be reproduced with substantial fidelity by only the simple four operations.

97 Claims, 21 Drawing Sheets

THINNING PRINCIPLE OF EMBODIMENT 1

INTERPOLATING PRINCIPLE OF EMBODIMENT 1

Fig. 11A

INTERPOLATING PRINCIPLE OF EMBODIMENT 2

THINNED-OUT DATA
→ $(16D+9(C+E)-(A+G))/32$
→ $(16F+9(E+G)-(C+I))/32$

Fig. 11B

INTERPOLATING PRINCIPLE OF EMBODIMENT 2

INTERPOLATION DATA
$(-A+9B+25C-D)/32$
$(-B+25C+9D-E)/32$
$(-B+9C+25D-E)/32$
$(-C+25D+9E-F)/32$

Fig. 13
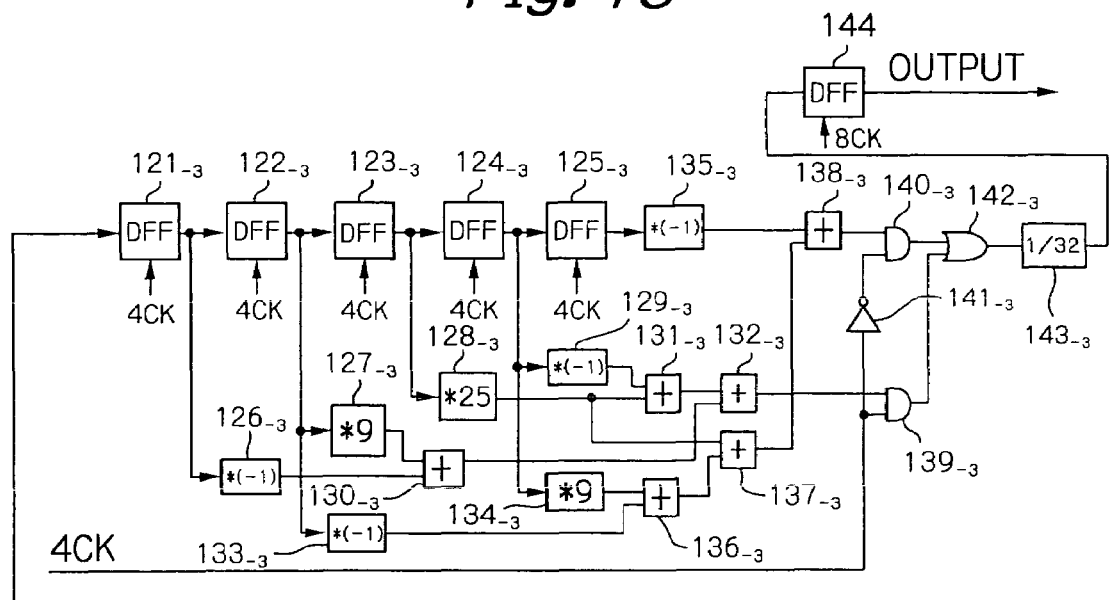
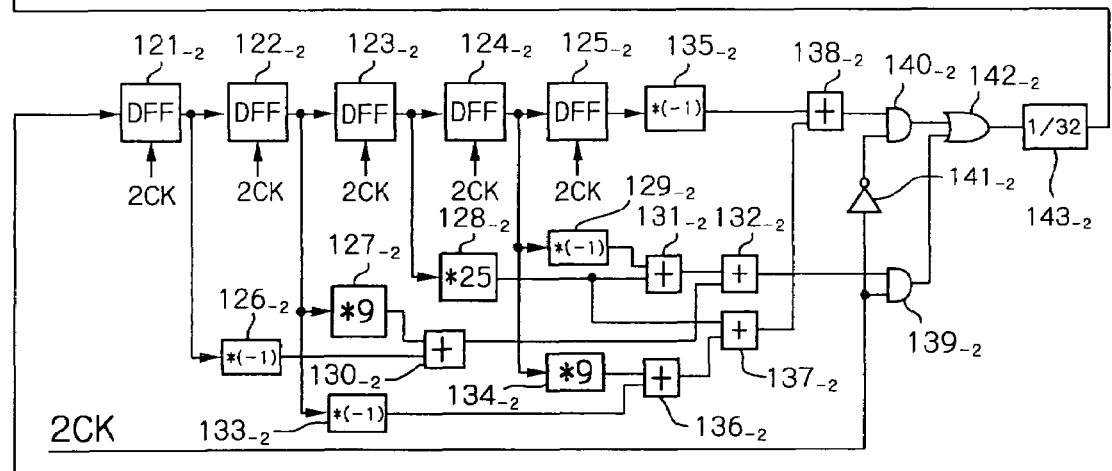
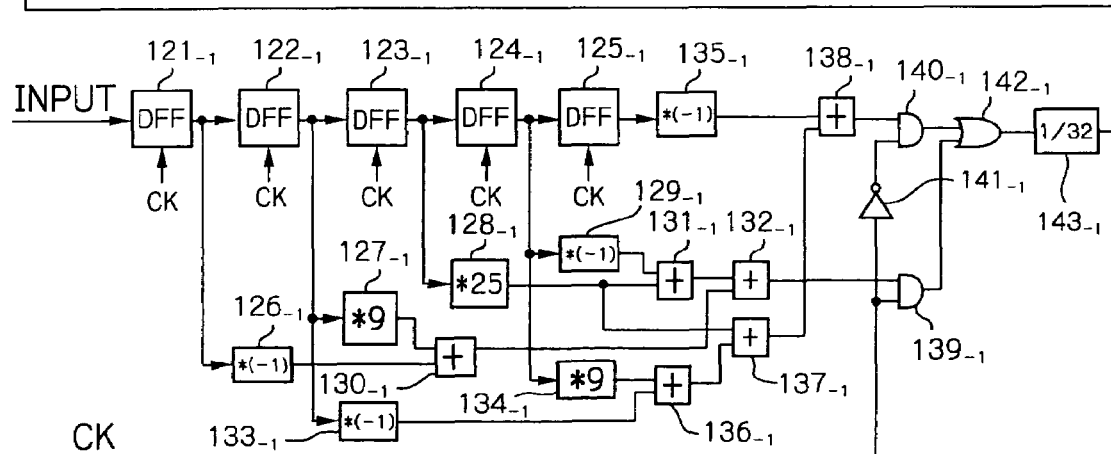

BETWEEN D1 AND D7

BETWEEN D1 AND D6

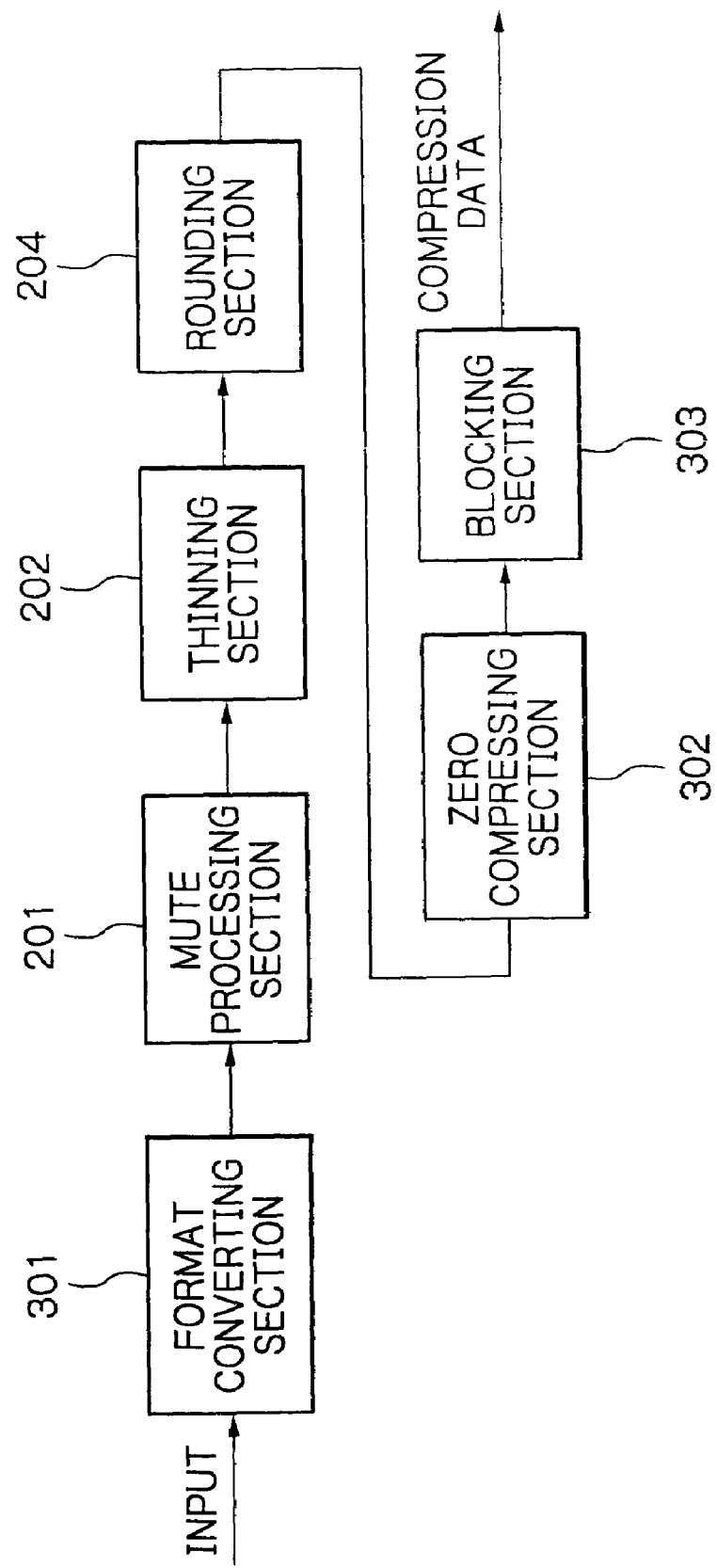

COMPRESSING DEVICE AND METHOD, DECOMPRESSING DEVICE AND METHOD, COMPRESSING/DECOMPRESSING SYSTEM, PROGRAM, RECORD MEDIUM

CROSS-REFERENCE TO RELATED APPLICATIONS

This application is a continuation application under 35 U.S.C. §120 of co-pending International Application PCT/JP02/04987, filed on May 23, 2002 by Yukio Koyanagi, and which claims priority from Japanese Application 2001-173884, filed on Jun. 8, 2001 by Yukio Koyanagi.

BACKGROUND OF THE INVENTION

1. Field of the Invention

The present invention relates to a compressing device and method, a decompressing device and method, a compressing/decompressing system, a program, and a record medium and particularly concerns methods of compressing and decompressing successive analog signals or discrete digital signals.

2. Description of the Related Art

Conventionally, in case of transmitting and accumulating a signal such as an image signal and an aural signal having a large amount of information, signals have been compressed and decompressed in order to reduce an amount of transmitted information and increase storable time in a storage medium. In general, when an analog signal is compressed, the analog signal is firstly sampled according to a predetermined sampling frequency and is digitalized, and a compressing operation is performed on obtained digital data.

Thinning compression has been present as an example of the compressing operation. The most simple method of thinning compression is that data on a predetermined sample point is discarded from all the sample points (conversely, only data on the predetermined sample point is used). For example, a double compression ratio can be achieved by adopting data on alternate sample points. When a compression ratio can be increased, data is used on every $n^{th}$ (>2) sample points.

According to this method, although signals can be compressed without performing any operations at all, decompression causes a problem of reproducibility to the original data. Namely, on the decompression part, data between sample points adopted during compression is obtained by an interpolating operation. More data are discarded on sample points that are originally required for accurately reproducing the original data as adopted sample points have a larger interval to increase a compression ratio. Thus, reproducibility to the original data is considerably degraded.

For this reason, in order to attain both of an improved compression ratio and reproducibility to the original data, an amount of information is normally thinned out by performing some operation on data on sample points. For example, a method of replacing data A and B on two adjacent sample points with an average data (A+B)/2 is available. With this method, unlike the case where one of the original data A and B is completely abandoned, since data added with both of the original data A and B is adopted as compression data (thinned-out data), reproducibility to the original data is somewhat improved.

However, such an operation cannot obtain any preferable reproducibility sufficiently for practical use. In order to increase a compression ratio and obtain data reproducibility sufficiently for practical use, more complicated operations are necessary.

Further, when thinning compression is performed, return noise is caused by degraded frequency characteristics and degrades the quality of signals obtained by decompression.

As described above, it has been extremely difficult to improve both of a compression ratio and the quality of reproduced data. In such a state, methods of compression and decompression for performing complicated operations are currently used instead of simple thinning compression in many cases.

For example, for compression of an image signal and an aural signal, the following method is used: after the original data is processed by using a conversion filter of a time axis—frequency axis of a DCT (Discreat-Cosine-Transform) and so on, compression is performed in a frequency area. DPCM (Differential Pulse Code Modulation) frequently used as a compressing method of an aural signal on a telephone line has been used in consideration of this point. Besides, the compressing method of DPCM is a method of coding a difference between adjacent sample values when a waveform is sampled.

As a method of time/frequency conversion, a method using a sub-band filter and MDCT (Modified Discrete Cosine Transform) is available, and MPEG (Moving Picture Image Coding Experts Group) audio is available as a coding method using such a method.

Further, an image compressing system used most widely has been generally known as an MPEG standard.

A decompressing operation for data compressed according to the above compressing method is basically performed according to the reversed operation of the compressing operation of the same compressing method.

Namely, compressed digital data is converted from a signal of a frequency area to a signal of a time area by frequency/time conversion processing, and then, a predetermined decompressing operation is performed, so that the original digital data is reproduced. Then, the original data obtained thus is subjected to digital-analog conversion at need, and the data is outputted as an analog signal.

In recent years, an amount of information has increased as an image signal and an aural signal become finer, and information communication using a mobile terminal, an Internet, and so on has become widespread. Thus, a higher compression ratio and the higher quality of reproduced data have been demanded increasingly. However, although improvement has been made in the above described conventional compressing and decompressing methods using DCT or the like, there is a limit on a higher compression ratio and reproduced data with higher quality. Hence, it has been extremely difficult to realize a higher compression ratio and higher quality.

Further, in the above described conventional compressing and decompressing methods, since a signal on a time base is converted to a signal on a frequency axis before compression, processing such as time/frequency conversion during compression and frequency/time conversion during decompression is necessary. Thus, there is a problem that the processing is complicated and the configuration for the processing is extremely complicated, resulting in difficulty in achieving a smaller device as well as longer processing time of compression and decompression.

The present invention is achieved to solve the above-described problems and has as its objective the provision of completely new compressing and decompressing methods of improving a compressing ratio and the quality of reproduced data.

Moreover, the present invention is also aimed to simplify the compressing and decompressing operations of a signal to shorten processing time and also simplify the configuration for performing the operations.

SUMMARY OF THE INVENTION

A compressing device of the present invention is comprising delay circuits of several stages for sequentially delaying each sampling data inputted therein in sequence, and a multiplying/adding circuit for performing weighted addition on data outputted from each of the delay circuits. The weighted addition is performed according to a value of a digital basic function, whereby thinned-out data is produced from the sequentially inputted sampling data.

Another aspect of the present invention is characterized that the delay circuits of the four stages and the multiplying/adding circuits are designed as a thinning-out circuit, and in the compressing device, at least two thinning-out circuits are connected so as to have a cascade connection.

Another aspect of the present invention is characterized in that sampling data is sequentially inputted therein as a target of compression, and then weighted addition is performed on sampling data on a target sample point and sampling data on several sample points around the target sample point, the weighted addition being performed according to a value of a digital basic function, whereby thinned-out data is produced from the sequentially inputted sampling data.

Another aspect of the present embodiment is comprising thinning-out means for performing weighted addition with respect to the inputted sampling data to produce thinned-out data therefrom, in which the weighted addition is performed on sampling data on a target sample point and sampling data on several sample points around the target sample point, the weighted addition being performed according to a value of a digital basic function, sampling point detecting means for detecting a sampling point using the thinned-out data produced by the thinning-out means, in which a sample point, where an error between each data value on a straight line connecting two thinned-out data and a thinned-out data value on the same sample point as that of the data value on the straight line is equal to or smaller than a predetermined value, is detected as the sampling point, and compression data producing means for producing, in the form of compression data, a pair of discrete amplitude data on each of the detected sampling points and timing data indicating a time interval between the detected sampling points.

Another aspect of the present invention is further comprising replacing means for replacing sampling data with zero data, in which among the discrete sampling data successively inputted as a target of compression, the sampling data to be replaced has an absolute value smaller than a predetermined value.

Another aspect of the present invention is further comprising replacing means for rounding by a predetermined value an absolute value of the sampling data inputted as a target of compression, as well as for performing a data replacement process, wherein in the data replacement process, the replacing means replaces sampling data with zero data, in which among the sampling data inputted as a target of compression, the sampling data to be replaced has absolute value smaller than a predetermined value.

Here, the rounding operation is performed by an operation in which data values before and after the rounding operation have a non-linear relationship.

Another aspect of the present invention is further comprising zero compressing means for performing a zero compressing process with respect to the thinned-out data outputted from the rounding means, wherein the zero compressing process is performed when a predetermined number or more of data having absolute values of zero are successively outputted from the rounding means, and wherein in the zero compressing process, a set of the predetermined number of zero data is replaced with a pair of a value of –0 and a value indicating the number of successive zero data, and then the thinned-out data including a replacement result is outputted from the zero compressing means.

Further, a compressing method of the present invention is characterized in that regarding sampling data sequentially inputted as a target of compression, thinned-out data is obtained from the sequentially inputted sampling data by performing weighted addition on sampling data on a target sample point and sampling data on several sample points around the target sample point according to a value of a digital basic function.

Another aspect of the present invention is comprising the steps of sequentially inputting sampling data as a target of compression, performing weighted addition with respect to the inputted sampling data, the weighted addition being performed on sampling data on a target sample point and sampling data on several sample points around the target sample point, and the weighted addition being performed according to a value of a digital basic function, whereby thinned-out data is produced from the sequentially inputted sampling data, determining a sampling point using the produced thinned-out data, in which a sample point, where a difference value between each data value on a straight line connecting two thinned-out data and a thinned-out data value on the same sample point as that of the data value on the straight line is equal to or smaller than a predetermined value, is detected as the sampling point, and producing, in the form of compression data, a pair of discrete amplitude data on each of the detected sampling points and timing data indicating a time interval between the detected sampling points.

Another aspect of the present invention is further comprising the step of replacing sampling data with zero data, in which among the discrete sampling data successively inputted as a target of compression, the sampling data to be replaced has an absolute value smaller than a predetermined value.

Another aspect of the present invention is further comprising the step of rounding lower-order bits of amplitude data on each of the detected sampling points.

Here, the rounding operation is performed by, for example, an operation in which data values before and after the rounding operation have a non-linear relationship.

Another aspect of the present invention is comprising further comprising the step of performing a zero compressing process with respect to the thinned-out data subjected to the rounding operation, wherein the zero compressing process is performed when a predetermined number or more of data having absolute values of zero are successively outputted in the rounding operation, and wherein in the zero compressing process a set of the predetermined number of zero data is replaced with a pair of a value of –0 and a value indicating the number of successive zero data, and then the thinned-out data including a replacement result is outputted.

Moreover, a decompressing device of the present invention is comprising delay circuits of several stages into which discrete thinned-out data produced by a compressing device can be inputted, each of the delay circuits delaying the inputted thinned-out data in sequence, and a multiplying/adding circuit for performing weighted addition on data outputted from each of the delay circuits, the weighted addition being performed according to a value of a digital basic function, whereby interpolation data for the thinned-out data is produced.

Another aspect of the present invention is characterized that the delay circuits and the multiplying/adding circuit are designed as an oversampling circuit, and in the decompressing device, at least two oversampling circuits are connected so as to have a cascade connection.

Another aspect of the present invention is further comprising an averaging circuit for producing average data of adjacent interpolation data values outputted from the multiplying/adding circuit.

Another aspect of the present invention is characterized in that thinned-out data is inputted therein sequentially, and then interpolation data for the thinned-out data inputted sequentially is produced by performing weighted addition on thinned-out data on a target sample point and thinned-out data on several sample points around the target sample point, in which the weighted addition is performed according to a value of a digital basic function.

Another aspect of the present invention is comprising first interpolating means for performing an interpolation process with respect to thinned-out data produced by a compressing device, in which in the interpolation process, timing data and amplitude data on each sampling point are used to produce first interpolation data for interpolating between one amplitude data and the other amplitude data which have a time interval indicated by the timing data, and second interpolating means for producing second interpolation data for the produced first interpolation data by performing a further interpolation process with respect to the produced first interpolation data, in which in the further interpolation process, weighted addition is performed on interpolation data on a target sample point and interpolation data on several sample points around the target sample point, the weighted addition being performed according to a value of a digital basic function.

Another aspect of the present invention is further comprising inverse rounding means for performing an inverse rounding operation on amplitude data on each sampling point in compression data, the inverse rounding operation being performed in a manner reversed from a rounding operation performed during compression by the compression device.

Another aspect of the present invention is further comprising interpolating means for performing an interpolation process with respect to discrete thinned-out data produced by a compressing device to produce interpolation data for the discrete thinned-out data, wherein in the interpolation process, weighted addition is performed on thinned-out data on a target sample point and thinned-out data on several sample points around the target sample point, the weighted addition being performed according to a value of a digital basic function.

Another aspect of the present invention is further comprising zero decompressing means for performing a zero decompressing process with respect to thinned-out data, in which when a −0 value is detected in the thinned-out data, a corresponding number of successive zero data are reproduced through the zero decompressing process.

Further, a decompressing method of the present invention is characterized in that regarding discrete thinned-out data, interpolation data for the discrete thinned-out data is obtained by performing weighted addition on thinned-out data on a target sample point and thinned-out data on several sample points around the target sample point according to a value of a digital basic function.

Another aspect of the present invention is characterized by performing an averaging operation on adjacent interpolation data regarding interpolation data obtained by performing weighted addition according to a value of the digital basic function.

Another aspect of the present invention is comprising the steps of performing a first interpolation, in which in the first interpolation process, timing data and amplitude data on each sampling point are used to produce first interpolation data for interpolating between one amplitude data and the other amplitude data which have a time interval indicated by the timing data, and performing a second interpolation process with respect to the produced first interpolation data to produce second interpolation data for the produced first interpolation data, in which another weighted addition is performed on first interpolation data on a target sample point and first interpolation data on several sample points around the target sample point, the weighted addition being performed according to a value of a digital basic function.

Another aspect of the present invention is further comprising the steps of performing an inverse rounding operation on amplitude data on each sampling point in compression data, the inverse rounding operation being performed in a manner reversed from a rounding operation performed during compression by the compressing method.

Another aspect of the present invention is characterized in that weighted addition is performed with respect to discrete thinned-out data, wherein the weighted addition is performed on thinned-out data on a target sample point and thinned-out data on several sample points around the target sample point to produce interpolation data for the discrete thinned-out data, the weighted addition being performed according to a value of a digital basic function.

Another aspect of the present invention is further comprising the steps of performing a zero decompressing process with respect to thinned-out data produced by a compressing method, in which when a −0 value is detected in the thinned-out data, a corresponding number of successive zero data are reproduced through the zero decompressing process.

Further, a program of the present invention is, for example, a compressing program for causing a computer to function as various means, a compressing program for causing the computer to perform the operating steps of a compressing method, a decompressing program for causing the computer to function as various means, or a decompressing program for causing the computer to perform the operating steps of a decompressing method.

Further, a record medium readable by a computer according to the present invention is characterized by recording, for example, a program for causing a computer to function as various means, a program for causing the computer to perform the operating steps of a compressing method, a program for causing the computer to function as various means, or a program for causing the computer to perform the operating steps of a decompressing method.

Moreover, a compressing/decompressing system of the present invention is characterized in that on the compression part, regarding sampling data sequentially inputted as a target of compression, thinned-out data is obtained from the sequentially inputted sampling data by performing weighted addition on sampling data on a target sample point and sampling data on several sample points around the target sample point according to a value of a digital basic function, and on the decompression part, regarding thinned-out data inputted in sequence, interpolation data for the sequentially inputted thinned-out data is obtained by performing weighted addition on thinned-out data on a target sample point and thinned-out data on several sample points around the target sample point according to a value of the digital basic function.

Another aspect of the present invention is characterized in that on the compression part, data having an absolute value smaller than a predetermined value is replaced with zero data in the sampling data inputted in sequence as a target of compression, and the thinned-out data is obtained by performing weighted addition on the replaced data according to a value of the digital basic function.

Another aspect of the present invention is characterized in that a rounding operation is performed for rounding lower-order bits of the obtained thinned-out data on the compression part, an operation reversed from the rounding operation is performed on the sequentially inputted thinned-out data on the decompression part, and the interpolation data is obtained by performing weighted addition on data after an inverse rounding operation according to a value of the digital basic function.

Another aspect of the present invention is characterized in that in the rounding operation on the compression part, data values before and after the inverse rounding operation have a non-linear relationship, and regarding the obtained thinned-out data after the rounding operation, when a predetermined number or more of data having absolute values of zero continues, the data are replaced with a pair of a value of −0 and a value indicating the number of successive zero data and the pair of values is outputted.

BRIEF DESCRIPTION OF THE DRAWINGS

FIG. 11 is a diagram for explaining thinning and interpolating principles according to Embodiment 2;

FIG. 13 is a diagram showing an example of a configuration of a decompressing device (interpolating device) according to Embodiment 2;

FIG. 25 is a diagram showing an example of a configuration of a compressing device according to Embodiment 4;

DETAILED DESCRIPTION OF THE PREFERRED EMBODIMENTS

Embodiment 1

The following will discuss Embodiment 1 of the present invention in accordance with the accompanied drawings.

Figure 1:
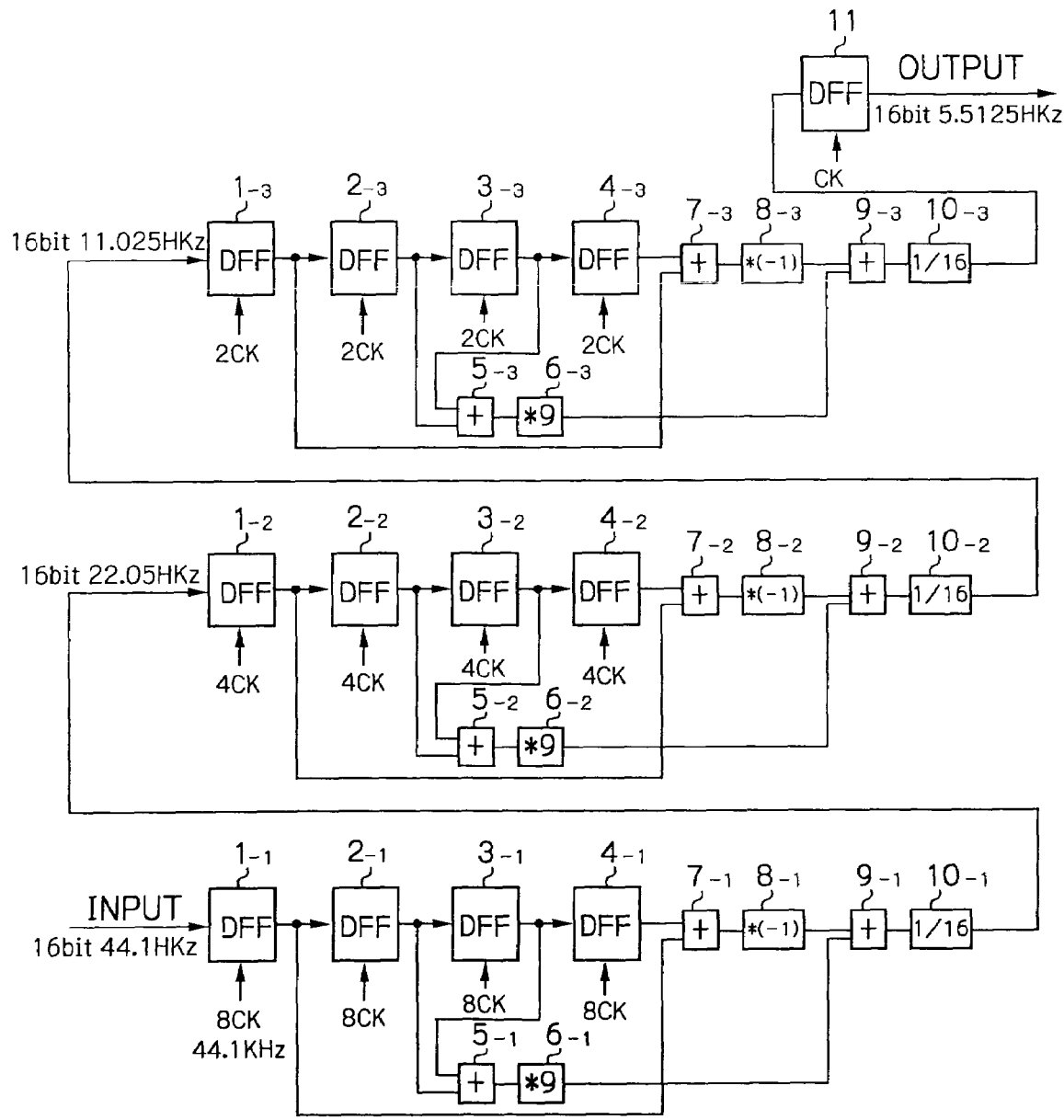
FIG. 1 is a diagram showing an example of a configuration of a compressing device (thinning-out device) according to Embodiment 1.
Figure 2:
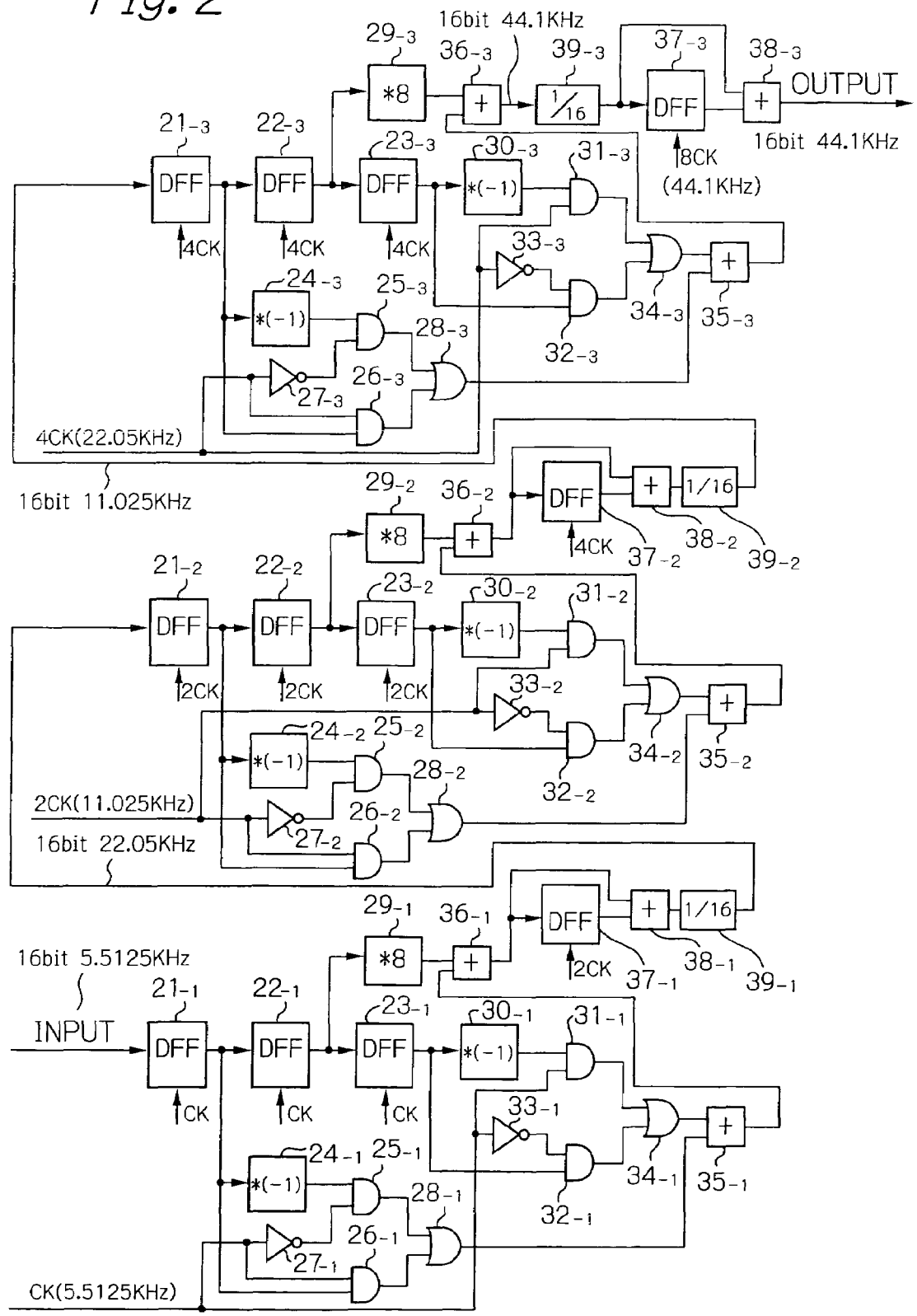
FIG. 2 is a diagram showing an example of a configuration of a decompressing device (interpolating device) according to Embodiment 1.

FIG. 1 is a diagram showing an example of a configuration of a compressing device (thinning device) according to Embodiment 1. FIG. 2 is a diagram showing an example of a configuration of a decompressing device (interpolating device) according to Embodiment 1. FIGS. 3(*a*) and 3(*b*) are diagrams for explaining thinning and interpolating principles according to Embodiment 1. FIG. 3(*a*) shows the thinning principle and FIG. 3(*b*) shows the interpolating principle.

First, referring to FIG. 3(*a*), the thinning principle of the present embodiment will be discussed. In a data structure of FIG. 3(*a*), the lateral axes of A, B, C, . . . denote sampling data on a sample point that is inputted in sequence on each clock and the data values are coefficients for a digital basic function. Further, the longitudinal axes of a, b, c, . . . denote center positions of sampling data processed by the digital basic function.

Figure 4:
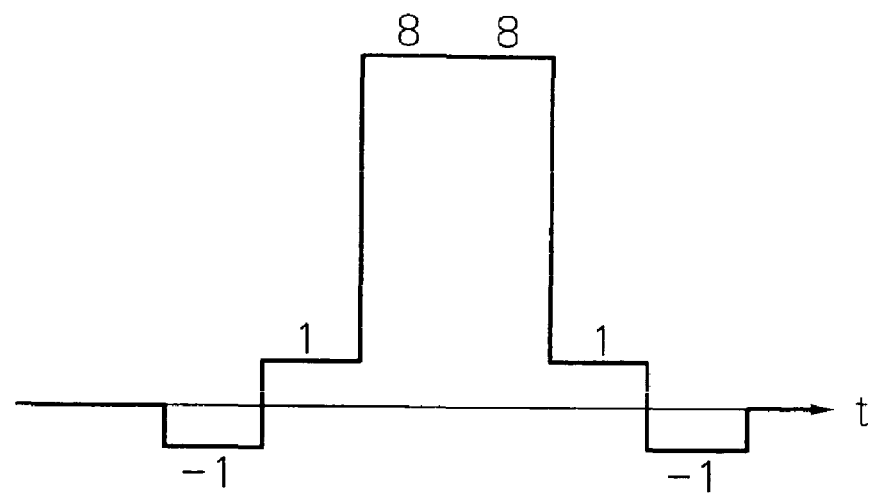
FIG. 4 is a diagram showing a digital basic function used in Embodiments 1 to 4.

The digital basic function used for this principle is a basic of a sampling function used for performing data interpolation of oversampling and is shown in FIG. 4. The digital basic function is produced by changing a data value to −1, 1, 8, 8, 1, and −1 on each clock.

Figure 3A:
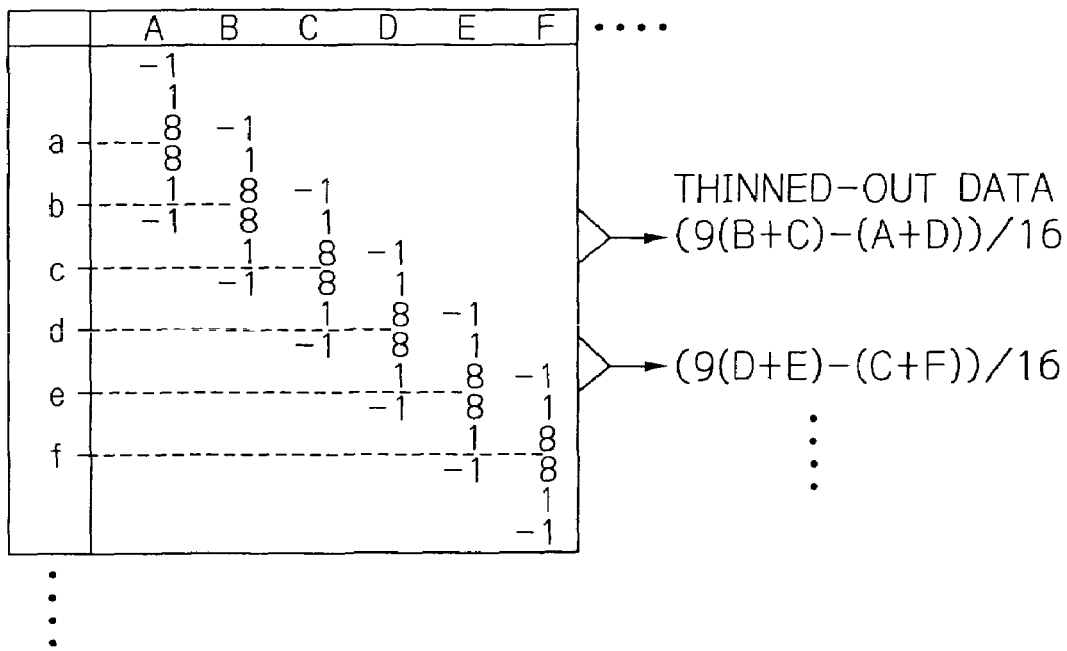
FIG. 3 is a diagram for explaining thinning and interpolating principles according to Embodiment 1.
Figure 3B:
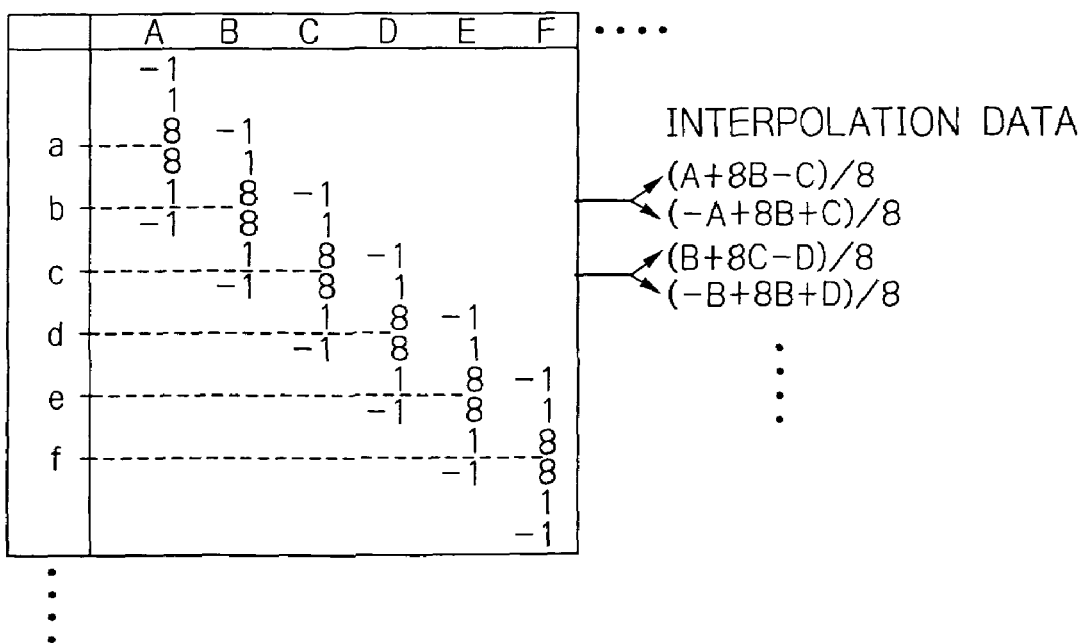

As shown in FIGS. 3(a) and 3(b), the digital basic function for sampling data A is provided by shifting each of the function values (−1, 1, 8, 8, 1, −1) by one clock while the first clock position is placed at the front. Moreover, the digital basic function for the subsequent sampling data B is provided by shifting each of the function values by one clock while a clock position after two clocks from the first clock position is placed at the front. Similarly, the digital basic functions for sampling data C, D, E, F, . . . inputted in sequence are provided by shifting each of the function values by one clock while a clock position further delayed by two clocks is placed at the front.

In the present embodiment, an operation for thinning out the sampling data A, B, C, . . . on the sample points to a half is performed based on such a data structure. Namely, a predetermined operation is performed on each pair of adjacent two sampling data of (B, C), (D, E), (F, G) . . . and each pair of the sampling data is replaced with one thinned-out data $(B+C)/2$, $(D+E)/2$, $(F+G)/2$, . . .

The following will discuss an example in which one thinned-out data $(B+C)/2$ is produced from two adjacent sampling data (B, C). When a center position b of the sampling data B processed by the digital basic function is interposed between two lines of data and the data are denoted by b1 and b2, b1 and b2 are expressed by the following equations.

$$b1 = A + 8B - C \quad (1)$$

$$b2 = -A + 8B + C \quad (2)$$

Based on equations (1) and (2), the following equation is established.

$$b = (b1 + b2)/2 = 8B, \text{ that is, } B = b/8 \quad (3)$$

Similarly, as to data on a center position c of sampling data C, the following equations are established.

$$c1 = B + 8C - D \quad (4)$$

$$c2 = -B + 8C + D \quad (5)$$

$$c = (c1 + c2)/2 = 8C, \text{ that is, } C = c/8 \quad (6)$$

Meanwhile, one thinned-out data $(B+C)/2$ of the two adjacent data (B, C) is obtained by a convoluting operation of data b2 and data c1. Namely, based on the above equations (2), (3), (4), and (6), the thinned-out data is expressed by the following equation.

$$(B+C)/2 = (b2 c1)/16$$

$$= ((-A + 8B + C) + (B + 8C - D))/16$$

$$= (9(B+C) - (A+D))/16 \ldots \quad (7)$$

In this way, the two sampling data B and C can be replaced with one thinned-out data $(B+C)/2$ expressed by equation (7). The thinned-out data is obtained as follows: from a value obtained by adding the two target sampling data B and C and multiplying the obtained value by nine sixteenth, a value is subtracted which is obtained by adding the two sampling data A and D adjacent to both sides of the two target sampling data B and C and multiplying the obtained value by one sixteenth.

Similarly, two sampling data (D, E) are replaced with one thinned-out data $(D+E)/2$. The same operation is performed on the succeeding sampling data (F, G) . . . Besides, since the first sampling data A lacks data required for performing the same operation, the state is kept as it is without performing the thinning-out operation.

In this way, the same thinning-out operation is performed based on data thinned to a half, so that the original data can be thinned to one fourth. Further, the same thinning-out operation is performed based on the data thinned to one fourth, so that the original data can be thinned to one eighth. Theoretically, the original data can be compressed to $½^n$ by repeating the same thinning-out operation n times.

Next, referring to FIG. 3(b), the following will discuss the principle of data interpolation according to the present embodiment. In the data structure of FIG. 3(b), the lateral axes of A, B, C, . . . denote sampling data on a sample point that is inputted in sequence on each clock and the data values are coefficients of a digital basic function. Further, the longitudinal axes of a, b, c, . . . denote center positions of thinned-out data processed by the digital basic function. The digital basic function used for this principle is also shown in FIG. 4.

As shown in FIG. 3(b), the digital basic function for thinned-out data A is provided by shifting each of the function values (−1, 1, 8, 8, 1, −1) by one clock while the first clock position is placed at the front. The digital basic function for the subsequent thinned-out data B is provided by shifting each of the function values by one clock while a clock position after two clocks from the first clock position is placed at the front. Similarly, the digital basic functions for thinned-out data C, D, E, F, . . . inputted in sequence are provided by shifting each of the function values by one clock while a clock position further delayed by two clocks is placed at the front.

The following will discuss an example in which two interpolation data B1 and B2 are produced from one thinned-out data B based on such a data structure. Here, b1 and b2 denote data on two lines, a center position b of the sampling data B processed by the digital basic function is interposed between two lines of data, and a convoluting operation is performed on the data b1 and b2. In this case, two adjacent data values b1 and b2 are expressed by the following equations.

$$b1 = A + 8B - C \quad (8)$$

$$b2 = -A + 8B + C \quad (9)$$

Based on the equations (8) and (9), the following equation is established.

$$b1 + b2 = 16B \quad (10)$$

This equation is transformed into the following equation.

$$B = (b1/8 + b2/8)/2 \quad (11)$$

According to equation (11), the thinned-out data B corresponds to an intermediate value between two data of b1/8 and b2/8. Conversely, one thinned-out data B can be replaced with two interpolation data B1 and B2 which are expressed by the following equations.

$$B1 = (A + 8B - C)/8 \quad (12)$$

$$B2 = (-A + 8B + C)/8 \quad (13)$$

Further, since the relationship indicated on the thinned-out data B by equation (11) is similarly established for other thinned-out data C, D, E, F, . . . , the following equations are established.

$$C=(c1/8+c2/8)/2$$

$$D=(d1/8+d2/8)/2$$

$$E=(e1/8+e2/8)/2$$

$$F=(f1/8+f2/8)/2$$

Therefore, as shown in the following equations, one thinned-out data C is replaced with two interpolation data C1 and C2, one thinned-out data D is replaced with two interpolation data D1 and D2, one thinned-out data E is replaced with two interpolation data E1 and E2, and one thinned-out data F is replaced with two interpolation data F1 and F2.

$$C \rightarrow C1=(B+8C-D)/8,\ C2=(-B+8C+D)/8$$

$$D \rightarrow D1=(C+8D-E)/8,\ D2=(-C+8D+E)/8$$

$$E \rightarrow E1=(D+8E-F)/8,\ E2=(-D+8E+F)/8$$

$$F \rightarrow F1=(E+8F-G)/8,\ F2=(-E+8F+G)/8$$

As described above, when an interpolation value is obtained for thinned-out data (e.g., data B) on a sample point, a value obtained by multiplying thinned-out data on the target sample point by 8 is added to values obtained by multiplying thinned-out data on sample points before and after the target sample point by +1 time and −1 time, and the added value is divided by 8 to obtain a first interpolation value (e.g., B1). Further, a value obtained by multiplying thinned-out data on the target sample point by 8 is added to values obtained by multiplying thinned-out data on sample points before and after the target sample point by −1 time and +1 time, and the added value is divided by 8 to obtain a second interpolation value (e.g., B2). The above operation is performed on thinned-out data on each sample point, so that the original thinned-out data is oversampled twice.

Moreover, the same interpolation is performed based on the data oversampled twice, so that the original thinned-out data can be oversamped to four times. Additionally, the same interpolation is performed based on the interpolation data oversampled to four times, so that the original thinned-out data can be oversampled to eight times. Theoretically, the same interpolation is repeated n times, so that the original thinned-out data can be oversampled to $2^n$ times.

When the thinning-out operation is performed n times on the compression part to compress the original data to $\frac{1}{2}^n$ times, the interpolating operation is repeated n times on the decompression part, so that inputted thinned-out data can be oversampled to $2^n$ times to reproduce the original data before compression.

Next, referring to FIG. 1, the following will discuss the configuration of a compressing device (thinning-out device) for realizing the above-described thinning-out operation according to Embodiment 1.

In the compressing device of FIG. 1, circuits for performing thinning-out of ½ time are cascaded in three stages and the circuit configurations of the first to third stages are discriminated by numerical subscripts (−1 to −3). Further, when the numerical subscripts are different and the main symbols are the same, the circuit configurations have the same function.

A thinning-out circuit of the first stage operates on a clock 8 CK of a reference frequency (e.g., 44.1 KHz). D-type flip-flops $1_{-1}$, $2_{-1}$, $3_{-1}$, and $4_{-1}$ of four stages delay sampling data (e.g., 16 bits), which are inputted in sequence in a discrete manner, by one clock 8 CK of the reference frequency one by one. These D-type flip-flops $1_{-1}$ to $4_{-1}$ correspond to delay circuits of four stages.

An adder $5_{-1}$ adds data retrieved from the output taps of the D-type flip-flops $2_{-1}$ and $3_{-1}$ of the second and third stages. An adder $6_{-1}$ multiplies the output data from the adder $5_{-1}$ by 9. The adder $5_{-1}$ and the adder $6_{-1}$ correspond to a first multiplying/adding circuit.

An adder $7_{-1}$ adds data retrieved from the output taps of the D-type flip-flops $1_{-1}$ and $4_{-1}$ of the first and fourth stages. A multiplier $8_{-1}$ multiplies the output data from the adder $7_{-1}$ by $_{-1}$. The adder $7_{-1}$ and the multiplier $8_{-1}$ correspond to a second multiplying/adding circuit.

An adder $9_{-1}$ adds the output data from the two multipliers $6_{-1}$ and $8_{-1}$. A multiplier $10_{-1}$ multiplies the output data from the adder $9_{-1}$ by {fraction (1/16)}. The adder $9_{-1}$ and the multiplier $10_{-1}$ correspond to a third multiplying/adding circuit.

To the above-described circuits, sampling data A, B, C, . . . , of FIG. 3(a) are inputted in sequence, so that ½ thinned-out data expressed by equation (7) is outputted from the multiplier $10_1$. The output data from the multiplier $10_{-1}$ is inputted to the D-type flip-flop $1_{-2}$ of a thinning-out circuit in the second stage and ½ thinning processing is performed in the second stage. The thinning-out circuit of the second stage operates in the same manner as that of the first stage except that the thinning-out circuit operates on a clock 4 CK whose frequency is half the reference frequency.

Besides, according to FIG. 1, after thinned-out data (B+C)/2 of equation (7) is outputted from the multiplier $10_{-1}$, data (C+D)/2 is outputted. However, the data (C+D)/2 is ignored because the thinning-out circuit of the second stage operates on the clock 4 CK whose frequency is half the reference frequency, and the subsequent output data (D+E)/2 is processed as thinned-out data in the thinning-out circuit of the second stage.

The output data from the multiplier $10_{-2}$ provided in the final stage of the thinning-out circuit of the second stage is inputted to the D-type flip-flop $1_{-3}$ in the thinning-out circuit of the third stage, and ½ thinning-out processing is performed in the third stage. The thinning-out circuit of the third stage operates in the same manner as that of the first stage except for the thinning-out circuit operates on a clock 2 CK whose frequency is one fourth of the reference frequency. Data outputted from the thinning-out circuit of the third stage is held by a D-type flip-flop 11 according to a clock CK whose frequency is one eighth of the reference frequency, and then, the data is outputted as final thinning-out data (compressed data).

Next, referring to FIG. 2, the configuration of a decompressing device (interpolating device) for realizing the above-described interpolating operation according to Embodiment 1.

In the decompressing device of FIG. 2, circuits for performing double oversampling are cascaded in three stages and the circuit configurations of the first to third stages are discriminated by numerical subscripts (−1 to −3). Further, when the numerical subscripts are different but the main symbols are the same, the circuit configurations have the same function.

An oversampling circuit of the first stage operates on a clock CK whose frequency (5.5125 KHz) is one eighth of the reference frequency. D-type flip-flops $21_{-1}$, $22_{-1}$, and $23_{-1}$ of three stages delay thinned-out data one by one, which are inputted in sequence in a discrete manner, by one clock CK. These D-type flip-flops $21_{-1}$, $22_{-1}$, and $23_{-1}$ correspond to delay circuits of three stages.

For example, data retrieved from the output tap of the D-type flip-flop $21_{-1}$ forms the first terms of equations (12) and (13), data retrieved from the output tap of the D-type flip-flops $22_{-1}$ of the second stage forms the second term, and data retrieved from the output tap of the D-type flip-flops $23_{-1}$ of the third stage forms the third term.

The output data from the D-type flip-flops $21_{-1}$ of the first stage is inputted to one of the input terminals of an AND gate $25_{-1}$ via a multiplier $24_{-1}$ of $-1$ time and is inputted to one of the input terminals of an AND gate $26_{-1}$ without passing through a multiplier (corresponding to $+1$ time). An inversion clock CK passing through an inverter $27_{-1}$ is inputted to the other input terminal of the AND gate $25_{-1}$ is fed with. Further, the clock CK is inputted to the other input terminal of the AND gate $26_{-1}$.

The output data from the two AND gates $25_{-1}$ and $26_{-1}$ are outputted via an OR gate $28_{-1}$. Thus, thinned-out data of $+1$ time is outputted from the OR gate $28_{-1}$ when the clock CK is "H". Further, thinned-out data of $-1$ time is outputted from the OR gate $28_{-1}$ when the clock CK is "L". Namely, the first term of equation (12) is obtained when the clock CK is "H", and the first term of equation (13) is obtained when the clock CK is "L". A first switching circuit is constituted by the two AND gates $25_{-1}$ and $26_{-1}$, the inverter $27_{-1}$, and the OR gate $28_{-1}$.

The output data from the D-type flip-flop $22_{-1}$ of the second stage is outputted via a multiplier $29_{-1}$ of $+8$ times (corresponding to a second multiplier). As shown in equations (12) and (13), since the ".+−." sign of the second term is not changed in both of the equations, unlike the first term, a circuit for switching the sign based on the clock CK is not necessary.

The output data from the D-type flip-flops $23_{-1}$ of the third stage is inputted to one of the input terminals of an AND gate $31_{-1}$ via a multiplier $30_{-1}$ of $-1$ time (corresponding to a third multiplier) and is inputted to one of the input terminals of an AND gate $32_{-1}$ without passing through a multiplier (corresponding to $+1$ time). The clock CK is inputted to the other input terminal of the AND gate $31_{-1}$. Further, the inversion clock CK passing through an inverter $33_{-1}$ is inputted to the other input terminal of the AND gate $32_{-1}$.

The output data from the two AND gates $31_{-1}$ and $32_{-1}$ are outputted via an OR gate $34_{-1}$. Thus, thinned-out data of $-1$ time is outputted from the OR gate $34_{-1}$ when the clock CK is "H". Further, thinned-out data of $+1$ time is outputted from the OR gate $34_{-1}$ when the clock CK is "L". Namely, the third term of equation (12) is obtained when the clock CK is "H", and the third term of equation (13) is obtained when the clock CK is "L". A second switching circuit is constituted by the two AND gates $31_{-1}$ and $32_{-1}$, the inverter $33_{-1}$, and the OR gate $34_{-1}$.

The output data from the OR gate $28_{-1}$, the output data from the eight-times multiplier $29_{-1}$, and the output data from the OR gate $34_{-1}$ are all added by two adders $35_{-1}$ and $36_{-1}$ (corresponding to an adder). Thus, the arithmetic result of equation (12) is outputted from the adder $36_{-1}$ when the clock CK is "H", and the arithmetic result of equation (13) is outputted from the adder $36_{-1}$ when the clock CK is "L".

The thinned-out data A, B, C, . . . , of FIG. 3(b) are inputted in sequence to the above-described circuit, so that interpolation data A, B1, B2, C1, C2, . . . , oversampled twice are outputted from the adder $36_{-1}$. Besides, the data values are multiplied by ⅛ in equations (12) and (13). A circuit for the multiplication is provided in the final stage of the oversampling circuit of the first stage.

In a data interpolating device of FIG. 2, for example, when two interpolation data B1 and B2 are produced from one thinned data B, data is produced by using one eight-times multiplier $29_{-1}$ in common for the second term of equations (12) and (13) which are shared by the interpolation data. In this way, the circuit shared for producing two interpolation data is used in common as much as possible, thereby simplifying the entire circuit configuration.

An averaging circuit constituted by a D-type flip-flop $37_{-1}$, an adder $38_{-1}$, and a 1/16-time multiplier $39_{-1}$ is provided in the output stage of the adder $36_{-1}$. Additionally, ⅛ time of the 1/16-time multiplier $39_{-1}$ corresponds to ⅛ time of the equations (12) and (13) and the remaining ½ time constitutes a part of the averaging circuit.

The D-type flip-flop $37_{-1}$ delays the output data from the adder $36_{-1}$ by one clock according to a clock 2 CK whose frequency is one fourth of the reference frequency. The adder $38_{-1}$ adds the output data from the adder $36_{-1}$ and the output data from the D-type flip-flop $37_{-1}$. The 1/16-time multiplier $39_{-1}$ multiplies the output data from the adder $38_{-1}$ by 1/16 time.

The averaging circuit is provided for returning a relative position of the clock, which is shifted by the interpolation, to the original position. For example, when the interpolation data B1, B2, C1, C2, . . . , are outputted from the adder $36_{-1}$, the operations of (B1+B2)/2, (B2+C1)/2, (C1+C2)/2, . . . are performed in sequence in the averaging circuit.

The results of the averaging operation will be expressed by the following equations.

$$(B1+B2)/2=\{\{(A+8B-C)/8\}+\{(-A+8B+C)/8\}\}/2=B$$
$$(B2+C1)/2=\{\{(-A+8B+C)/8\}+\{(B+8C-D)/8\}\}/2=(-A+9B+9C-D)/16 \quad (14)$$
$$(C1+C2)/2=\{\{(B+8C-D)/8\}+\{(-B+8C+D)/8\}\}/2=C$$

The shifted relative position of the clock is returned to the original position. Hence, as will be discussed later in FIG. 7, the above-described averaging operation makes it possible to obtain a preferable frequency characteristic for the obtained sampling function.

The output data from the 1/16-time multiplier $39_{-1}$ is inputted to the D-type flip-flop $21_{-2}$ in the oversampling circuit of the second stage, and double oversampling is performed in the second stage. The oversampling circuit of the second stage operates in the same manner as that of the first stage except that the oversampling circuit operates on a clock 2 CK whose frequency is one fourth of the reference frequency.

The output data from a 1/16-time multiplier $39_{-2}$, which is provided in the final stage of the oversampling circuit of the second stage, is inputted to the D-type flip-flop $21_{-3}$ in the oversampling circuit of the third stage and double oversampling is performed in the third stage. The oversampling circuit of the third stage operates in the same manner as that of the first stage except that the oversampling circuit operates on a clock 4 CK whose frequency is half the reference frequency.

Figure 5:
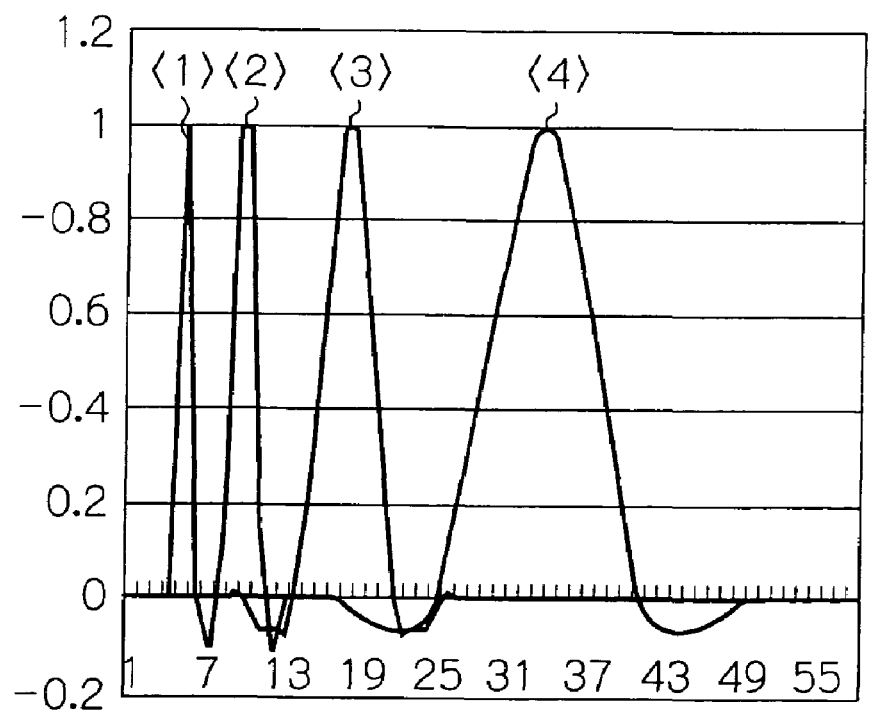
FIG. 5 is a characteristic diagram showing oversampling results obtained by inputting data of a unit pulse to the decompressing device of FIG. 2.

FIG. 5 is a characteristic diagram showing oversampling results obtained by inputting data of a unit pulse to the decompressing device of FIG. 2. In FIG. 5, <1> denotes input data of the unit pulse, <2> denotes double oversampling data, <3> denotes four-times oversampling data, and <4> denotes eight-times oversampling data. The waveform function of the oversampling data indicated by <4> can be differentiated once or more times over the whole range, and the waveform function is a sampling function of a finite base that converges to 0 on a finite sampling position.

Therefore, when the data interpolation of the present embodiment is used, the sampling function of <4> in FIG. 5 is consequently used to perform superposition based on discrete thinned-out data, thereby smoothly interpolating values between thinned-out data by using the function differentiable once or more times.

In a conventional method of data interpolation of artificially increasing a sampling frequency by an interpolating operation, a sampling function referred to as a sinc function is normally used.

Figure 6:
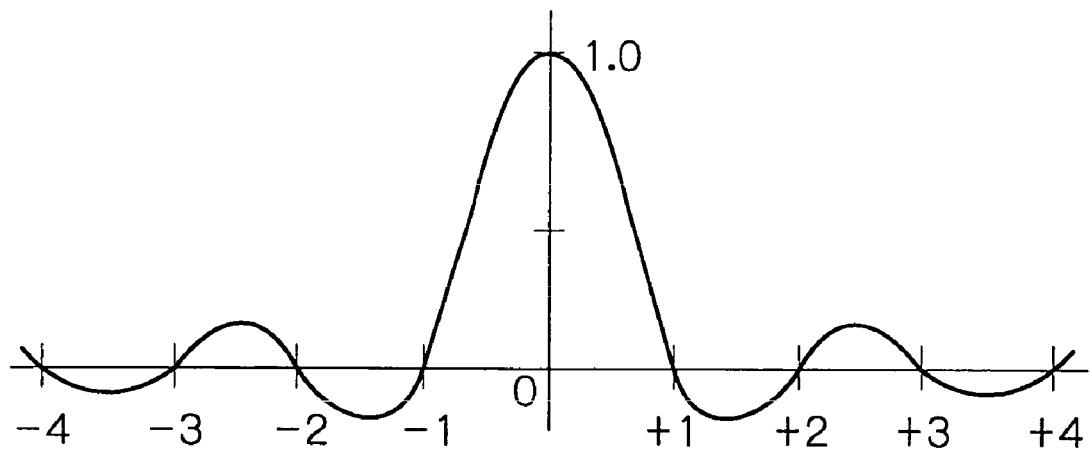
FIG. 6 is an explanatory drawing showing a sinc function.

FIG. 6 is an explanatory view showing a sinc function. The sinc function is obtained when Dirac delta function is subjected to inverse Fourier transform. The sinc function is defined by $\sin(\pi ft)/(\pi ft)$ where f denotes a sampling frequency. The sinc function has a value of 1 only on the sample point of t=0 and has a value of 0 on other sample points.

In a method of data interpolation using such a sinc function, after obtained interpolation values are held by a sample holding circuit to produce a stepped signal waveform, a smooth signal is outputted by passing the waveform through a low-pass filter. However, in this method, an outputted continuous signal is degraded in phase characteristic by a low-pass filter.

Further, since the above sinc function is a function converging to 0 at ±8, when an accurate interpolation value is obtained, it is necessary to calculate and add sinc function values corresponding to all the sampling data values. However, in reality, because of the processing capability, the circuit size, and so on, a convoluting operation is performed while the range of sampling data to be considered is limited. For this reason, obtained interpolation values include a truncation error and an accurate interpolation value cannot be obtained.

On the other hand, the sampling function of <4> in FIG. 5 is a function of a finite base differentiable once or more times over the whole range. A sampling position along the lateral axis has a finite value other than 0 only in a finite and local area and has a value of 0 in other areas.

Moreover, the sampling function of <4> in FIG. 5 is a function having a maximum value only on the central sample point and has a value of 0 on the other several sample points. The function passes through all of the sample points required for obtaining a signal with a smooth waveform.

Therefore, instead of the conventional sinc function of FIG. 6, the sampling function of <4> in FIG. 5 is used to perform superposition based on thinned-out data, so that values between thinned-out data can be smoothly interpolated by using a function differentiable once or more times. Hence, it is possible to eliminate the necessity for a low-pass filter and to prevent degradation of the phase characteristic.

Further, since the sampling function of <4> in FIG. 5 converges to 0 on the finite sample point, only discrete data need to be considered within the finite range. Therefore, when a certain interpolation value is calculated, it is necessary to consider only a limited number of thinned-out data values, thereby significantly reducing the processing amount. Additionally, each thinned-out data out of the finite range originally needs to be essentially considered but is ignored in view of the processing amount and accuracy or the like. The truth is that such thinned-out data does not need to be considered theoretically. Hence, it is also possible to prevent the occurrence of a truncation error.

Moreover, on the compression part, for example, when one thinned-out data is obtained from two sampling data B and C, as expressed in equation (7), the thinned-out data is obtained by an operation considering sampling data A and D, which are adjacent to both sides of the target sampling data B and C, instead of a simple operation using only the target sampling data B and C. In this case, the operation is performed based on a digital basic function serving as the original of a sampling function causing no truncation error. Thus, at least when thinned-out data is obtained as expressed in equation (7) in consideration of the sampling data A and D adjacent to both sides of the sampling data B and C, it is possible to obtain thinned-out data required for faithfully reproducing original data on the decompression part.

Figure 7:
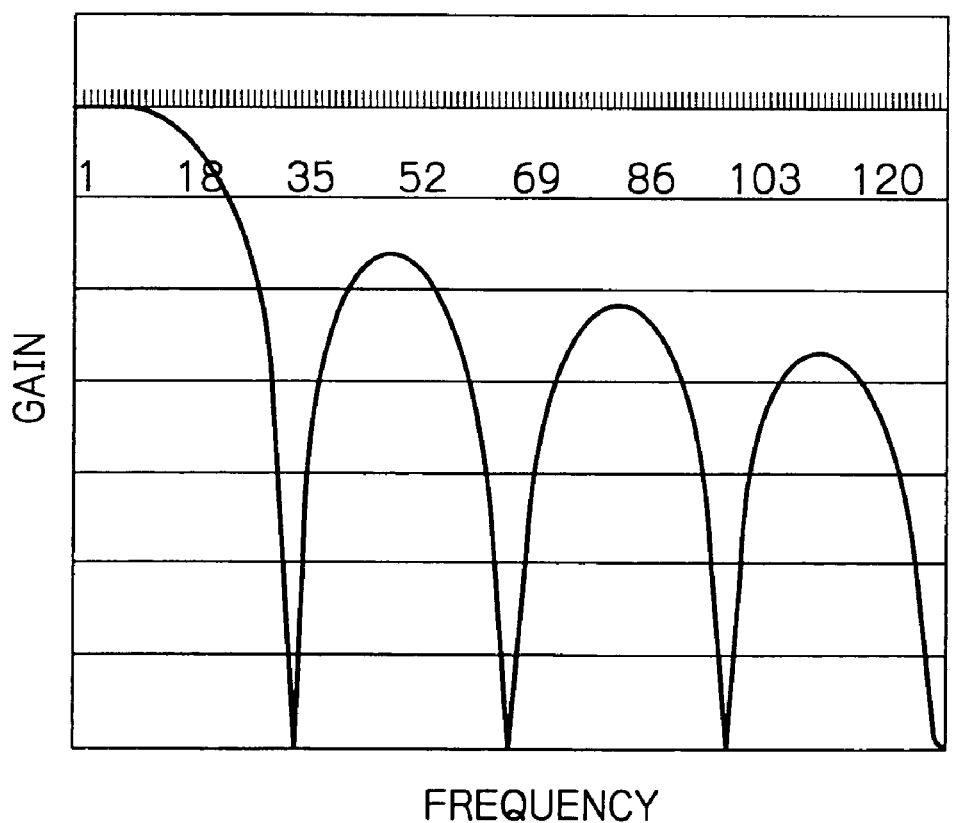
FIG. 7 is a diagram showing a frequency characteristic of a sampling function of <4> in FIG. 5.

FIG. 7 is a diagram showing a frequency characteristic of the sampling function of <4> in FIG. 5. As shown in FIG. 7, an extremely preferable frequency characteristic is obtained. According to FIG. 7, a notch filter enters right on a point where so-called return noise occurs, thereby effectively preventing the occurrence of return noise.

Besides, the decompressing device of FIG. 2 is an example of the circuit configuration for realizing the decompressing method of the present invention. The decompressing device is not limited to the above.

For example, the following circuits may be separately provided: a first multiplying/adding circuit for multiplying data retrieved from the output taps of the three D-type flip-flops by −1, 8, and +1 and adding the data, and a second multiplying/adding circuit for multiplying data retrieved from the output taps of the three D-type flip-flops by +1, 8, and −1 and adding the data.

Figure 8:
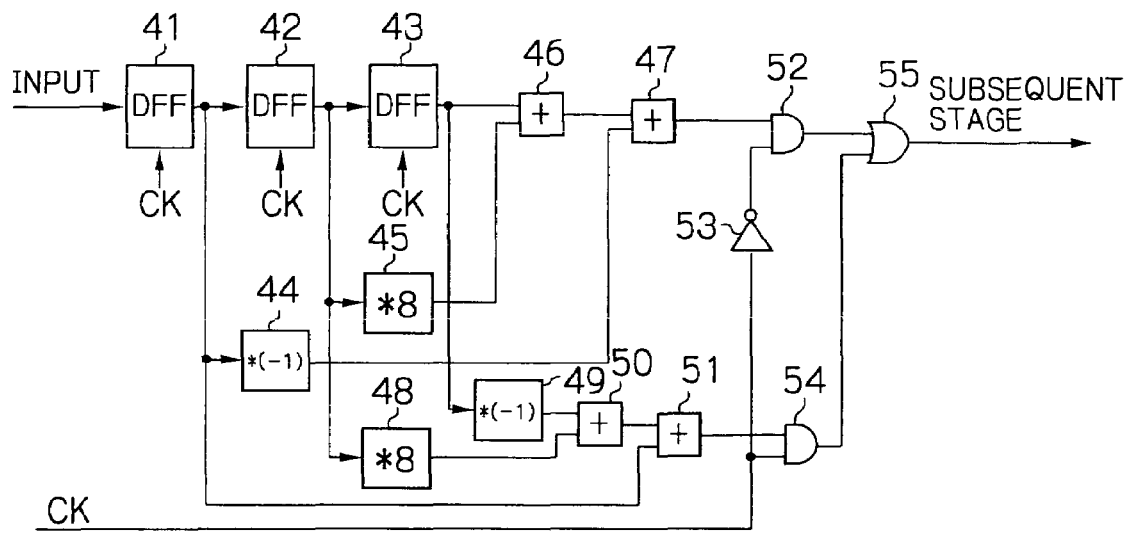
FIG. 8 is a diagram showing another example of the configuration of the decompressing device according to Embodiment 1.

FIG. 8 is a diagram showing an example of a circuit configuration of this case. Here, only a circuit for double oversampling is shown in FIG. 8. As with FIG. 2, $2^n$-times oversampling can be performed by cascading similar n circuits. Further, the averaging circuit is not shown in FIG. 8.

In FIG. 8, D-type flip-flops 41, 42, and 43 of three stages delay thinned-out data one by one, which are inputted in sequence in a discrete manner, by one clock CK. A first multiplying/adding circuit comprises a first multiplier 44 for multiplying the output data from the D-type flip-flop 41 in the first stage by −1, a second multiplier 45 for multiplying the output data from the D-type flip-flop 42 in the second stage by 8, and adders 46 and 47 for adding output data from the first multiplier 44, the output data from the second multiplier 45, and the output data from the D-type flip-flop 43 of the third stage.

Moreover, a second multiplying/adding circuit comprises a third multiplier 48 for multiplying the output data from the D-type flip-flop 42 of the second stage by 8, a fourth multiplier 49 for multiplying the output data from the D-type flip-flop 43 of the third stage by −1, and adders 50 and 51 for adding the output data from the third multiplier 48, the output data from the fourth multiplier 49, and the output data from the D-type flip-flop 41 of the first stage.

Data outputted from the first multiplying/adding circuit (adder 47) is inputted to one of the input terminals of an AND gate 52. An inversion clock CK passing through an inverter 53 is inputted to the other input terminal of the AND gate 52. Further, data outputted from the second multiplying/adding circuit (adder 51) is inputted to one of the input terminals of an AND gate 54. A clock CK is inputted to the other input terminal of the AND gate 54.

The output data from the two AND gates 52 and 54 are outputted via an OR gate 55. Thus, the arithmetic result of equation (12) is outputted from the OR gate 55 when the clock CK is "H", and the arithmetic result of equation (13) is outputted from the OR gate 55 when the clock CK is "L".

Figure 9:
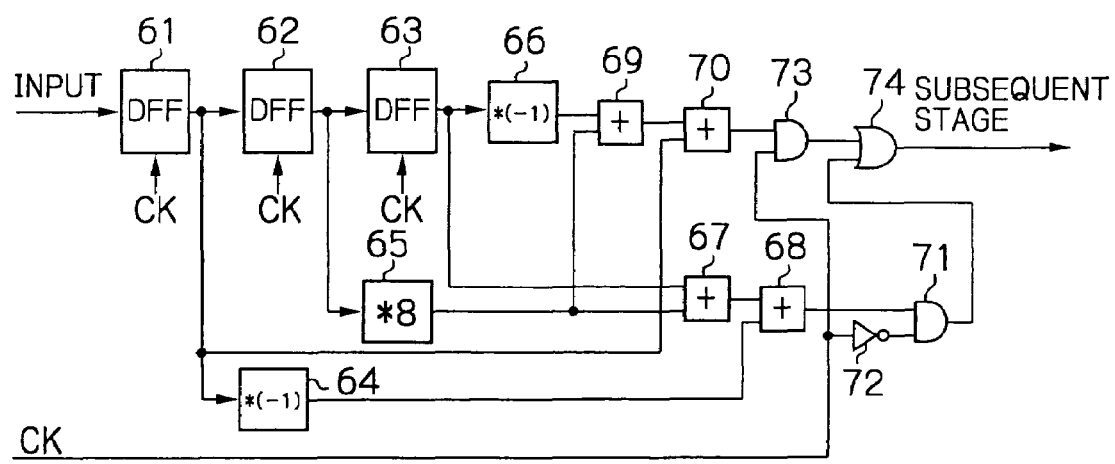
FIG. 9 is a diagram showing another example of the configuration of the decompressing device according to Embodiment 1.

Further, instead of using the two eight-times multipliers in FIG. 8, one eight-times multiplier may be shared as shown in FIG. 9. Additionally, although FIG. 9 shows only circuits for performing double oversampling, $2^n$-times oversampling can be performed by cascading n similar circuits. Moreover, an averaging circuit is omitted in FIG. 9 as well.

A decompressing device shown in FIG. 9 comprises D-type flip-flops 61, 62, and 63 of three stages for delaying thinned-out data one by one, which are inputted in sequence, by one clock CK. Further, the decompressing device comprises a first multiplier 64 for multiplying output data from the D-type flip-flop 61 of the first stage by −1, a second multiplier 65 for multiplying output data from the D-type flip-flop 62 of the second stage by 8, and a third multiplier 66 for multiplying output data from the D-type flip-flop 63 of the third stage by −1.

Moreover, the decompressing device comprises first adders 67 and 68 for adding the output data from the first multiplier 64, the output data from the second multiplier 65, and the output data from the D-type flip-flop 63 of the third stage, and second adders 69 and 70 for adding the output data from the second multiplier 65, the output data from the third multiplier 66, and the output data from the D-type flip-flop 61 of the first stage.

Data outputted from the adder 68 is inputted to one of the input terminals of an AND gate 71. An inversion clock CK passing through an inverter 72 is inputted to the other input terminal of the AND gate 71. Moreover, data outputted from the adder 70 is inputted to one of the input terminals of an AND gate 73. A clock CK is inputted to the other input terminal of the AND gate 73.

Output data from the two AND gates 71 and 73 are outputted via an OR gate 74. Thus, the arithmetic result of equation (12) is outputted from the OR gate 74 when the clock CK is "H", and the arithmetic result of equation (13) is outputted from the OR gate 74 when the clock CK is "L".

Besides, in the above embodiment, data is interpolated by performing the operations of equations (12) and (13), and a shifted relative position of the clock is corrected by further performing an averaging operation on obtained interpolation data. Meanwhile, the averaging operation may be omitted by directly performing the operation of equation (14).

When the operation of equation (14) is directly performed, as to thinned-out data inputted in sequence, weighted addition according to the value of a digital basic function is performed on thinned-out data on two adjacent target sample points and thinned-out data on sample points which are adjacent to both sides of the target points, so that interpolation data for interpolating thinned-out data on the two sample points is obtained in sequence. For example, when the two target thinned-out data are B and C, interpolation data (B+C)/2 between B and C will be calculated by the following equation.

$$(B+C)/2=(-A+9B+9C-D)/16 \tag{15}$$

Figure 10:
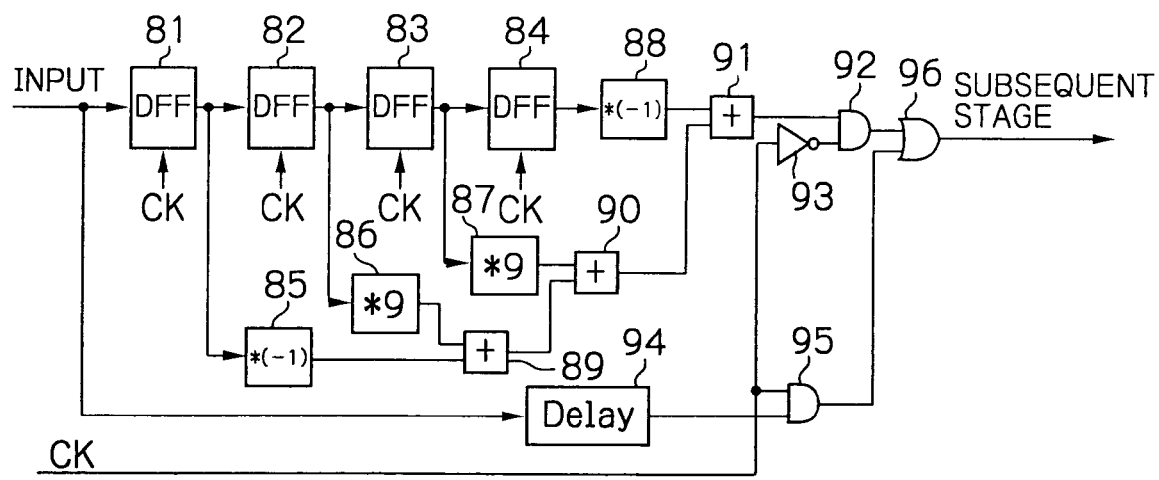
FIG. 10 is a diagram showing another example of the configuration of the decompressing device according to Embodiment 1.

FIG. 10 is a diagram showing an example of the circuit configuration of this case. Although only a circuit for performing double oversampling is shown in FIG. 10 as well, $2^n$-times oversampling can be performed by cascading n similar circuits.

A decompressing device of FIG. 10 comprises D-type flip-flops 81, 82, 83, and 84 of four stages for delaying thinned-out data, which are inputted in sequence, by one clock CK one by one. The D-type flip-flops 81 to 84 of four stages correspond to delay circuits of four stages.

Further, the decompressing device comprises a first multiplier 85 for multiplying the output data from the D-type flip-flop 81 of the first stage by −1, a second multiplier 86 for multiplying the output data from the D-type flip-flop 82 of the second stage by 9, a third multiplier 87 for multiplying the output data from the D-type flip-flop 83 of the third stage by 9, and a fourth multiplier 88 for multiplying the output data from the D-type flip-flop 84 of the fourth stage by −1. Furthermore, the decompressing device comprises adders 89, 90, and 91 for adding all the output data from the first to fourth multipliers 85 to 88.

Data outputted from the adder 91 is inputted to one of the input terminals of an AND gate 92. An inversion clock CK passing through an inverter 93 is inputted to the other input terminal of the AND gate 92. Moreover, thinned-out data inputted to the D-type flip-flop 81 of the first stage is inputted to one of the input terminals of an AND gate 95 via a delay circuit 94 for making delay according to a delay of each of the circuit blocks 81 to 91. A clock CK is inputted to the other input terminal of the AND gate 95.

The output data from the two AND gates 92 and 95 are outputted via an OR gate 96. Thus, when the clock CK is "H", inputted thinned-out data is directly outputted from the OR gate 96. When the clock CK is "L", interpolation data obtained by equation (15) is outputted from the OR gate 96.

Besides, FIG. 10 shows an example for performing the operation of equation (15) and the configuration is not limited to that of FIG. 10. For example, instead of the multiplying/adding circuits 85 to 91 shown in FIG. 10, the following configuration may be used: a multiplying/adding circuit is constituted by a first adder for adding the output data from the D-type flip-flop 81 of the first stage and the output data from the D-type flip-flop 84 of the fourth stage, a second adder for adding the output data from the D-type flip-flop 82 of the second stage and the output data from the D-type flip-flop 83 of the third stage, a first multiplier for multiplying the output data from the first adder by −1, a second multiplier for multiplying the output data from the second adder by 9, and a third adder for adding the output data from the first multiplier and the output data from the second multiplier. In this way, multipliers can be omitted.

As described above in detail, according to Embodiment 1, thinned-out data is obtained on the compression part based on a digital basic function serving as the original of a sampling function of a finite base differentiable once or more times over the whole range, thereby achieving a compression ratio of at least 8. Further, interpolation data using the same digital basic function is obtained on the compression part, so that the original data before compression can be reproduced with substantial fidelity. The thinned-out data at this point can be obtained only by the quite simple four operations of equation (7) and interpolation data can be obtained by the quite simple four operations of equations (12) and (13) or equation (14).

According to these equations (7), (12), (13), and (14), when thinned-out data and interpolation data are obtained for discrete data on a certain sample point, it is necessary to consider only discrete data on a target sample point and discrete data on several sample points around the target point. Further, data to be compressed can be compressed and decompressed as it is on a time base without performing time/frequency conversion on the data, thereby simplifying the configuration without complicated operations.

Therefore, according to the present embodiment, it is possible to achieve shorter operation time as well as a higher compression ratio and higher quality and to simplify the arithmetic circuit.

Moreover, in Embodiment 1, data values changed to −1, 1, 8, 8, −1 on each clock were used as a digital basic function. Although the numeric values are the best, other numeric values (e.g., a numeric value having a weight of 1 or 0 instead of −1 on a part corresponding to both sides, a numeric value having a weight other than 8 on a part corresponding to the center, etc.) is also applicable as a digital basic function.

Further, in Embodiment 1, the compressing device and the decompressing device are constituted by combining logic circuits like hardware. The devices may be constituted by a CPU or a computer system comprising an MPU, a ROM, and a RAM. The functions of the decompressing device and the compressing device can be achieved also by operating programs stored in the ROM and RAM.

Embodiment 2

The following will discuss Embodiment 2 of the present invention. Embodiment 2 employs a function obtained by shifting the function of FIG. 4 by one clock and performing addition (averaging) thereon.

FIG. 11 is a diagram for explaining thinning-out and interpolating principles of Embodiment 2. FIG. 11(*a*) shows the thinning-out principle and FIG. 11(*b*) shows the interpolating principle. First, referring to FIG. 11(*a*), the thinning-out principle of the present embodiment will be discussed.

In the data structure of FIG. 11(*a*), the lateral axes of A, B, C, . . . denote sampling data on sample points that is inputted in sequence on each clock and the data values are coefficients of a digital basic function. Further, the longitudinal axes of a, b, c, . . . denote center positions of sampling data processed by the digital basic function.

As shown in FIG. 11(*a*), the digital basic function for sampling data A is provided by shifting each of the function values (−1, 0, 9, 16, 9, 0, −1) by one clock while the first clock position is placed at the front. Moreover, the digital basic function for the subsequent sampling data B is provided by shifting each of the function values by one clock while a clock position after one clock from the first clock position is placed at the front. Similarly, the digital basic functions for sampling data C, D, E, F, . . . inputted in sequence are provided by shifting each of the function values by one clock while a clock position further delayed by one clock is placed at the front.

In Embodiment 2, an operation for thinning out the sampling data A, B, C, . . . on the sample points to a half is performed based on such a data structure. Unlike Embodiment 1, the center position of the digital basic function is overlaid on one data position in Embodiment 2. Thus, successive sampling data is used alternately. As to the used sample point, a data value is replaced with a convoluted value on a line of the center position of a digital basic function corresponding to the sample point.

Namely, due to a lack of data required for operations, the first sampling data A, B, and C remain in the same state without being thinned out. As to the subsequent sampling data D, on a line of a center position d of the corresponding digital basic function, data values are added and adjustment is made according to amplitude as expressed by the following equation (16). The results are used as thinned-out data.

$$D \to (16D + 9(C+E) - (A+G))/32 \quad (16)$$

Further, the subsequent sampling data E is discarded and the subsequent sampling data F is used, and the sampling data F is replaced with thinned-out data obtained by the following equation (17) on a line of a center position f of the corresponding digital basic function.

$$F \to (16F + 9(E+G) - (C+I))/32 \quad (17)$$

Similarly, convoluted values on every other clock positions h, j, l, . . . , are obtained as thinned-out data.

In this way, the same thinning-out operation is performed based on data thinned-out to a half, so that the original data can be thinned-out to one fourth. Moreover, the same thinning-out operation is performed based on data thinned-out to one fourth, so that the original data can be thinned-out to one eighth. Theoretically, the original data can be compressed to $½^n$ by repeating the same thinning-out operation n times.

Referring to FIG. 11(*b*), the principle of data interpolation will be discussed according to Embodiment 2. In the data structure of FIG. 11(*b*), the lateral axes of A, B, C, . . . denote thinned-out data inputted in sequence on each clock and the data values are coefficients of a digital basic function. Further, the longitudinal axes of a, b, c, . . . denote center positions of thinned-out data processed by the digital basic function.

As shown in FIG. 11(*b*), the digital basic function for thinned-out data A is provided by shifting each of the function values (−1, 0, 9, 16, 9, 0, −1) by one clock while a clock position before two clocks from the first clock position is placed at the front. Further, the digital basic function for the subsequent thinned-out data B is provided by shifting each of the function values by one clock while the first clock position is placed at the front. Similarly, the digital basic functions for thinned-out data C, D, E, F, . . . inputted in sequence are provided by shifting each of the function values by one clock while a clock position further delayed by two clocks is placed at the front.

According to such a data structure, unlike Embodiment 1, the center position c of the digital basic function processed according to the value of the thinned-out data C is overlaid on one data position. Hence, in Embodiment 2, the data on the clock position c and data on clock positions before and after the clock position c are used to perform a convoluting operation, so that two interpolation data C1 and C2 are obtained from one thinned-out data C.

When data on three lines having the clock position c at the center are denoted by c−, c, and c+ respectively, the data are expressed by the following equations.

$$c- = -A + 9B + 9C - D \quad (18)$$

$$c = 16C \quad (19)$$

$$c+ = -B + 9C + 9D - E \quad (20)$$

Based on the above equations (18) and (19), the following equation will be established.

$$(c- + c) = (-A + 9B + 25C - D) \quad (21)$$

Further, based on the above equations (19) and (20), the following equation will be established.

$$(c + c+) = (-B + 25C + 9D - E) \quad (22)$$

When adjusted amplitude is considered based on the equations (21) and (22), one thinned-out data C can be replaced with the two interpolation data C1 and C2. C1 and C2 will be expressed by the following equations.

$$C1 = (-A + 9B + 25C - D)/32 \quad (23)$$

$$C2 = (-B + 25C + 9D - E)/32 \quad (24)$$

Moreover, the relationship expressed by equations (23) and (24) regarding the thinned-out data C is similarly established for the other thinned-out data D, E, F, . . . Therefore, as shown in the following equation, one thinned-out data D is replaced with two interpolation data D1 and D2, one thinned-out data E is replaced with two interpolation data E1 and E2, and one thinned-out data F is replaced with two interpolation data F1 and F2.

$$D \rightarrow D1 = (-B + 9C + 25D - E)/32,\ D2 = (-C + 25D + 9E - F)/32$$

$$E \rightarrow E1 = (-C + 9D + 25E - F)/32,\ E2 = (-D + 25E + 9F - G)/32$$

$$F \rightarrow F1 = (-D + 9E + 25F - G)/32,\ F2 = (-E + 25F + 9G - H)/32$$

. . . . . .

As described above, when an interpolating value is obtained for thinned-out data(e.g., data C) on a certain sample point, a value obtained by multiplying thinned-out data on the target sample point by 25, a value obtained by multiplying thinned-out data on a previous sample point by 9, a value obtained by multiplying thinned-out data two points before the sample point by −1, and a value obtained by multiplying thinned-out data on the subsequent sample point by −1 are added and the added value is divided by 32 to obtain a first interpolation value (e.g., C1).

Further, a value obtained by multiplying thinned-out data on the target sample point by 25, a value obtained by multiplying thinned-out data on the previous sample point by −1, a value obtained by multiplying thinned-out data on the subsequent sample point by 9, and a value obtained by multiplying thinned-out data two points after the sample point by −1 are added and the added value is divided by 32 to obtain a second interpolation value (e.g., C2).

These operations are performed on each of the sample points, so that the original data is oversampled twice.

The same interpolating operation is performed based on interpolation data oversampled by twice, so that the original data can be oversampled by four times. Furthermore, the same interpolating operation is performed based on interpolation data oversampled by four times, so that the original data can be oversampled to eight times. Theoretically, the same interpolating operation is repeated n times, so that the original data can be oversampled to $\frac{1}{2}^n$ times.

Figure 12:
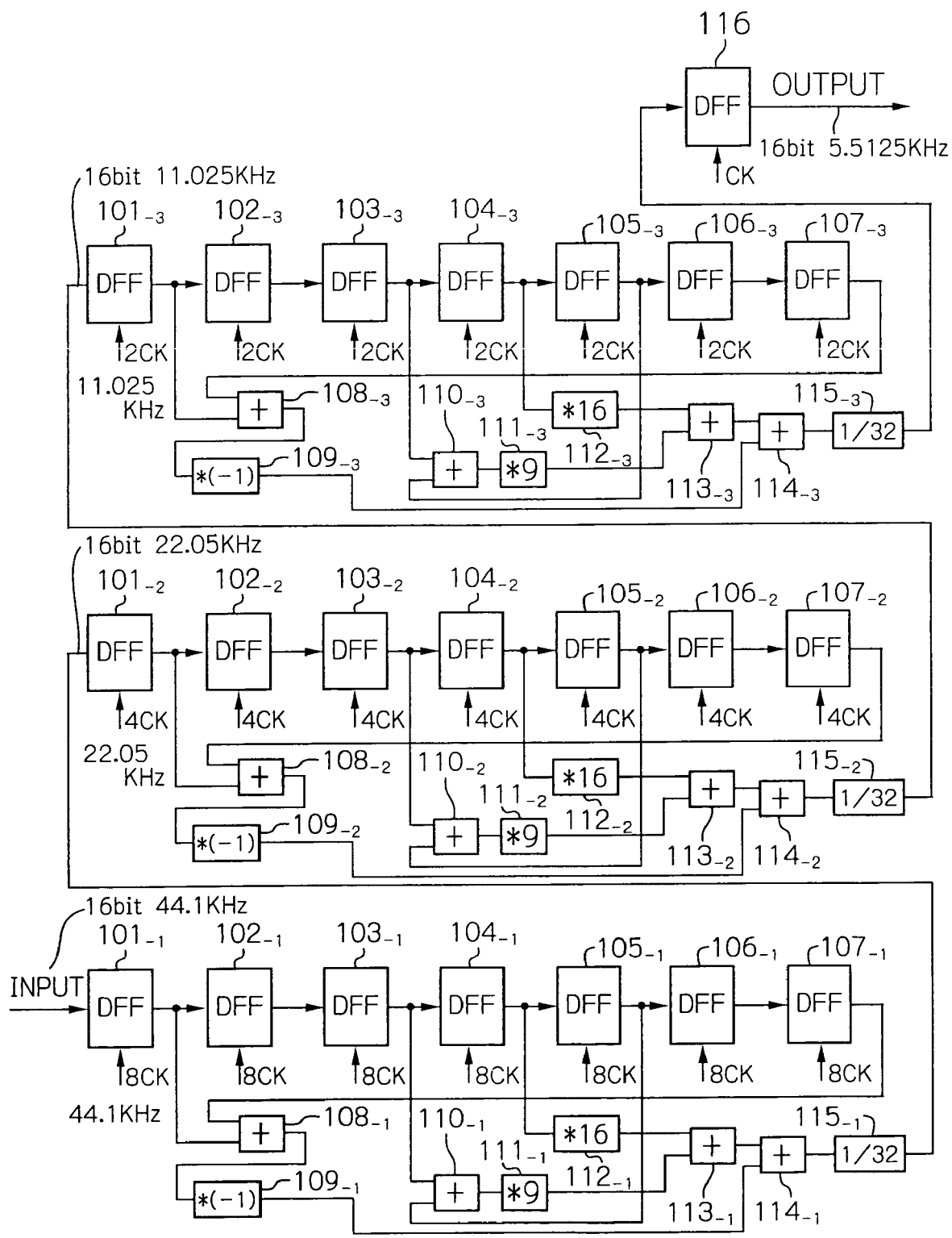
FIG. 12 is a diagram showing an example of a configuration of a compressing device (thinning device) according to Embodiment 2.

FIG. 12 is a diagram showing an example of a configuration of a compressing device (thinning device) for realizing the above-described thinning-out operation according to Embodiment 2.

In the compressing device of FIG. 12, circuits for performing a thinning-out operation of ½ time are cascaded in three stages and the circuit configurations of the first to third stages are discriminated by numerical subscripts (−1 to −3). Further, when the numerical subscripts are different and the main symbols are the same, the circuit configurations have the same function.

The thinning-out circuit in the first stage operates on a clock 8 CK of a reference frequency (e.g., 44.1 KHz). D-type flip-flops $101_{-1}$, $102_{-1}$, $103_{-1}$, $104_{-1}$, $105_{-1}$, $106_{-1}$, and $107_{-1}$ of seven stages delay sampling data (e.g., 16 bits), which are inputted in sequence in a discrete manner, by one clock 8 CK of the reference frequency one by one. These D-type flip-flops $101_{-1}$ to $107_{-1}$ correspond to delay circuits of seven stages.

An adder $108_{-1}$ adds data retrieved from the output taps of the D-type flip-flops $101_{-1}$ and $107_{-1}$ in the first and seventh stages. A multiplier $109_{-1}$ multiplies the output data from the adder $108_{-1}$ by −1. The adder $108_{-1}$ and the multiplier $109_{-1}$ correspond to a first multiplying/adding circuit.

An adder $110_{-1}$ adds data retrieved from the output taps of the D-type flip-flops $103_{-1}$ and $105_{-1}$ in the third and fifth stages. A multiplier $111_{-1}$ multiplies the output data from the adder $110_{-1}$ by 9. The adder $110_{-1}$ and the multiplier $111_{-1}$ correspond to a second multiplying/adding circuit.

A multiplier $112_{-1}$ multiplies data retrieved from the output tap of the D-type flip-flop 104 in the fourth stage by 16.

Adders $113_{-1}$ and $114_{-1}$ add output data from the above three multipliers $109_{-1}$, $111_{-1}$, and $112_{-1}$. A multiplier $115_{-1}$ multiplies the output data from the adder $114_{-1}$ by 1/32. The adders $113_{-1}$, $114_{-1}$, and the multiplier $115_{-1}$ correspond to a third multiplying/adding circuit.

To the above-described circuits, sampling data A, B, C, . . . , of FIG. 11(a) are inputted one by one, so that ½ thinned-out data of equations (16) and (17) are outputted from the multiplier $115_{-1}$. The output data from the multiplier $115_{-1}$ is inputted to the D-type flip-flop $101_{-2}$ of the thinning-out circuit in the second stage and ½ thinning processing is performed in the second stage. The thinning-out circuit of the second stage operates in the same manner as that of the first stage except that the circuit operates on a clock 4 CK whose frequency is half the reference frequency.

Besides, according to the circuits of FIG. 12, after thinned-out data expressed by equation (16) concerning the sampling data D is outputted from the multiplier $115_{-1}$, thinned-out data of the sampling data E is outputted. Thereafter, thinned-out data expressed by equation (17) of the sampling data F is outputted. However, the thinned-out data of the sampling data E is ignored because the thinning-out circuit of the second stage operates on the clock 4 CK whose frequency is half the reference frequency, and thinned-out data of the subsequent sampling data F is processed in the thinning-out circuit of the second stage.

The output data from the multiplier $115_{-2}$ provided in the final stage of the thinning-out circuit in the second stage is inputted to the D-type flip-flop $101_{-3}$ of the thinning-out circuit in the third stage, and ½ thinning processing is performed in the third stage. The thinning-out circuit of the third stage operates in the same manner as that of the first stage except for the circuit operates on a clock 2 CK whose frequency is one fourth of the reference frequency. Data outputted from the thinning-out circuit of the third stage is held by the D-type flip-flop 116 according to a clock CK whose frequency is one eighth of the reference frequency, and then, the data is outputted as final thinning-out data (compression data).

FIG. 13 is a diagram showing an example of a configuration of a decompressing device (interpolating device) according to Embodiment 2. In the decompressing device of FIG. 13, circuits for performing double oversampling are cascaded in three stages and the circuit configurations of the first to third stages are discriminated by numerical subscripts (−1 to −3). Further, when the numerical subscripts are different but the main symbols are the same, the circuit configurations have the same function.

An oversampling circuit of the first stage operates on a clock CK whose frequency (5.5125 KHz) is one eighth of the reference frequency. D-type flip-flops $121_{-1}$, $122_{-1}$, $123_{-1}$, $124_{-1}$, and $125_{-1}$ of five stages delay thinned-out data (e.g., 16 bits), which is inputted in sequence, by one clock CK one by one. These D-type flip-flops $121_{-1}$ to $125_{-1}$ correspond to delay circuits of five stages.

Data retrieved from the output tap of the D-type flip-flop $121_{-1}$ in the first stage is inputted to the multiplier $126_{-1}$ of −1 time. Data retrieved from the output tap of the D-type flip-flop $122_{-1}$ in the second stage is inputted to the multiplier $127_{-1}$ of +9 times and a multiplier $133_{-1}$ of −1 time.

Data retrieved from the D-type flip-flop $123_{-1}$ in the third stage is inputted to a multiplier $128_{-1}$ of 25 times. Data retrieved from the output tap of the D-type flip-flop $124_{-1}$ in the forth stage is inputted to a multiplier $129_{-1}$ of −1 time and a multiplier $134_{-1}$ of +9 times. Data retrieved from the output tap of the D-type flip-flop $125_{-1}$ in the fifth stage is inputted to a multiplier $135_{-1}$ of −1 time.

The output data from the multiplier $126_{-1}$ of −1 time, the multiplier $127_{-1}$ of 9 times, the multiplier $128_{-1}$ of 25 times, and the multiplier $129_{-1}$ of −1 time are all added by three adders $130_{-1}$, $131_{-1}$, and $132_{-1}$. The output data from the multiplier $133_{-1}$ of −1 time, the multiplier $128_{-1}$ of 25 times, the multiplier $134_{-1}$ of 9 times, and the multiplier $135_{-1}$ of −1 time are all added by three adders $136_{-1}$, $137_{-1}$, and $138_{-1}$.

Data outputted from the adder $132_{-1}$ is inputted to one of the input terminals of an AND gate $139_{-1}$. A clock CK is inputted to the other input terminal of the AND gate $139_{-1}$. Further, data outputted from the adder $138_{-1}$ is inputted to one of the input terminals of the AND gate $140_{-1}$. An inversion clock CK passing through an inverter $141_{-1}$ is inputted to the other input terminal of the AND gate $140_{-1}$.

The output data from the two AND gates $139_{-1}$ and $140_{-1}$ are supplied to a multiplier $143_{-1}$ of 1/32 time via an OR gate $142_{-1}$. Thus, the arithmetic result of equation (23) is outputted from the 1/32-time multiplier $143_{-1}$ when the clock CK is "H", and the arithmetic result of equation (24) is outputted from the 1/32-time multiplier $143_{-1}$ when the clock CK is "L".

The thinned-out data A, B, C, . . . , of FIG. 11(b) are inputted one by one to the above-described circuit, so that interpolation data A, B, C1, C2, D1, D2 . . . , oversampled twice are outputted from the 1/32 adder $143_{-1}$.

The output data from the 1/32-time multiplier $143_{-1}$ is inputted to the D-type flip-flop $121_{-2}$ of the oversampling circuit in the second stage, and double oversampling is performed in the second stage. The oversampling circuit of the second stage operates in the same manner as that of the first stage except that the circuit on a clock 2 CK whose frequency is one fourth of the reference frequency.

The output data from the 1/32-time multiplier $143_{-2}$, which is provided in the final stage of the oversampling circuit in the second stage, is inputted to the D-type flip-flop $121_{-3}$ of the oversampling circuit in the third stage, and double oversampling is performed in the third stage. The oversampling circuit of the third stage operates in the same manner as that of the first stage except that the circuit operates on a clock 4 CK whose frequency is half the reference frequency.

The output data from a 1/32-time multiplier $143_{-3}$, which is provided in the final stage of the oversampling circuit in the third stage, is held by a D-type flip-flop 144 according to a clock 8 CK of the reference frequency, and then, the data is outputted as final interpolation data (decompression data).

In the case where the decompressing device is configured as FIG. 13, a sampling function obtained by inputting data of a unit pulse is substantially equal to that of <4> in FIG. 5. Therefore, when the interpolating operation of Embodiment 2 is used, a value between thinned-out data can be smoothly interpolated using a function differentiable once or more times. Hence, it is possible to eliminate the necessity for a low-pass filter and to prevent degradation of the phase characteristic.

Further, when an interpolation value of one thinned-out data is obtained, it is necessary to consider only a limited number (four in equations (23) and (24)) of thinned-out data values, thereby significantly reducing the processing amount. Additionally, the following is not true: thinned-out data out of the finite range originally needs to be considered but is ignored in view of the processing amount and accuracy. The truth is that such thinned-out data does not need to be considered theoretically. Hence, it is also possible to prevent the occurrence of a truncation error.

As described above in detail, like Embodiment 1, Embodiment 2 can achieve shorter operation time as well as both of a higher compression ratio and higher quality of reproduced data, and to simplify the arithmetic circuit.

Further, as shown in FIG. 11, a function obtained by shifting the function of FIG. 4 by one clock and performing addition (averaging) is used to obtain interpolation data in Embodiment 2. Thus, an averaging operation has been already performed in the function. Therefore, it is not necessary to perform any averaging operation after the interpolating operation of equations (23) and (24), thereby omitting an averaging circuit.

Moreover, in Embodiment 2 as well, data values changed to −1, 1, 8, 8, 1, −1 on each clock were used as a digital basic function. Although the numeric value is the best, other numeric values (e.g., a numeric value having a weight of 1 or 0 instead of −1 on a part corresponding to both sides, a numeric value having a weight other than 8 on a part corresponding to the center, etc.) is also applicable as a digital basic function.

In Embodiment 2 as well, the compressing device and the decompressing device are constituted by combining logic circuits like hardware. The devices may be constituted by a CPU or a computer system comprising an MPU, a ROM, and RAM. The functions of the decompressing device and the compressing device can be achieved also by operating programs stored in the ROM and RAM.

Embodiment 3

The following will discuss Embodiment 3 of the present invention.

Figure 14:
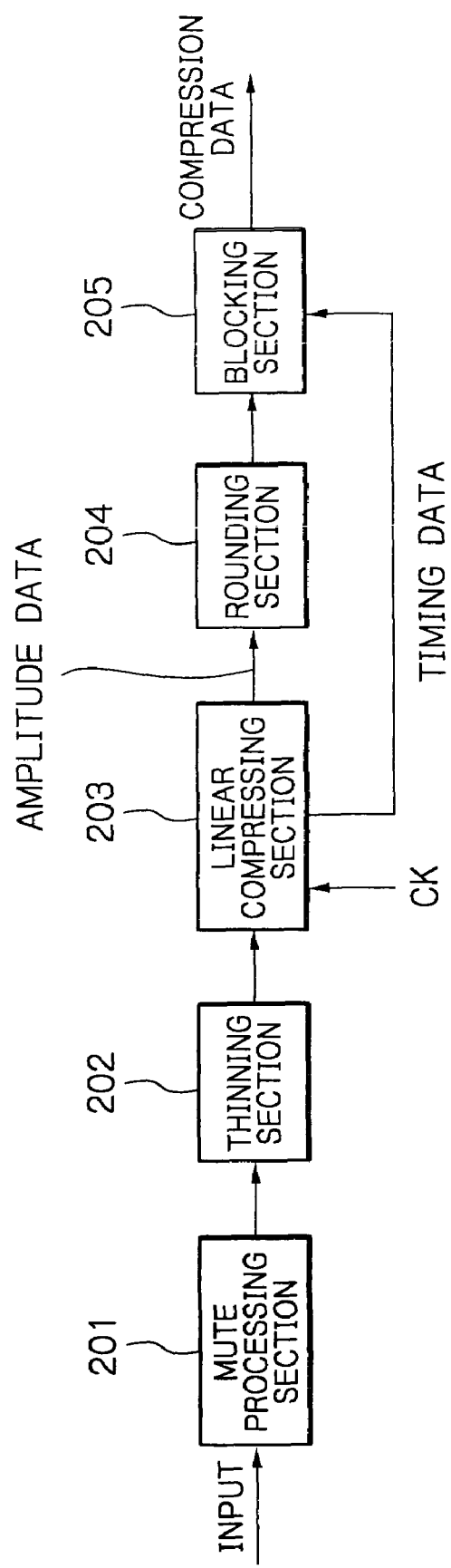
FIG. 14 is a diagram showing an example of a configuration of the compressing device according to Embodiment 3.

FIG. 14 is a diagram showing an example of a configuration of a compressing device according to Embodiment 3. As shown in FIG. 14, the compressing device of the present embodiment is constituted by a mute processing section 201, a thinning section 202, a linear compressing section 203, a rounding section 204, and a blocking section 205.

The mute processing section 201 corresponds to replacing means of the present invention and rounds an absolute value of each sampling data, which is inputted as a target of compression, by a first predetermined value (e.g., "4"). Further, when an absolute value of inputted sampling data is smaller than the first predetermined value or when an absolute value of inputted sampling data is smaller than a second predetermined value (e.g., "16") and an average value in a short section of differential data (the short section has a default value such as 8 clocks) is smaller than a third predetermined value (e.g., "8") the sampling data is regarded as being mute and is outputted after the data value is replaced with "0".

With this operation, a DC offset is corrected to remove small noise components included in inputted data and a compression ratio is improved.

The thinning section 202 corresponds to thinning-out means of the present invention and performs any one of the thinning-out operations discussed in Embodiment 1 and Embodiment 2 on sampling data outputted from the mute processing section 201. One of the thinning-out operations may be selectively switched and used. A compression ratio of at least 8 can be achieved by passing data to be compressed through the thinning-out section 202.

The linear compressing section 203 includes sampling point detecting means and compression data producing means of the present invention and performs the following linear compression on thinned-out data outputted from the thinning-out section 202. Namely, from sample points of thinned-out data outputted from the thinning-out section 202, sample points are detected in sequence as sampling points. The sample point has an error between a data value on a straight line connecting two thinned-out data and a thinned-out data value on the same sample point as the data value on the straight line, the error being equal to or smaller than a desired value. Then, a discrete amplitude data value is obtained on each of the detected sample points and a timing data value indicative of a time interval between the sample points is obtained.

The following will discuss the detail of the operation for detecting the sampling points. Namely, from thinned-out data, reference thinned-out data and another thinned-out data having a time interval within a predetermined range are selected. Then, from sample points each having an error equal to or smaller than a desired value between a data value on a straight line connecting the two thinned-out data and a thinned-out data value on the same sample point as the data value on the straight line, a sample point having the longest time interval within the predetermined range is detected as a sampling point.

Figure 15A:
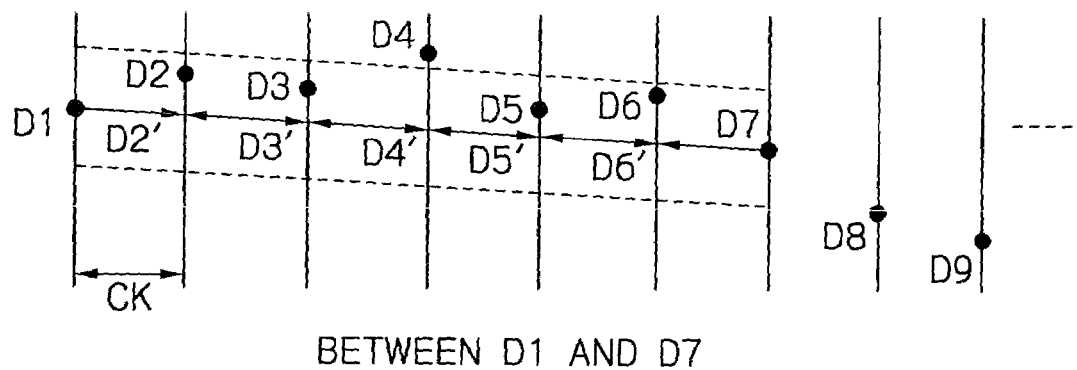
FIG. 15 is a diagram for explaining the basic principle of linear compression according to Embodiment 3.
Figure 15B:
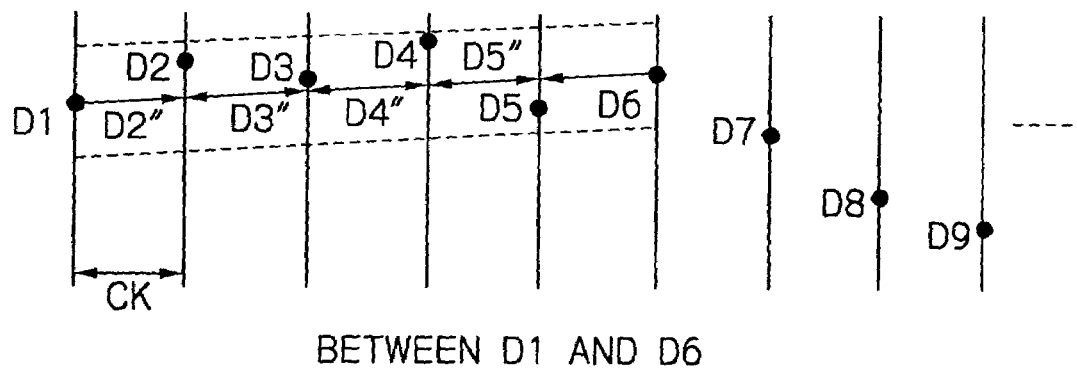

FIG. 15 is a diagram for explaining the basic principle of linear compression. In FIG. 15, a lateral axis denotes time and a longitudinal axis denotes amplitude of thinned-out data. Reference numerals D1 to D9 in FIGS. 15(a) and 15(b) each denote a part of thinned-out data inputted to the linear compressing section 203 from the thinning-out section 202 in a sampling period of one clock CK.

In the example of FIG. 15, thinned-out data D1 serves as reference thinned-out data which is used firstly. Further, a time interval is 6 clocks at the maximum between two thinned-out data selected when a sampling point is detected. Besides, when 3 bits or 4 bits are used as a timing data value, a time interval between thinned-out data may be 7 clocks or 15 clocks at the maximum.

First, as shown in FIG. 15(a), the reference thinned-out data D1 and thinned-out data D7 having the largest time interval within the predetermined range are selected. Then, it is judged whether errors are all equal to or smaller than the desired value between data values D2', D3', D4', D5', and D6' on sample points on a straight line connecting the two thinned-out data and thinned-out data values D2, D3, D4, D5, and D6 on the same sample points as the data values D2' to D6' on the straight line.

Namely, it is judged whether errors between the data values D2', D3', D4', D5', and D6' on the straight line connecting the two thinned-out data D1 and D7 and the thinned-out data values D2, D3, D4, D5, and D6 are all within the range of desired values indicated by dotted lines. When this condition is satisfied, the sample point of the thinned-out data D7 is detected as a sampling point. However, in this example, since an error between the data value D4' on the straight line and the corresponding thinned-out data value D4 exceeds the desired value, the operation proceeds without using any sample point of the thinned-out data D7 as a sampling point at this point.

Next, as shown in FIG. 15(b), the thinned-out data D6 is selected. The thinned-out data D6 has a time interval from the reference thinned-out data D1 that is shorter than that of the data D7 by one clock CK. Then, it is judged whether errors are all equal to or smaller than the desired value between data values D2", D3", D4", and D5" on sample points on a straight line connecting two thinned-out data D1 and D6 and thinned-out data values D2, D3, D4, and D5 on the same sample points as the data values D2" to D5" on the straight line.

When all the errors are equal to or smaller than the desired value, the sample point of the thinned-out data D6 is detected as a sampling point. In this example, since errors between the data values D2", D3", D4", and D5" and the thinned-out data values D2, D3, D4, and D5 are all equal to or smaller than the desired value, the sample point of the thinned-out data D6 is detected as a sampling point.

Additionally, when any of the straight lines connecting between D1 and D7, between D1 and D6, ..., between D1 and D3 does not satisfy such a condition that all the errors are equal to or smaller than the desired value, the sample point of the thinned-out data D2 is detected as a sampling point. Namely, since another thinned-out data does not exist between the thinned-out data D1 and D2, this section does not require any above error operation. Hence, when any of straight lines connecting the other sections does not satisfy the error condition, the position of the thinned-out data D2, which is adjacent to the thinned-out data D1 currently serving as the reference data, is detected as a sampling point.

After one sampling point is detected, the data on the sampling point is newly used as reference thinned-out data and the same operation is performed therefrom within a range of 6 clocks. Thus, all the errors are equal to or smaller than the desired value from the thinned-out data D6 within the range of 6 clocks, and a sample point having the longest time interval from the thinned-out data D6 is detected as the subsequent sampling point.

A plurality of sampling points are similarly detected in sequence. Then, the following data values are obtained in pairs: discrete amplitude data values on the detected sampling points and timing data values indicating the time intervals between the sampling points by the number of clocks. In the above example, pairs (D1, 5), (D6, *), ... of amplitude data values (D1, D6, ...) and timing data values (5, *, ...) are obtained.

The above explanation discussed an example where sample points (sample points of the thinned-out data D1 and D7) having the maximum time interval between two thinned-out data within the predetermined range are firstly selected to start error decision and the operation is performed so as to shorten the time intervals in sequence. The method of detecting sampling points is not limited to the above.

For example, sample points (sample points of the thinned-out data D1 and D3) having the minimum time interval between two thinned-out data within the predetermined range may be firstly selected to start error decision and the operation may be performed so as to increase the time intervals in sequence. Further, sample points (e.g., sample points of the thinned-out data D1 and D4) having a time interval between two thinned-out data around the center within the predetermined range may be selected to start error decision. Furthermore, error decision may be performed on all the patterns of available time intervals within the predetermined range, and then, a pattern having the longest time interval may be selected from the patterns satisfying the error condition.

In some cases, two or more sample points satisfying the error condition exist within the predetermined range from the reference thinned-out data. In this case, a sample point having the longest time interval from the reference thinned-out data is detected as a sampling point from the two or more sample points satisfying the error condition. Hence, a value of each timing data can be within the predetermined range of bits and to minimize the number of detected sampling points, thereby increasing a compression ratio accordingly.

Figure 16A:
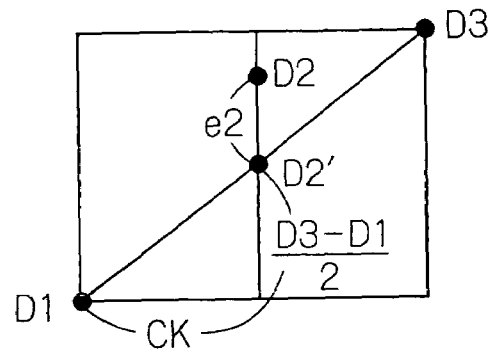
FIG. 16 is a diagram for explaining error operation used in linear compression according to Embodiment 3.
Figure 16B:
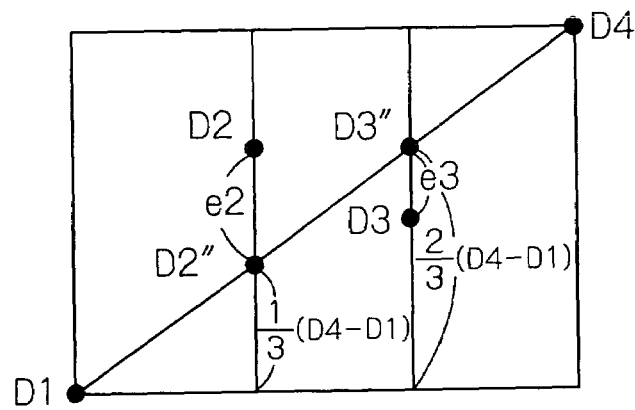

Referring to FIG. 16, the following will discuss the method of calculating an error between a data value on a straight line connecting two thinned-out data and a thinned-out data value on the same sample point as the data value. FIG. 16(*a*) is a diagram showing an error e2 when a straight line connects the reference thinned-out data D1 and the thinned-out data D3 which is two clocks away from the data D1.

In FIG. 16(*a*), the error e2 between the thinned-out data D2 between the data D1 and D3 and data D2 ' on the straight line connecting the data D1 and D3 is expressed by the following equation (25).

$$e2=(D2-D1)-(D3-D1)/2$$

$$2e2=2D2-2D1-D3+D1$$

$$=2D2-D1-D3$$

$$=(D2-D1)-(D3-D2)$$

$$=D2'-D3' \therefore e2=-(D3'-D2')/2==-D3''/2 \ldots \quad (25)$$

In equation (25), a sign ' denotes a first differential value and " denotes a second differential value. As shown in equation (25), when the straight line has a time interval of 2 clocks, the error e2 can be expressed by a double differential value of the thinned-out data D3. Hence, when an allowable error is δ, in the linear compressing section 203 of FIG. 14, it is judged whether the decision condition of |e2|≦δ is satisfied or not. In this equation, a sign | | denotes an absolute value.

FIG. 16(*b*) is a diagram showing two errors e2 and e3 when a straight line connects the reference thinned-out data D1 and the thinned-out data D4 which is three clocks away from the data D1. In FIG. 16(*b*), the errors e2 and e3 between the thinned-out data D2 and D3 and data D2" and D3" on the straight line connecting the data D1 and D4 are expressed by the following equations (26) and (27).

$$e2=(D2-D1)-(D4-D1)/3$$

$$3e2=3D2-3D1-D4+D1$$

$$=3D2-2D1-D4$$

$$=2(D2-D1)-(D4-D2)$$

$$=2(D2-D1)-(D4-D3)-(D3-D2)$$

$$=2D2'-D4'-D3'$$

$$=-(D4'-D3')-2(D3'-D2')$$

$$=-D4''-2D3''$$

$$\therefore e2=-1/3(D4''+2D3'') \ldots \quad (26)$$

$$e3=(D3-D1)-2(D4-D1)/3$$

$$3e3=3D3-3D1-2D4+2D1$$

$$=3D3-D1-2D4$$

$$=-2(D4-D3)+D3-D1$$

$$=-2(D4-D3)+(D3-D2)+(D2-D1)$$

$$=-2D4'+D3'+D2'$$

$$=-2(D4'-D3')-(D3'-D2')$$

$$=-2D4''-D3''$$

$$\therefore e3=-1/3(2D4''+D3'') \ldots \quad (27)$$

As shown in equations (26) and (27), when the straight line has a time interval of 3 clocks, the errors e2 and e3 can be expressed by using double differential values of the sampling data D3 and D4. In this case, the linear compressing section 203 judges whether the decision conditions of |e2|≦δ and |e3|≦δ are satisfied or not. Additionally, the following operation is also applicable: it is firstly judged which is larger between the errors e2 and e3, and only the larger one is used to judge whether the judging conditions are satisfied or not.

Similarly, when the straight line has a time interval of 4 clocks, errors e2, e3, and e4 can be expressed by the following equations (28) to (30) using double differential values of the thinned-out data D3, D4, and D5.

$$e2=-\tfrac{1}{4}(D5''+2D4''+3D3'') \quad (28)$$

$$e3=-\tfrac{1}{4}(2D5''+D4''+2D3'') \quad (29)$$

$$e4=-\tfrac{1}{4}(3D5''+2D4''+D3'') \quad (30)$$

In this case, in the linear compressing section 203 of FIG. 14, it is judged whether the decision conditions of |e2|≦δ, |e3|≦δ, and |e4|≦δ are satisfied or not. The following operation is also applicable: it is firstly judged which is the largest among the errors e2, e3, and e4, and only the largest one is used to judge whether the decision conditions are satisfied or not.

Similarly, when the straight line has a time interval of 5 clocks, errors e2, e3, e4, and e5 can be expressed by the following equations (31) to (34) using double differential values of sampling data D3, D4, D5, and D6.

$$-e2=\tfrac{1}{5}(D6''+2D5''+3D4''+4D3'') \quad (31)$$

$$-e3=\tfrac{1}{5}(2D6''+4D5''+6D4''+3D3'') \quad (32)$$

$$-e4=\tfrac{1}{5}(3D6''+6D5''+4D4''+2D3'') \quad (33)$$

$$-e5=\tfrac{1}{5}(4D6''+3D5''+2D4''+D3'') \quad (34)$$

In this case, in the linear compressing section 203 of FIG. 14, it is judged whether the decision conditions of |e2|≦δ, |e3|≦δ, |e4|≦δ, and |e5|≦δ are satisfied or not. The following operation is also applicable: it is firstly judged which is the largest among the errors e2, e3, e4, and e5 and only the largest one is used to judge whether the decision conditions are satisfied or not.

Similarly, when the straight line has a time interval of 6 clocks, errors e2, e3, e4, e5, and e6 can be expressed by the following equations (35) to (39) using double differential values of sampling data D3, D4, D5, D6, and D7.

$$e2=-\tfrac{1}{6}(D7''+2D6''+3D5''+4D4''+5D3'') \quad (35)$$

$$e3=-\tfrac{1}{6}(2D7''+4D6''+6D5''+8D4''+4D3'') \quad (36)$$

$$e4=-\tfrac{1}{6}(3D7''+6D6''+9D5''+6D4''+3D3'') \quad (37)$$

$$e5=-\frac{1}{6}(4D7''+8d6''+6D5''+4D4''+2D3'') \quad (38)$$

$$e6=-\frac{1}{6}(5D7''+4D6''+3D5''+2D4''+D3'') \quad (39)$$

In this case, in the linear compressing section 203 of FIG. 14, it is judged whether the decision conditions of $|e2|\leq\delta$, $|e3|\leq\delta$, $|e4|\leq\delta$, $|e5|\leq\delta$, and $|e6|\leq\delta$ are satisfied or not. The following operation is also applicable: it is firstly judged which is the largest among the errors e2, e3, e4, e5, and e6 and only the largest one is used to judge whether the decision conditions are satisfied or not.

As shown in equations (25) to (39), the error data used for the linear compression of the present embodiment can be all obtained using only the double differential values of the thinned-out data. Then, the linear compressing section 203 obtains error data from the double differential values of the thinned-out data and detects sample points satisfying the error conditions as sampling points. Subsequently, the linear compressing section 203 outputs amplitude data of the detected sampling points and timing data indicative of time intervals between the sampling points.

Further, the rounding section 204 corresponds to rounding means of the present invention and rounds lower-order bits of amplitude data outputted from the linear compressing section 203. The rounding operation can be performed by, for example, dividing output data from the linear compressing section 203 by a predetermined value (e.g., 256 or 512). Such a rounding operation can reduce a data length by several bits per word, thereby significantly reducing the data amount.

Amplitude data inputted to the rounding section 204 is, for example, signed data of 16 bits which can express a large data value up to 32767. However, in the case of voice data of audible tone, actually used data has a relatively large value in many cases and thus data hardly appears in a relatively small data area of the entire data area (0 to 32767) expressed by 16 bits. Therefore, even when lower-order bits are cut from data having such a large value, the quality of reproduced voice is hardly affected.

Figure 17:
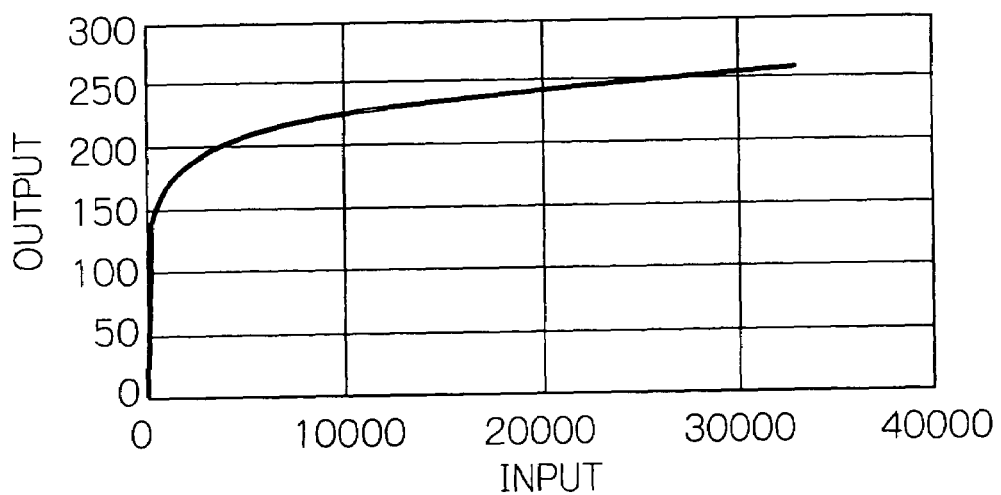
FIG. 17 is a diagram showing an example of a non-linear rounding operation according to Embodiment 3.

Moreover, as a rounding operation, instead of simply performing division as described above by using a predetermined value, a data value may be rounded so that the input data and output data from the rounding section 204 have a non-linear relationship. FIG. 17 is a diagram showing an example of the rounding operation of this case. In the example of FIG. 17, a logarithm of a data value inputted from the linear compressing section 203 is calculated and the value is used as the output data from the rounding section 204.

Figure 18:
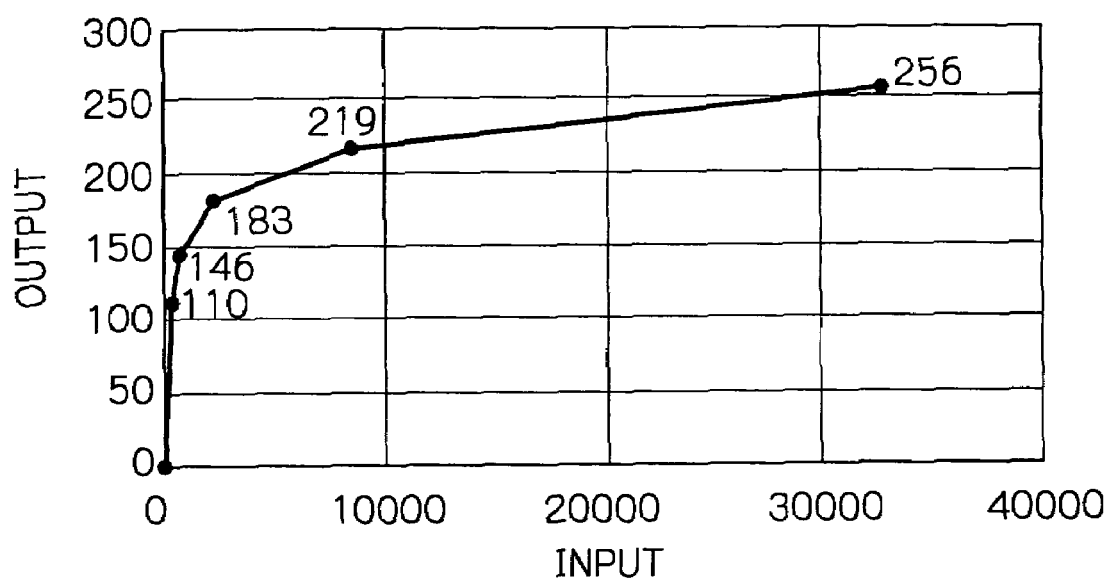
FIG. 18 is a diagram for explaining another example of the non-linear rounding operation according to Embodiment 3.

Further, the following operation is also applicable: as shown in FIG. 18, the logarithmic curve of FIG. 17 is approximated by combining several lines. The approximate function may be used to change the amplitude of outputted data according to amplitude of data inputted from the linear compressing section 203, so that an input data value and an output data value have a non-linear relationship. Additionally, in the example of FIG. 18, the logarithmic curve of FIG. 17 is approximated by combining five lines. The accuracy can be further improved by combining more than five lines.

The rounding operation is performed according to such a non-linear function, so that output data values can be concentrated on a central data area where most data appears in the entire data area of voice data of audible tone expressed by 16 bits. Thus, it is possible to reduce the influence of the rounding operation and lower quantization noise in an area having small amplitude, thereby further reducing the influence of the rounding operation on the quality of reproduced voice.

Additionally, when the logarithmic function is used to perform the rounding operation as shown in FIG. 17, reproduced voice somewhat changes in quality according to a bottom value of the logarithm. The bottom value of the logarithm may be set arbitrarily as a parameter. A compression ratio and the quality of reproduced voice are affected depending upon how to handle a value after the decimal point of a data value which is changed to a logarithm. Hence, it may be arbitrarily set as a parameter whether a data value after the decimal point should be dropped to place emphasis on a compression ratio and how many digits of the data value should be used after the decimal point to place emphasis on the quality of reproduced voice.

Besides, in the example of FIG. 14, amplitude data on a sampling point is extracted first and the rounding operation is performed on the extracted amplitude data. Conversely, the following operation is also applicable: the rounding operation is performed first on all data after the mute processing or all thinned-out data after the thinning-out operation, and amplitude data on sampling points are extracted from the rounded amplitude data.

Next, the blocking section 205 of FIG. 14 adds header information to amplitude data, in which lower-order bits are rounded by the rounding section 204, and timing data produced by the linear compressing section 203 and properly performs blocking thereon, and the blocking section 205 outputs the data as compression data. The outputted compression data is transmitted to a transmission path or recorded in a recording medium.

Figure 19:
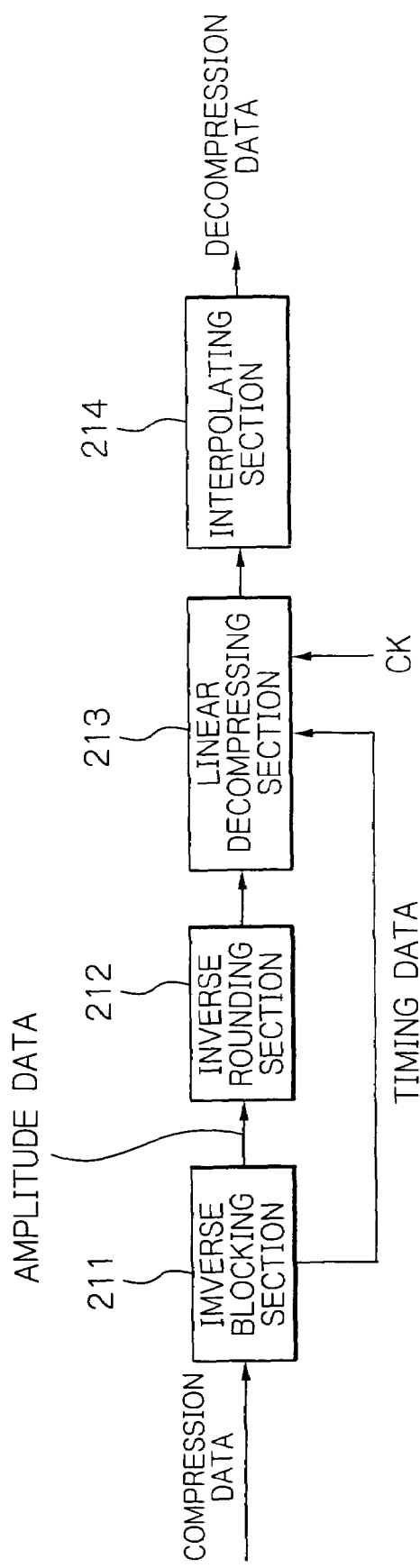
FIG. 19 is a diagram showing an example of a decompressing device according to Embodiment 3.

FIG. 19 is a diagram showing an example of a configuration of a decompressing device according to Embodiment 3 for the compressing device configured as FIG. 14. As shown in FIG. 19, the decompressing device of the present embodiment is constituted by an inverse blocking section 211, an inverse rounding section 212, a linear decompressing section 213, and an interpolating section 214.

The inverse blocking section 211 extracts amplitude data and timing data from compression data based on header information included in the blocked compression data. The inverse rounding section 212 corresponds to inverse rounding means of the present invention and perform an inverse rounding operation on amplitude data extracted from the inverse blocking section 211. The inverse rounding operation is contrary to the rounding section 204 on the compression part.

Namely, when a data value is simply divided by a predetermined value such as 256 and 512 in the rounding section 204 of FIG. 14, the inverse rounding section 212 multiplies amplitude data by 256 or 512. Further, when the rounding section 204 performs a non-linear rounding operation using the logarithm or the approximate function of FIGS. 17 and 18, a non-linear inverse rounding operation is performed using the exponential function or the approximate function of FIGS. 20 and 21 that are reversed from the above functions.

Figure 20:
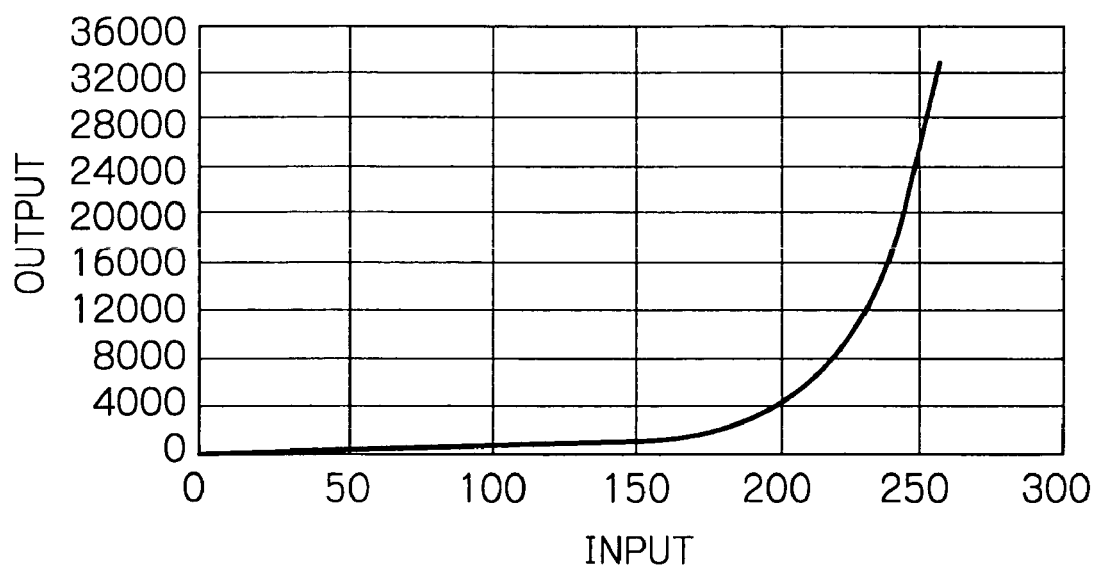
FIG. 20 is a diagram for explaining an example of a non-linear inverse rounding operation according to Embodiment 3.
Figure 21:
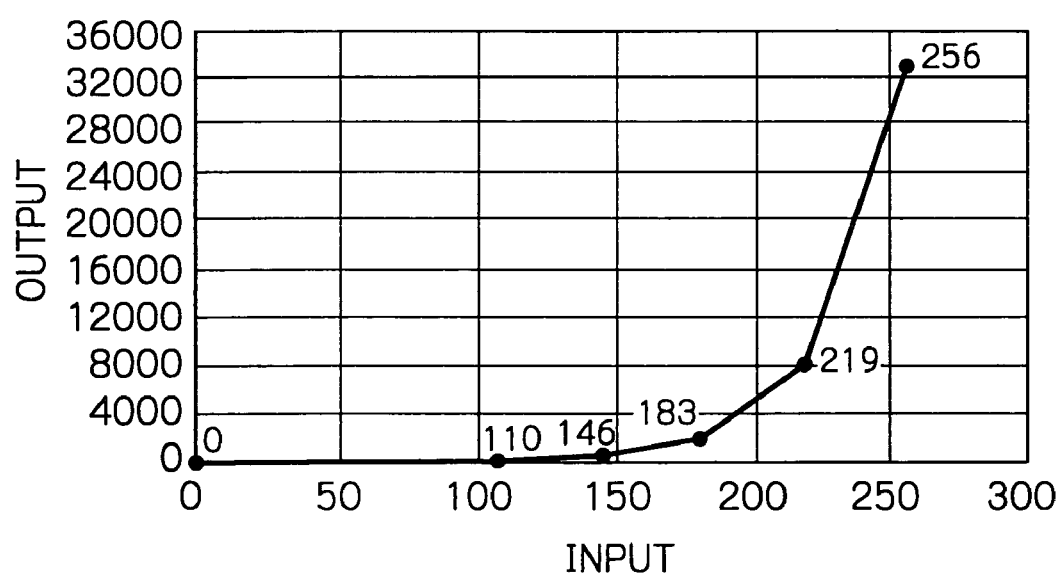
FIG. 21 is a diagram for explaining another example of the non-linear inverse rounding operation according to Embodiment 3.

Additionally, when the exponential function of FIG. 20 is used to perform an inverse rounding operation, a value of the exponent may be arbitrarily set as a parameter. Moreover, it may be set arbitrarily as a parameter whether a data value after the decimal point should be dropped and how many digits of the data value should be used after the decimal point. In this case, the fractional portion is dropped during compression and a data value after the decimal point is used during decompression, so that the quality of reproduced voice can be improved with a higher compression ratio.

The linear decompressing section 213 corresponds to first interpolating means of the present invention and sequentially performs interpolating operations for linearly interpolating amplitude data on successive sampling points by using amplitude data outputted from the inverse rounding section 212 and timing data outputted from the inverse blocking section 211, so that interpolation data for interpolating amplitude data values is produced.

Namely, the linear decompressing section 213 inputs timing data included in compression data from the inverse blocking section 211 and produces a reading clock from an input clock CK. The reading clock indicates irregular time intervals equal to sampling points detected on the compression part. Then, according to the generated reading clock, amplitude data after the inverse rounding operation are inputted in twos from the inverse rounding section 212, and an operation is performed for interpolating the two amplitude data by a straight line, so that interpolation data between the sampling points is produced.

In this way, the linear decompression just linearly interpolates amplitude data on the sampling points, on which the inverse rounding operation is performed, at time intervals indicated by timing data. During the compression of the present embodiment, when linear interpolation is performed between two thinned-out data, an error made by another thinned-out data between the two thinned-out data from the interpolated straight line is observed, and a point not having a large error even after the linear interpolation is detected as a sampling point. Therefore, by simply performing linear interpolation between amplitude data on the sampling points obtained thus, it is possible to reproduce data with a waveform substantially identical with that of the original thinned-out data.

The interpolating section 214 corresponds to second interpolating means of the present invention and performs one of the interpolating operations discussed in Embodiment 1 and Embodiment 2 on discrete first interpolation data outputted from the linear decompressing section 213, so that second interpolation data is produced. Any of the interpolating operations may be selectively switched and used. Digital interpolation data produced thus is converted to an analog signal by a D/A converting section (not shown) and the signal is outputted as a reproduced analog signal when necessary.

The compressing device and the decompressing device configured according to the present embodiment are constituted by a CPU or a computer system comprising an MPU, a ROM, and a RAM, and the functions of the devices can be achieved by operating programs stored in the ROM and the RAM.

Moreover, the compressing device and the decompressing device configured thus according to the present embodiment may be constituted by combining logic circuits like hardware.

Figure 22:
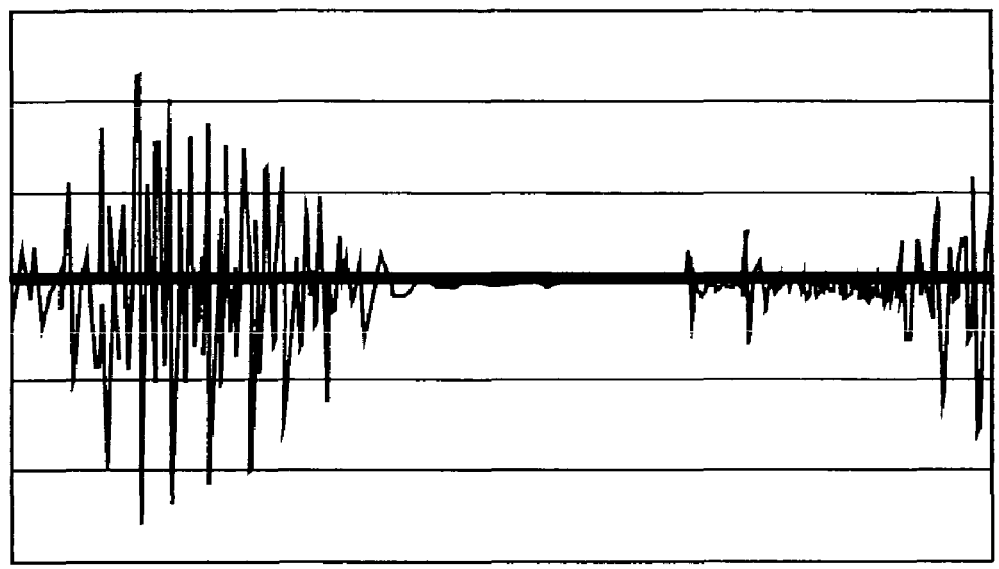
FIG. 22 is a waveform chart for comparing the original data before compression and reproduced data obtained by decompression when Embodiment 3 is adopted.

FIG. 22 is a waveform chart for comparing the original data before compression and reproduced data obtained by decompression when Embodiment 3 is adopted. As shown in FIG. 22, the waveform of the original data and the waveform of the reproduced data are substantially identical with each other and FIG. 22 looks as if only one waveform existed.

Figure 23:
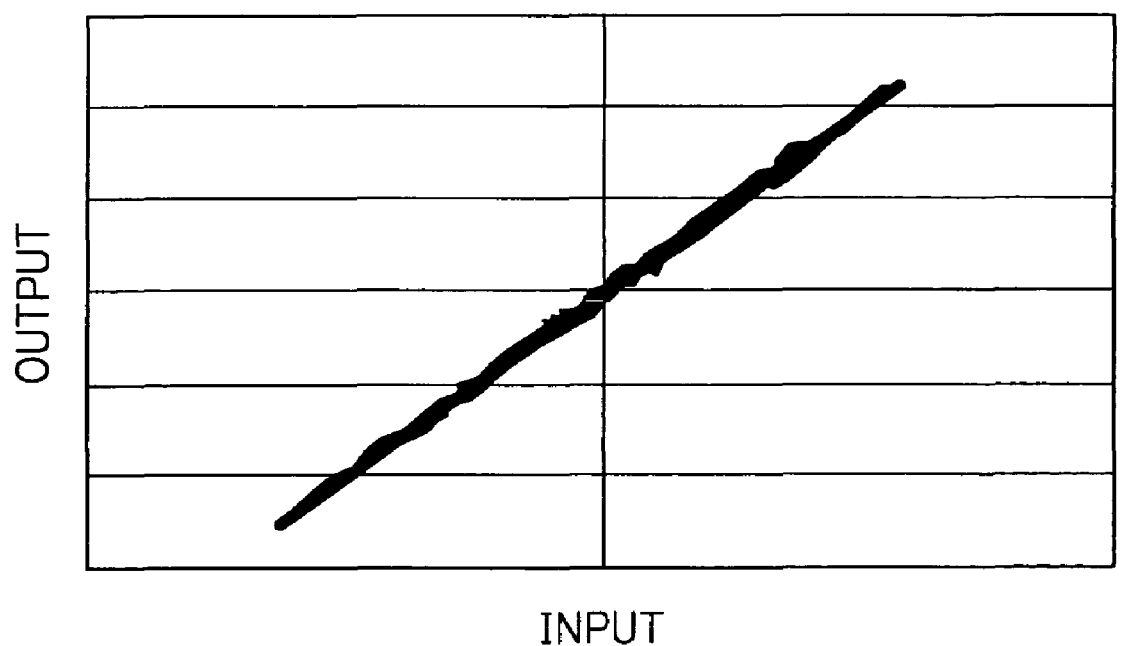
FIG. 23 is a diagram showing the input/output characteristics of the original data before compression and reproduced data obtained by decompression when Embodiment 3 is adopted.

FIG. 23 is a diagram showing the input/output characteristics of the original data before compression and reproduced data obtained by decompression. As shown in FIG. 23, extremely preferable input/output characteristics are obtained and the original data and reproduced data are substantially identical with each other.

Figure 24:
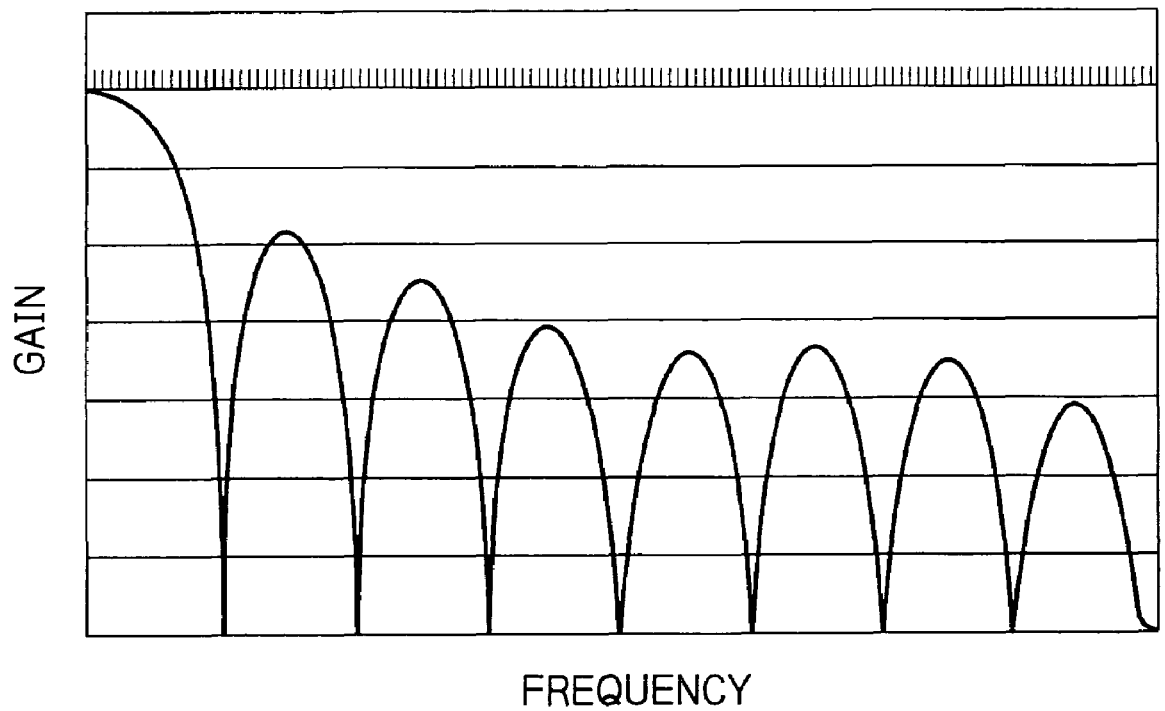
FIG. 24 is a chart showing the frequency characteristics of decompression data obtained by inputting one compression data produced by the compressing device of FIG. 14 to the decompressing device of FIG. 19.

FIG. 24 is a chart showing the frequency characteristics of decompression data obtained by inputting one compression data produced by the compressing device of FIG. 14 into the decompressing device shown in FIG. 19. As shown in FIG. 24, extremely preferable frequency characteristics are obtained. According to FIG. 24, a notch filter enters right on a part where so-called return noise occurs, thereby effectively reducing the occurrence of return noise.

As discussed above in detail, according to Embodiment 3, thinned-out data is obtained in the thinning section 202 on the compression part based on a digital basic function serving as the original of a sampling function of a finite base differentiable once or more times over the whole range, thereby achieving a compression ratio of 8.

Furthermore, in the linear compressing section 203, only data on a sampling point satisfying the error condition is extracted from thinned-out data obtained by the thinning section 202, and only pairs of the data and timing data are obtained. Moreover, in the rounding section 204, since an operation is performed for rounding lower-order bits of amplitude data retrieved from the linear compressing section 203, it is possible to reduce a data length by several bits per word and thus achieve a substantial reduction in data amount.

As is apparent from the above description, the present embodiment can entirely achieve an extremely high compression ratio (about eight to several hundreds).

In addition, the interpolating section 214 on the decompression part obtains interpolation data by using the same function as the digital basic function used by the thinning section 202 on the compression part, so that the original data before compression can be reproduced with substantial fidelity. Further, the linear compressing section 203 corresponding to the linear decompressing section 213 detects a sample point as a sampling point, on which an error from the original data does not exceed a desired value even when linear interpolation is performed during decompression, and thus preferred reproducibility to the original data can be achieved.

Particularly, regarding interpolation data produced between sampling points by linear interpolation, it is possible to achieve an extremely small phase shift as well as a small amplitude error as compared with the original data before compression. When voice is used as data to be compressed, the phase shift is considerably affected by timbre. However, since phase shift hardly appears in the present embodiment, the timbre of the original data can be reproduced with fidelity.

Further, regarding the rounding operation is performed on the compression part, most amplitude data to be rounded appear in a data area around the center of the whole data area and few amplitude data appear in a data area around the ends. Thus, even it lower-order bits are reduced, it is possible to eliminate the influence on the quality of reproduced data on the decompression part.

Additionally, in the present embodiment, the rounding operation is performed so that a data value before the rounding operation and a data value after the rounding operation have a non-linear relationship. Hence, when voice is used as data to be compressed, in the whole data area indicating voice data of audible tone, output data values are concentrated on a data area around the center where most data appear. It is possible to reduce the influence of the rounding operation and to further reduce the influence on the quality of reproduced voice on the decompression part.

Further, the present embodiment makes it possible to compress and decompress data to be compressed as it is on a time base without performing any time/frequency conversion. In addition, the thinning-out operation and the corresponding interpolating operation can be performed by extremely simple four operations, and the linear compression and the corresponding linear decompression can be performed only by performing a linear interpolating operation which is particularly simple among interpolating operations.

Therefore, the entire operations are not complicated at higher speed and the configuration can be simplified. When compression data is transmitted from the compression part and is reproduced on the decompression part, inputted compression data can be sequentially processed and reproduced by extremely simple linear interpolating operations on a time base, thereby achieving a real-time operation.

As described above, the present embodiment makes it possible to achieve a higher compression ratio while maintaining extremely preferable quality of reproduced data. In addition, the operation time can be shortened and the arithmetic circuit can be simplified.

Further, in Embodiment 3, interpolation data between amplitude data on sampling points is obtained by linear interpolation on the decompression part. The interpolating operation is not limited to this example. For example, interpolation data may be obtained by curve interpolation using a predetermined sampling function. Moreover, it is also possible to perform an interpolating operation described in Japanese Patent Application No. 11-173245 and so on applied before by the applicant. In this case, since a waveform extremely close to an analog waveform can be obtained by interpolation itself, it is also possible to eliminate the necessity for a D/A converter and an LPF in the subsequent stage of the interpolating operation.

Besides, the following operation is also applicable: curve interpolation is used on the compression part as well as the decompression part, and as sampling points, sample points are sequentially detected where an error from the original data is equal to or smaller than a desired value when curve interpolation is performed between two thinned-out data included in data to be compressed. In this case, it is preferable that the curve interpolation is the same as that of the decompression part.

Further, in Embodiment 3, the number of bits of timing data is 3 bits and error decision is performed by drawing a straight line within a range of 6 clocks from the reference thinned-out data. The present invention is not limited to this example. For example, a predetermined range for error decision may be set at 7 clocks. Moreover, the number of bits of timing data may be 4 or more bits, and the predetermined range for error decision by drawing a straight line from the reference thinned-out data may be 8 clocks or more. Thus, a compression ratio can be further improved. Additionally, the number of bits of the timing data or the predetermined range for error decision may be arbitrarily set as a parameter.

Moreover, in Embodiment 3, successive values are applicable as time intervals between two thinned-out data which are used for error decision for detecting sampling points. For example, when error decision is performed within a range of 16 clocks at the maximum (the number of bits in timing data is 5 bits), timing data values applicable as time intervals from the reference thinned-out data are included in any of 2, 3, 4, 5, 6, 7, 8, 9, 10, 11, 12, 13, 14, 15, and 16.

Meanwhile, timing data values applicable as time intervals may be discontinuous within a range wider than a predetermined interval. For example, when error decision is performed within a range of 16 clocks at the maximum, timing data values applicable as time intervals from the reference thinned-out data may be 2, 3, 4, 5, 6, 7, 8, 9, 10, 12, 14, 16, 18, 20, 24 and so on.

In this case, without increasing the number of error decisions for detecting one sampling point, it is possible to increase a maximum range applicable as time intervals between two thinned-out data. Hence, on a part where fluctuations in amplitude are not so large, for example, on a mute part, it is possible to maximize an interval between sampling points to minimize the number of sampling points without causing any delay in decision time, thereby further improving a compression ratio.

Further, time intervals between two thinned-out data are continuous within a range narrower than a predetermined interval (a range where time intervals are "10" or less). Thus, error decision can be performed more accurately on this part. Normally, a time interval from the reference sample point to a sample point, on which an error exceeds a desired value, frequently appears in a narrower range than the predetermined interval. When applicable time intervals are made discrete in a range where the error condition is satisfied in many cases, it is considered that the number of sampling points increases in reverse.

For example, when timing data values applicable as time intervals from the reference thinned-out data are set at 2, 4, 6, . . . , even if the maximum time interval for satisfying the error condition is originally 5 clocks, error decision is not performed on the 5 clocks. Thus, an actually used time interval is 4 clocks. When such a state occurs frequently, the number of detected sampling points increases accordingly. However, the number of detected sampling points can be minimized by providing successive time intervals which are applicable in a narrower range than the predetermined interval.

Further, in Embodiment 3, the error decision for detecting sampling points is performed restrictedly within a range from the reference sample point to a predetermined clock. The present invention is not limited to this example. For example, an operation is performed without limiting within a predetermined range a time interval between two data selected for detecting discrete sampling points. Then, sample points just before sample points having errors exceeding a desired value may be sequentially detected as sampling points. In this case, it is possible to maximize an interval between the sampling points and to further reduce the number of detected sampling points, thereby achieving a higher compression ratio.

Additionally, as an allowable value of an error that is used in Embodiment 3, a value such as, for example, 256, 384, and 512 can be used. An allowable value is not limited to these numeric values. When an allowable value of an error is reduced, it is possible to achieve compression and decompression placing emphasis on reproducibility of a reproduced analog signal. Further, when an allowable value of an error is increased, it is possible to achieve compression and decompression placing emphasis on a compression ratio. An allowable value of an error may be arbitrarily set as a parameter.

Moreover, the following operation is also applicable: an error allowable value is used as a function, an error allowable value is increased, for example, on a part having greater amplitude, and an error allowable value is reduced on a part having lesser amplitude. On a part having greater amplitude, even a somewhat large error does not stand out and does not seriously affect the sound quality. Therefore, when such an error allowable value is dynamically changed as a function of data amplitude, it is possible to maximize an interval between sampling points to minimize the number of detected sampling points on a part where even a somewhat large error does not stand out, and it is possible to prevent an error from increasing on a part where the error relatively stands out. Hence, it is possible to further improve a compression ratio while maintaining the extremely preferable sound quality of reproduced data.

Besides, the following operation is also applicable: an error allowable value is used as a function of a frequency, an error allowable value is increased, for example, on a part having a high frequency, and an error allowable value is reduced on a part having a low frequency. On a high-frequency part on signals inputted in series as a target of compression, that is, on a part having relatively large fluctuations in sampling data value even on a close sample point, the number of detected sampling points increases when an error allowable value is small, and thus a high compression ratio may not be achieved. However, by dynamically increasing an error allowable value on the high-frequency part, a compression ratio can be further improved while entirely maintaining the preferable sound quality of reproduced data.

As a matter of course, an error allowable value may be dynamically changed as a function for both of data amplitude and a frequency.

Moreover, in Embodiment 3, when the rounding operation is performed in a non-linear manner, data values before and after the rounding operation have a relationship of a logarithmic function. As long as the relationship placing emphasis on some of data areas, a function other than the logarithmic function can be used.

Besides, in the configuration of the compressing device shown in FIG. 14, the mute processing section 201 can be omitted.

Further, the rounding section 204 may be omitted for compression of image data.

Embodiment 4

The following will discuss Embodiment 4 of the present invention.

FIG. 25 is a diagram showing an example of a configuration of a compressing device according to Embodiment 4. In FIG. 25, members having the same reference numerals as those of FIG. 14 have the same functions and the overlapping explanation is omitted.

As shown in FIG. 25, the compressing device of the present embodiment is constituted by a format converting section 301, a mute processing section 201, a thinning section 202, a rounding section 204, a zero compressing section 302, and a blocking section 303.

The format converting section 301 converts the format of an input signal to a format suitable for the compressing device of the present embodiment. For example, an inputted signal of WAV (wave) format is converted to a signal of TXT (text) format. When the input signal is an analog signal, the format is converted after the analog signal undergoes A/D conversion.

The zero compressing section 302 corresponds to zero compressing means of the present invention. When zero data continues over n clocks or more in output data from the rounding section 204, the zero compressing section 302 replaces n or more successive zero data with a pair of −0(H80) and the number of clocks of the successive zero data and outputs the pair. An output value reaches up to 255 when a rounding operation is performed using a logarithmic function in the rounding section 204. Since −0(H80) does not exit as a data value, this value can be used as a start mark of zero compression.

When recovery is made from zero compression, it is detected that data having a predetermined threshold value or more continues over m clocks (e.g., 2 clocks) or more, and recovery is made from the zero compression to return to a normal operation.

The blocking section 303 adds header information to amplitude data, on which the zero compressing section 302 has performed zero compression, and properly performs blocking thereon. Then, the blocking section 303 outputs the amplitude data as compression data. The outputted compression data is transmitted to a transmission line or recorded in a recording medium.

Figure 26A:
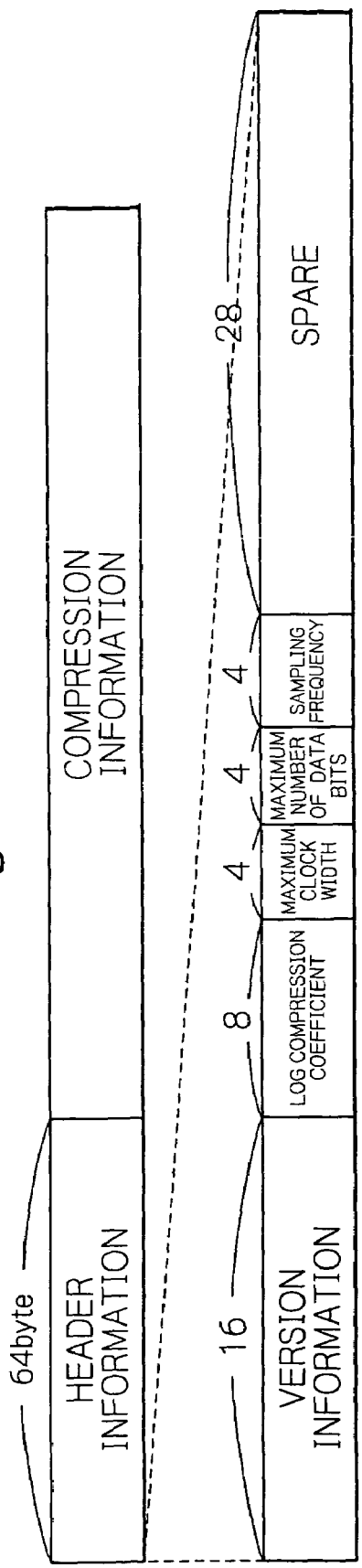
FIG. 26 is a diagram showing an example of the format of compression data blocked in Embodiment 4.

FIG. 26 is a diagram showing an example of a format of blocked compression data. FIG. 26(a) shows a format of the whole compression data. As shown in FIG. 26(a) in the compression data, compression information inputted from the zero compressing section 302 is formed so as to follow header information of 64 bytes. The compression data is data provided in 9 bits.

Figure 26B:
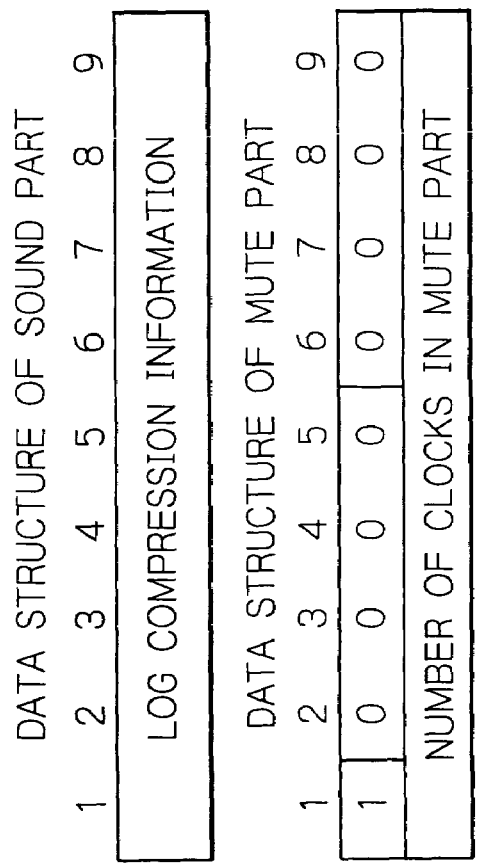

FIG. 26(b) shows the format of the compression information. A sound part (data which is not replaced by the zero compressing section 302) is composed of compression information outputted from the rounding section 204. Further, a mute part (data replaced by the zero compressing section 302) is composed of a pair of −0 (data raising "1" only on a sign bit) and the number of clocks in successive zero data.

Figure 27:
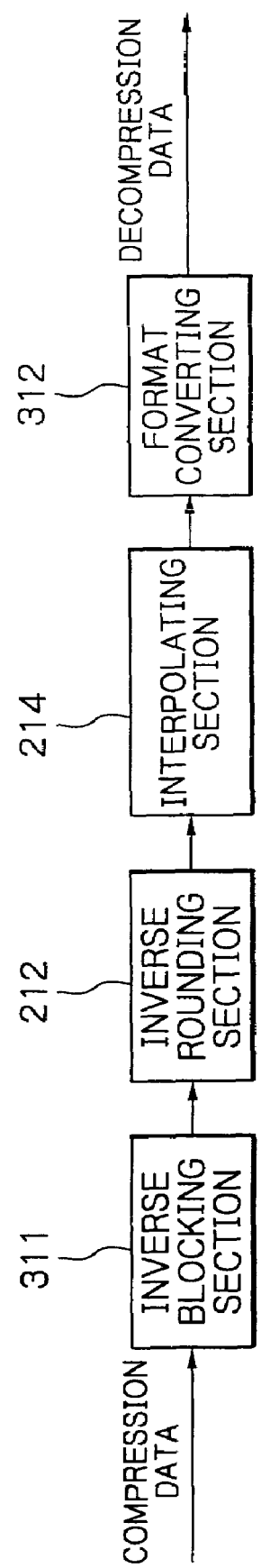
FIG. 27 is a diagram showing an example of a configuration of a decompressing device according to Embodiment 4.

FIG. 27 is a diagram showing an example of a configuration of a decompressing device according to Embodiment 4 for the compressing device configured as FIG. 25. Besides, in FIG. 27, members indicated by the same reference numerals as those of FIG. 19 have the same functions and the overlapping explanation is omitted.

As shown in FIG. 27, the decompressing device of the present embodiment is constituted by an inverse blocking section 311, an inverse rounding section 212, an interpolating section 214, and a format converting section 312. In this case, the interpolating section 214 corresponds to interpolating means of the present invention.

The inverse blocking section 311 retrieves compression information from compression data based on header information included in the blocked compression data of FIG. 26. At this point, when data of −1(H80) is detected, zero data is reproduced by the number of clocks which are subsequently recorded. In this way, the inverse blocking section 311 includes zero decompressing means of the present invention.

The format converting section 312 converts the format of decompression data, which is outputted from the interpolating section 214, to the original format before compression. For example, the output data from the interpolating section 214 is converted to a signal of WAV (wave) format. Further, at need, a signal after the format conversion is subjected to D/A conversion and is outputted.

The compressing device and the decompressing device configured thus according to the present embodiment are constituted by a CPU or a computer system comprising an MPU, a ROM, and a RAM, and the functions of the devices can be achieved by operating programs stored in the ROM and the RAM.

Moreover, the compressing device and the decompressing device configured thus according to the present embodiment can be partly or entirely constituted by combining logic circuits like hardware.

As discussed above in detail, according to Embodiment 4, thinned-out data is obtained in the thinning section 202 on the compression part based on a digital basic function serving as the original of a sampling function of a finite base differentiable once or more times over the whole range, thereby achieving a compression ratio of 8.

Additionally, since the rounding operation 204 rounds lower-order bits of thinned-out data (amplitude data) produced by the thinning section 202, the data length can be shortened by several bits per word, thereby achieving a substantial reduction in data amount.

As compared with Embodiment 3, although amplitude data is not reduced by linear compression, the necessity for timing data can be completely eliminated. Therefore, it is possible to shorten a data length to 9 bits per unit and thus an amount of data can be reduced accordingly.

Further, the zero compression is performed instead of linear compression in the zero compressing section 302, so that zero data having a certain time interval can be compressed to a pair of "–0" and the number of clocks, thereby further reducing the data amount. In addition, since data having a small absolute value is replace with zero data in advance in the mute processing section 201, it is possible to achieve a larger reduction in data amount in the zero compression.

As is apparent from above description, the present embodiment can entirely achieve an extremely high compression ratio (about 8 to several hundreds).

Additionally, in the interpolating section 214 on the decompression part, interpolation data is obtained by using the same function as the digital basic function used in the thinning section 202 on the compression part, so that the original data before compression can be reproduced with substantial fidelity.

Further, while the rounding operation is performed on the compression part, most amplitude data to be rounded concentrate on a data area around the center of the whole data area but few data appear in a data area around the ends. Thus, even when lower-order bits are reduced, it is possible to eliminate the influence on the quality of reproduced data on the decompression part.

Furthermore, in the present embodiment, the rounding operation is performed so that a data value before the rounding operation and a data value after the rounding operation have a non-linear relationship. Hence, when voice is used as data to be compressed, output data values are concentrated on a data area around the center where most data appear in the whole data area indicating voice data of audible tone, and the influence of the rounding operation can be reduced, thereby further reducing the influence on the quality of reproduced voice on the decompression part.

Besides, the present embodiment makes it possible to compress and decompress data to be compressed as it is on a time base without performing any time/frequency conversion. In addition, the compression and decompression can be performed only by extremely simple four operations. Further, as compared with Embodiment 3, the operation of linear compression can be also omitted. Therefore, the operations are not complicated as a whole and the configuration can be also simplified. Moreover, when compression data is transmitted from the compression part and is reproduced on the decompression part, inputted compression data can be sequentially processed and reproduced by extremely simple linear interpolation on a time base, thereby achieving a real-time operation.

As described above, the present embodiment makes it possible to achieve a higher compression ratio while maintaining the extremely preferable quality of reproduced data. In addition, the operation time can be shortened and the arithmetic circuit can be simplified.

The above-described compressing and decompressing methods according to Embodiments 1 to 4 can be obtained by any of a hardware structure, a DSP, and software. For example, when the methods are realized by software, the compressing device and the decompressing device are actually constituted by a CPU or an MPU, a RAM, a ROM, and so on of a computer and are realized by operating programs stored in the RAM and the ROM.

Therefore, the devices are realized by recording programs, which are executed so that the computer performs the functions of the present embodiment, in a recording medium such as a CD-ROM and reading the programs in the computer. As a recording medium for recording the programs, a floppy disk, a hard disk, a magnetic tape, an optical disk, a magneto-optical disk, a DVD, a nonvolatile memory card, and so on are available other than a CD-ROM. Further, the devices are realized also by downloading the programs to a computer via a network such as Internet.

In addition to the case where the computer executes supplied programs to realize the functions of the above-described embodiments, in the case where the functions of the above-described embodiments are achieved by executing the programs in coordination with the OS (operating system) or other application software and so on which are operated in the computer and in the case where the functions of the above-described embodiments are achieved by performing some or all the operations of the supplied programs by the feature expansion board and the feature expansion unit of the computer, the programs are included in the embodiments of the present invention.

Further, the above-described embodiments just described specific examples for practicing the present invention and shall not limit the interpretation of the technical scope of the present invention. Namely, the present invention can be practiced in various forms without departing from the spirit and the main characteristics of the invention.

As described above, the present invention can achieve both of an increased compression ratio and improved quality of reproduced data. In addition, the compressing and decompressing operations of a signal can be simplified to shorten the processing time and the configuration for achieving the simplification can be also simplified.

INDUSTRIAL APPLICABILITY

The present invention provides completely new compressing and decompressing methods of improving a compression ratio and the quality of reproduced data. The present invention is effective for simplifying compressing and decompressing operations of a signal to shorten the processing time and for simplifying the configuration for realizing the simplification.

What is claimed is:
1. A compressing device, comprising:
    delay circuits of four stages for sequentially delaying each sampling data inputted therein in sequence;
    a multiplying/adding circuit for performing weighted addition on data outputted from each of the delay circuits, the weighted addition being performed according to a value of a digital basic function, whereby thinned-out data is produced from the sequentially inputted sampling data; and
    a first multiplying/adding circuit for adding output data from the delay circuits of the second and third stages and then multiplying the added data by 9;

a second multiplying/adding circuit for adding output data from the delay circuits of the first and fourth stages and then multiplying the added data by −1; and a third multiplying/adding circuit for adding output data from the first multiplying/adding circuit and output data from the second multiplying/adding circuit and then multiplying the added data by 1/16.

2. The compressing device according to claim 1, wherein the delay circuits of the four stages and the multiplying/adding circuits are designed as a thinning-out circuit, and in the compressing device, at least two thinning-out circuits are connected so as to have a cascade connection.

3. A compressing device, comprising:

delay circuits of seven stages for sequentially delaying each sampling data inputted therein in sequence;

a multiplying/adding circuit for performing weighted addition on data outputted from each of the delay circuits, the weighted addition being performed according to a value of a digital basic function, whereby thinned-out data is produced from the sequentially inputted sampling data;

a first multiplying/adding circuit for adding output data from the delay circuits of the first and seventh stages and then multiplying the added data by −1;

a second multiplying/adding circuit for adding output data from the delay circuits of the third and fifth stages and then multiplying the added data by 9;

a multiplying circuit for multiplying output data from the delay circuit of the fourth stage by 16; and a third multiplying/adding circuit for adding output data from the first multiplying/adding circuit, output data from the second multiplying/adding circuit, and output data from the multiplying circuit, and then multiplying the added data by 1/32.

4. The compressing device according to claim 3, wherein the delay circuits of the seven stages and the multiplying/adding circuits are designed as a thinning-out circuit, and in the compressing device, at least two thinning-out circuits are connected so as to have a cascade connection.

5. A compressing device into which sampling data can be inputted in sequence as a target of compression, the device comprising:

thinning-out means for performing weighted addition with respect to the inputted sampling data to produce thinned-out data therefrom, in which the weighted addition is performed on sampling data on a target sample point and sampling data on several sample points around said target sample point, the weighted addition being performed according to a value of a digital basic function;

sampling point detecting means for detecting a sampling point using the thinned-out data produced by the thinning-out means, in which a sample point, where an error between each data value on a straight line connecting two thinned-out data and a thinned-out data value on the same sample point as that of said data value on the straight line is equal to or smaller than a predetermined value, is detected as the sampling point; and compression data producing means for producing, in the form of compression data, a pair of discrete amplitude data on each of the detected sampling points and timing data indicating a time interval between the detected sampling points.

6. The compressing device according to claim 5, further comprising replacing means for replacing sampling data with zero data, in which among the discrete sampling data successively inputted as a target of compression, the sampling data to be replaced has an absolute value smaller than a predetermined value, wherein through the replacing means the inputted sampling data is fed to the thinning-out means.

7. The compressing device according to claim 5, further comprising replacing means for rounding by a predetermined value an absolute value of the sampling data inputted as a target of compression, as well as for performing a data replacement process, wherein in the data replacement process, the replacing means replaces sampling data with zero data, in which among the sampling data inputted as a target of compression, the sampling data to be replaced has absolute value smaller than a predetermined value, and wherein through the replacing means the inputted sampling data is fed to the thinning-out means.

8. The compressing device according to claim 5, further comprising rounding means for rounding lower-order bits of amplitude data on each of the sampling points detected by the sampling point detecting means, wherein the compression data producing means produces, in the form of the compression data, a pair of the rounded amplitude data on each of the detected sampling points and timing data indicating a time interval between the detected sampling points.

9. The compressing device according to claim 8, wherein the rounding operation by the rounding means is performed according to an operation in which data values before and after the rounding operation have a non-linear relationship.

10. The compressing device according to claim 9, wherein the operation having the non-linear relationship is an operation based on a logarithmic function or a function approximated thereto.

11. A decompressing device, comprising:

inverse rounding means for performing an inverse rounding operation on amplitude data on each sampling point in compression data produced by a compressing device claimed in claim 8, the inverse rounding operation being performed in a manner reversed from a rounding operation performed during compression by the compression device;

first interpolating means for performing an interpolation process using both of timing data in the compression data and the amplitude data outputted from the inverse rounding means, in which through the interpolation process the first interpolation means produces first interpolation data for interpolating between one amplitude data and the other amplitude data which have a time interval indicated by the timing data; and second interpolating means for producing second interpolation data for the produced first interpolation data by performing weighted addition with respect to the produced first interpolation data, in which the weighted addition is performed on first interpolation data on a target sample point and first interpolation data on several sample points around said target sample point, the weighted addition being performed according to a value of a digital basic function.

12. The decompressing device according to claim 11, wherein the operation reversed from the rounding operation is performed according to an operation in which data values before and after the inverse rounding operation have a non-linear relationship.

13. The decompressing device according to claim 12, wherein the operation having the non-linear relationship is an operation based on an exponential function or a function approximated thereto.

14. A computer-readable medium containing computer code thereon for a decompressing program which, when executed, causes a computer to carry out functions associated with claim 11.

15. A computer-readable medium containing computer code thereon for a compressing program which, when executed, causes a computer to carry oil functions associated with the thinning out means, sampling point detecting means, and compression data producing means of claim 5.

16. A record medium readable by a computer, on which a program for making the computer to function as each means in claim 5 is recorded.

17. A decompressing device, comprising:
first interpolating means for performing an interpolation process with respect to thinned-out data produced by a compressing device claimed in claim 5, in which in the interpolation process, timing data and amplitude data on each sampling point are used to produce first interpolation data for interpolating between one amplitude data and the other amplitude data which have a time interval indicated by the timing data; and
second interpolating means for producing second interpolation data for the produced first interpolation data by performing a further interpolation process with respect to the produced first interpolation data, in which in the further interpolation process, weighted addition is performed on interpolation data on a target sample point and interpolation data on several sample points around said target sample point, the weighted addition being performed according to a value of a digital basic function.

18. A computer-readable medium containing computer code thereon for a decompressing program which, when executed, causes a computer to carry oil functions associated with: the first and second interpolating means of claim 17.

19. A record medium readable by a computer, on which a program for making the computer to function as each means in claim 17 is recorded.

20. A compressing device, into which sampling data can be successively inputted as a target of compression, the device comprising:
replacing means for replacing sampling data with zero data, in which among the discrete sampling data successively inputted as a target of compression, the sampling data to be replaced has an absolute value smaller than a predetermined value; and
thinning-out means for performing weighted addition with respect to the sampling data sequentially inputted therein from the replacing means, in which the weighted addition is performed sampling data on a target sample point and sampling data on several sample points around said target sample point, the weighted addition being performed according to a value of a digital basic function, whereby thinned-out data is produced from the sampling data.

21. The compressing device according to claim 20, further comprising rounding means for rounding a lower-order bit of the thinned-out data produced by the thinning-out means.

22. The compressing device according to claim 21, wherein the rounding operation by the rounding means is performed according to an operation in which data values before and after the rounding operation have a non-linear relationship.

23. The compressing device according to claim 22, further comprising zero compressing means for performing a zero compressing process with respect to the thinned-out data outputted from the rounding means,
wherein the zero compressing process is performed when a predetermined number or more of data having absolute values of zero are successively outputted from the rounding means, and
wherein in the zero compressing process, a set of said predetermined number of zero data is replaced with a pair of a value of −0 and a value indicating the number of successive zero data, and then the thinned-out data including a replacement result is outputted from the zero compressing means.

24. A decompressing device, comprising:
zero decompressing means for performing a zero decompressing process with respect to thinned-out data produced by a compressing device claimed in claim 23, in which when a −0 value is detected in the thinned-out data, a corresponding number of successive zero data are reproduced through the zero decompressing process;
inverse rounding means for performing an inverse rounding operation on the discrete thinned-out data including the zero data reproduced by the zero decompressing means, the inverse rounding operation being performed in a manner reversed from a rounding operation performed during compression by the compressing device; and
interpolating means for performing an interpolation process with respect to the discrete thinned-out data outputted from the inverse rounding means to produce interpolation data for said discrete thinned-out data, in which in the interpolation process, weighted addition is performed on thinned-out data on a target sample point and thinned-out data on several sample points around said target sample point, the weighted addition being performed according to a value of a digital basic function.

25. A computer-readable medium containing computer code thereon for a decompressing program which, when executed, causes a computer to carry out functions associated with the zero decompressing means in claim 24.

26. A decompressing device, comprising:
inverse rounding means for performing an inverse rounding operation on discrete thinned-out data produced through a rounding operation by a compressing device claimed in claim 21, the inverse rounding operation being performed in a manner reversed from a rounding operation performed during the compression by the compression device; and
interpolating means for performing an interpolation process with respect to the discrete thinned-out data outputted from the inverse rounding means to produce interpolation data for the discrete thinned-out data, wherein in the interpolation process, weighted addition is performed on thinned-out data on a target sample point and thinned-out data on several sample points around said target sample point, the weighted addition being performed according to a value of a digital basic function.

27. A computer-readable medium containing computer code thereon for a decompressing program which, when executed, causes a computer to carry out functions associated with the inverse rounding means in claim 26.

28. A computer-readable medium containing computer code thereon for a compressing program which, when executed, causes a computer to carry out functions associated with the replacing means and thinning out means of claim 20.

29. A decompressing device, comprising interpolating means for performing an interpolation process with respect to discrete thinned-out data produced by a compressing device claimed in claim 20 to produce interpolation data for the discrete thinned-out data, wherein in the interpolation process, weighted addition is performed on thinned-out data on a target sample point and thinned-out data on several sample points around said target sample point, the weighted addition being performed according to a value of a digital basic function.

30. A computer-readable medium containing computer code thereon for a decompressing program which, when executed, causes a computer to carry out functions associated with the interpolating means in claim 29.

31. A compressing device, into which sampling data can be inputted in sequence as a target of compression, the device comprising:

thinning-out means for performing weighted addition with respect to the inputted sampling data to produce thinned-out data therefrom, in which the weighted addition is performed on sampling data on a target sample point and sampling data on several sample points around said target sample point, the weighted addition being performed according to a value of a digital basic function; and rounding means for rounding a lower-order bit of the produced thinned-out data.

32. The compressing device according to claim 31, wherein the rounding operation by the rounding means is performed according to an operation in which data values before and after the rounding operation have a non-linear relationship.

33. The compressing device according to claim 32, further comprising zero compressing means for performing a zero compressing process with respect to the thinned-out data outputted from the rounding means, wherein the zero compressing process is performed when a predetermined number or more of data having absolute values of zero are successively outputted from the rounding means; and wherein in the zero compressing process, a set of said predetermined number of zero data is replaced with a pair of a value of −0 and a value indicating the number of successive zero data, and then the thinned-out data including a replacement result is outputted from the zero compressing means.

34. A decompressing device, comprising:

zero decompressing means for performing a zero decompressing process with respect to thinned-out data produced by a compressing device claimed in claim 33, in which when a −0 value is detected in the thinned-out data, a corresponding number of successive zero data are reproduced through the zero decompressing process;

inverse rounding means for performing an inverse rounding operation on the discrete thinned-out data including the zero data reproduced by the zero decompressing means, the inverse rounding operation being performed in a manner reversed from a rounding operation performed during compression by the compressing device; and interpolating means for performing an interpolation process with respect to the discrete thinned-out data outputted from the inverse rounding means to produce interpolation data for said discrete thinned-out data, in which in the interpolation process, weighted addition is performed on thinned-out data on a target sample point and thinned-out data on several sample points around said target sample point, the weighted addition being performed according to a value of a digital basic function.

35. A computer-readable medium containing computer code thereon for a decompressing program which, when executed, causes a computer to carry out functions associated with the zero decompressing means, inverse rounding means and interpolating means in claim 34.

36. A computer-readable medium containing computer code thereon for a compressing program which, when executed, causes a computer to carry out functions associated with the thinning out means and rounding means of claim 31.

37. A decompressing device, comprising:

inverse rounding means for performing an inverse rounding operation on discrete thinned-out data produced through a rounding operation by a compressing device claimed in claim 31, the inverse rounding operation being performed in a manner reversed from a rounding operation performed during compression by the compression device; and interpolating means for performing an interpolation process with respect to the discrete thinned-out data outputted from the inverse rounding means to produce interpolation data for the discrete thinned-out data, wherein in the interpolation process, weighted addition is performed on thinned-out data on a target sample point and thinned-out data on several sample points around said target sample point, the weighted addition being performed according to a value of a digital basic function.

38. A computer-readable medium containing computer code thereon for a decompressing program which, when executed, causes a computer to carry out functions associated with the inverse rounding means and interpolating means in claim 37.

39. A compressing device, into which sampling data can be successively inputted as a target of compression, the device comprising:

replacing means for replacing sampling data with zero data, in which among the discrete sampling data successively inputted as a target of compression, the sampling data to be replaced has an absolute value smaller than a predetermined value;

rounding means for performing a rounding operation on the sampling data outputted from the replacing means to round lower-order bits thereof, the rounding operation being performed according to an operation in which data values before and after the rounding operation have a non-linear relationship; and zero compressing means for performing a zero compressing process with respect to the sampling data outputted from the rounding means, wherein the zero compressing process is performed when a predetermined number or more of data having absolute values of zero are successively outputted from the rounding means, and wherein in the zero compressing process a set of said predetermined number of zero data is replaced with a pair of a value of −0 and a value indicating the number of successive zero data, and then data including a replacement result is outputted from the zero compressing means.

40. A computer-readable medium containing computer code thereon for a compressing program which, when executed, causes a computer to carry out functions associated with the replacing means, rounding means, and zero compressing means of claim 39.

41. A decompressing device, comprising:

zero decompressing means for performing a zero decompressing process with respect to thinned-out data produced by a compressing device claimed in claim 39, in which when a −0 value is detected in the thinned-out data, a corresponding number of successive zero data are reproduced through the zero decompressing process; and inverse rounding means for performing an inverse rounding operation on the discrete thinned-out data including the zero data reproduced by the zero decompressing means, the inverse rounding operation being performed in a manner reversed from a rounding operation performed during compression by the compressing device.

42. A computer-readable medium containing computer code thereon for a decompressing program which, when executed, causes a computer to carry out functions associated with the zero decompressing means and inverse rounding means in claim 41.

43. A compressing device, into which sampling data can be successively inputted as a target of compression, the device comprising:

rounding means for performing a rounding operation on the successively inputted sampling data to round lower-order bits thereof, the rounding operation being performed according to an operation in which data values before and after the rounding operation have a non-linear relationship; and zero compressing means for performing a zero compressing process with respect to the sampling data outputted from the rounding means, wherein the zero compressing process is performed when a predetermined number or more of data having absolute values of zero are successively outputted from the rounding means, and wherein in the zero compressing process a set of said predetermined number of zero data is replaced with a pair of a value of −0 and a value indicating the number of successive zero data, and then data including a replacement result is outputted from the zero compressing means.

44. A computer-readable medium containing computer code thereon for a compressing program which, when executed, causes a computer to carry out functions associated with the rounding means and zero compressing means of claim 43.

45. A decompressing device, comprising:

zero decompressing means for performing a zero decompressing process with respect to thinned-out data produced by a compressing device claimed in claim 43, in which when a −0 value is detected in the thinned-out data, a corresponding number of successive zero data are reproduced through the zero decompressing process; and inverse rounding means for performing an inverse rounding operation on the discrete thinned-out data including the zero data reproduced by the zero decompressing means, the inverse rounding operation being performed in a manner reversed from a rounding operation performed during compression by the compressing device.

46. A computer-readable medium containing computer code thereon for a decompressing program which, when executed, causes a computer to carry out functions associated with the zero decompressing means and inverse rounding means in claim 45.

47. A compressing method, comprising the steps of:

sequentially inputting sampling data as a target of compression;

performing weighted addition with respect to the inputted sampling data the weighted addition being performed on sampling data on a target sample point and sampling data on several sample points around said target sample point, and the weighted addition being performed according to a value of a digital basic function whereby thinned-out data is produced from the sequentially inputted sampling data, wherein the digital basic function is a function having a data value changing to −1, 0, 9, 16, 9, 0, and −1 on each clock, the function being produced by shifting the digital basic function, wherein the digital basic function is a function having a data value changing to −1, 1, 8, 8, 1, and −1 on each clock by one clock and then adding the digital basic functions before and after the shift.

48. A compressing method, comprising the steps of:

sequentially inputting sampling, data as a target of compression; and performing weighted addition with respect to the inputted sampling data, the weighted addition being performed on sampling data on a target sample point and sampling data on several sample points around said target sample point, and the weighted addition being performed according to a value of a digital basic function, whereby thinned-out data is produced from the sequentially inputted sampling data, wherein when sampling data on four successive sample points are denoted by A, B, C and D, respectively, in the weighted addition two sampling data B and C on target sample points are replaced with one thinned-out data according to an operation of (9(B+C)−(A+D))/16, and the same operation is sequentially performed while the target sample points where two sampling data are to be replaced are shifted by two sample points.

49. A compressing method, comprising the steps of:

sequentially inputting sampling data as a target of compression; and performing weighted addition with respect to the inputted sampling data, the weighted addition being performed on sampling data on a target sample point and sampling data on several sample points around said target sample point, and the weighted addition being performed according to a value of a digital basic function, whereby thinned-out data is produced from the sequentially inputted sampling data, wherein when sampling data on seven successive sample points are denoted by A, B, C, D, E, F, and G, respectively, in the weighted addition the sampling data D on a target sample point is replaced with one thinned-out data according to an operation of (16D+9(C+E)−(A+G))/32, and the same operation is sequentially performed while the target sample point is shifted by two sample points.

50. A compressing method, comprising the steps of:

sequentially inputting sampling data as a target of compression; and performing weighted addition with respect to the inputted sampling data, the weighted addition being performed on sampling data on a target sample point and sampling, data on several sample points around said target sample point, and the weighted addition being performed according to a value of a digital basic function, whereby thinned-out data is produced from the sequentially inputted sampling data, further comprising the step of further performing weighted addition with respect to the thinned-out data already produced through the first weighted addition, in which the second weighted addition is performed on thinned-out data on a target sample point and thinned-out data on several sample points around said target sample point, the second weighted addition being performed according to a value of the digital basic function.

51. A compressing method, comprising the steps of:
sequentially inputting sampling data as a target of compression;
performing weighted addition with respect to the inputted sampling data, the weighted addition being performed on sampling data on a target sample point and sampling data on several sample points around said target sample point, and the weighted addition being performed according to a value of a digital basic function, whereby thinned-out data is produced from the sequentially inputted sampling data;
determining a sampling point using the produced thinned-out data, in which a sample point, where a difference value between each data value on a straight line connecting two thinned-out data and a thinned-out data value on the same sample point as that of said data value on the straight line is equal to or smaller than a predetermined value, is detected as the sampling point; and
producing, in the form of compression data, a pair of discrete amplitude data on each of the detected sampling points and timing data indicating a time interval between the detected sampling points.

52. The compressing method according to claim 51, further comprising the step of replacing sampling data with zero data, in which among the discrete sampling data successively inputted as a target of compression, the sampling data to be replaced has an absolute value smaller than a predetermined value,
wherein the weighted addition being performed on data subjected to the data replacement.

53. The compressing method according to claim 51, further comprising the step of rounding lower-order bits of amplitude data on each of the detected sampling points,
wherein in the compression data producing step, a pair of the rounded amplitude data on each of the detected sampling points and timing data indicating a time interval between the detected sampling points is produced in the form of said compression data.

54. A decompressing method, comprising the steps of:
performing an inverse rounding operation on amplitude data on each sampling point in compression data produced by a compressing method claimed in claim 53, the inverse rounding operation being performed in a manner reversed from a rounding operation performed during compression by the compressing method;
performing a first interpolation process using both of the amplitude data successively subjected to the inverse rounding operation and timing data in the compression data, in which through the first interpolation process, first interpolation data for interpolating between one amplitude data and the other amplitude data which have a time interval indicated by the timing data is produced; and performing a second interpolations process with respect to the produced first interpolation data, in which in the second interpolation process, weighted addition is performed on first interpolation data on a target sample point and first interpolation data on several sample points around said target sample point, the weighted addition being performed according to a value of a digital basic function, whereby second interpolation data for the produced first interpolation is produced through the second interpolation process.

55. The decompressing method according to claim 54, the operation reversed from the rounding operation is performed according to an operation in which data values before and after the inverse rounding operation have a non-linear relationship.

56. A decompressing method, comprising the steps of:
performing a first interpolation process with respect to compression data produced by a compressing method claimed in claim 51, in which in the first interpolation process, timing data and amplitude data on each sampling point are used to produce first interpolation data for interpolating between one amplitude data and the other amplitude data which have a time interval indicated by the timing data; and
performing a second interpolation process with respect to the produced first interpolation data to produce second interpolation data for the produced first interpolation data, in which another weighted addition is performed on interpolation data on a target sample point and interpolation data on several sample points around said target sample point, the weighted addition being performed according to a value of a digital basic function.

57. A compressing method, comprising the steps of:
sequentially inputting sampling data as a target of compression;
replacing sampling data with zero data, in which among the discrete sampling data successively inputted as a target of compression, the sampling data to be replaced has an absolute value smaller than a predetermined value; and
performing weighted addition with respect to the successive sampling data subjected to the data replacement process, the weighted addition being performed on sampling data on a target sample point and sampling data on several sample points around said target sample point, and the weighted addition being performed according to a value of a digital basic function, whereby thinned-out data is produced from the sequentially inputted sampling data.

58. The compressing method according to claim 57, further comprising the step of rounding a lower-order bit of the thinned-out data produced by the weighted addition step.

59. The compressing method according to claim 58, wherein the rounding operation step is performed according to an operation in which data values before and after the rounding operation have a non-linear relationship.

60. The compressing method according to claim 59, further comprising the step of performing a zero compressing process with respect to the thinned-out data subjected to the rounding operation,
wherein the zero compressing process is performed when a predetermined number or more of data having absolute values of zero are successively outputted in the rounding operation; and
wherein in the zero compressing process a set of said predetermined number of zero data is replaced with a pair of a value of −0 and a value indicating the number of successive zero data, and then the thinned-out data including a replacement result is outputted.

61. A decompressing method, comprising the steps of:
performing a zero decompressing process with respect to thinned-out data produced by a compressing method claimed in claim 60, in which when a −0 value is detected in the thinned-out data, a corresponding number of successive zero data are reproduced through the zero decompressing process;
performing an inverse rounding operation on the discrete thinned-out data including the zero data reproduced through the zero decompressing step, the inverse rounding operation being performed in a manner reversed from a rounding operation performed during the compression; and
performing an interpolation process with respect to the discrete thinned-out data subjected to the inverse rounding operation to produce interpolation data for said discrete thinned-out data, in which in the interpolation process, weighted addition is performed on thinned-out data on a target sample point and thinned-out data on several sample points around said target sample point, the weighted addition being performed according to a value of a digital basic function.

62. A decompressing method, comprising the steps of:
performing an inverse rounding operation on discrete thinned-out data produced through a rounding operation by a compressing method claimed in claim 58, the inverse rounding operation being performed in a manner reversed from a rounding operation performed during compression by the compression device; and
performing an interpolation process with respect to the discrete thinned-out data subjected to the inverse rounding operation to produce interpolation data for the discrete thinned-out data, wherein in the interpolation process, weighted addition is performed on thinned-out data on a target sample point and thinned-out data on several sample points around said target sample point, the weighted addition being performed according to a value of a digital basic function.

63. A decompressing method, in which weighted addition is performed with respect to discrete thinned-out data produced by a compressing method claimed in claim 57,
wherein the weighted addition is performed on thinned-out data on a target sample point and thinned-out data on several sample points around said target sample point to produce interpolation data for the discrete thinned-out data, the weighted addition being performed according to a value of a digital basic function.

64. A compressing method, comprising the steps of:
sequentially inputting sampling data as a target of compression;
performing weighted addition with respect to the sampling data successively inputted as a target of compression, the weighted addition being performed on sampling data on a target sample point and sampling data on several sample points around said target sample point, and the weighted addition being performed according to a value of a digital basic function, whereby thinned-out data is produced from the sequentially inputted sampling data; and
rounding a lower-order bit of the thinned-out data produced by the weighted addition.

65. The compressing method according to claim 64, wherein the rounding operation step is performed according to an operation in which data values before and after the rounding operation have a non-linear relationship.

66. The compressing method according to claim 65, further comprising the step of performing a zero compressing process with respect to the thinned-out data subjected to the rounding operation,
wherein the zero compressing process is performed when a predetermined number or more of data having absolute values of zero are successively outputted in the rounding operation, and
wherein in the zero compressing process a set of said predetermined number of zero data is replaced with a pair of a value of −0 and a value indicating the number of successive zero data, and then the thinned-out data including a replacement result is outputted.

67. A decompressing method, comprising the steps of:
performing a zero decompressing process with respect to thinned-out data produced by a compressing method claimed in claim 66, in which when a −0 value is detected in the thinned-out data, a corresponding number of successive zero data are reproduced through the zero decompressing process;
performing an inverse rounding operation on the discrete thinned-out data including the zero data reproduced in the zero decompressing step, the inverse rounding operation being performed in a manner reversed from a rounding operation performed during the compression; and
performing an interpolation process with respect to the discrete thinned-out data subjected to the inverse rounding step to produce interpolation data for said discrete thinned-out data, in which in the interpolation process, weighted addition is performed on thinned-out data on a target sample point and thinned-out data on several sample points around said target sample point, the weighted addition being performed according to a value of digital basic function.

68. A decompressing method, comprising the steps of:
performing an inverse rounding operation on discrete thinned-out data produced through a rounding operation by a compressing method claimed in claim 64, the inverse rounding operation being performed in a manner reversed from a rounding operation performed during the compression by the compression device; and
performing an interpolation process with respect to the discrete thinned-out data out data, wherein in the interpolation process, weighted addition is performed on thinned-out data on a target sample point and thinned-out data on several sample points around said target sample point, the weighted addition being performed according to a value of a digital basic function.

69. A compressing method, comprising the steps of:
sequentially inputting sampling data as a target of compression;
replacing sampling data with zero data, in which among the discrete sampling data successively inputted as a target of compression, the sampling data to be replaced has an absolute value smaller than a predetermined value;
rounding a lower-order bit of the sampling data subjected to the data replacement process, the rounding operation step being performed according to an operation in which data values before and after the rounding operation have a non-linear relationship; and
performing a zero compressing process with respect to the sampling data subjected to the rounding operation, wherein the zero compressing process is performed when a predetermined number or more of data having absolute values of zero are successively outputted in the rounding operation, and wherein in the zero compressing process a set of said predetermined number of zero data is replaced with a pair of a value of −0 and a value indicating the number of successive zero data, and then data including a replacement result is outputted.

70. A decompressing method, comprising the steps of:
performing a zero decompressing process with respect to thinned-out data produced by a compressing method claimed in claim 69, in which when a −0 value is detected in the thinned-out data, a corresponding number of successive zero data are reproduced through the zero decompressing process; and
performing an inverse rounding operation on the discrete thinned-out data including the zero data reproduced in the zero decompressing step, the inverse rounding operation being performed in a manner reversed from a rounding operation performed during the compression.

71. A compressing method, comprising the steps of:
sequentially inputting sampling data as a target of compression;
rounding a lower-order bit of the discrete sampling data successively inputted, the rounding operation being performed according to an operation in which data values before and after the rounding operation have a non-linear relationship; and
performing a zero compressing process with respect to the sampling data subjected to the rounding operation, wherein the zero compressing process is performed when a predetermined number or more of data having absolute values of zero are successively outputted in the rounding operation, and wherein in the zero compressing process a set of said predetermined number of zero data is replaced with a pair of a value of −0 and a value indicating the number of successive zero data, and then data including a replacement result is outputted.

72. A decompressing method, comprising the steps of:
performing a zero decompressing process with respect to thinned-out data produced by a compressing method claimed in claim 71, in which when a −0 value is detected in the thinned-out data, a corresponding number of successive zero data are reproduced through the zero decompressing process; and
performing an inverse rounding operation on the discrete thinned-out data including the zero data reproduced in the zero decompressing step, the inverse rounding operation being performed in a manner reversed from a rounding operation performed during the compression.

73. A decompressing device, comprising:
delay circuits of several stages into which discrete thinned-out data produced by a compressing device can be inputted, each of the delay circuits delaying the inputted thinned-out data in sequence; and
a multiplying/adding circuit for performing weighted addition on data outputted from each of the delay circuits, the weighted addition being performed according to a value of a digital basic function, whereby interpolation data for the thinned-out data is produced, wherein the compressing device comprises;
delay circuits of several stages for sequentially delaying each sampling data inputted therein in sequence; and
a multiplying/adding circuit for performing weighted addition on data outputted from each of the delay circuits, the weighted addition being performed according to a value of a digital basic function, whereby thinned-out data is produced from the sequentially inputted sampling data.

74. The decompressing device according to claim 73, wherein the delay circuits and the multiplying/adding circuit are designed as an oversampling circuit, and in the decompressing device, at least two oversampling circuits are connected so as to have a cascade connection.

75. A decompressing device, comprising:
delay circuits of three stages into which discrete thinned-out data produced by a compressing device can be inputted, each of the delay circuits delaying the inputted thinned-out data in sequence; and
a multiplying/adding circuit for performing weighted addition on data outputted from each of the delay circuits, the weighted addition being performed according to a value of a digital basic function, whereby interpolation data for the thinned-out data is produced, wherein the compressing device comprises:
delay circuits of four stages for sequentially delaying each sampling data inputted therein in sequence; and
a multiplying/adding circuit for performing weighted a addition on data outputted from each of the delay circuits, the weighted addition being performed according to a value of a digital basic function, whereby thinned-out data is produced from the sequentially inputted sampling data.

76. The decompressing device according to claim 75, wherein the multiplying/adding circuit comprises:
a first multiplier for multiplying output data from the delay circuit of the first stage by −1;
a second multiplier for multiplying output data from the delay circuit of the second stage by 8;
a third multiplier for multiplying output data from the delay circuit of the third stage by −1;
a first switching circuit for selectively outputting any one of data from the delay circuit of the first stage and data from the first multiplier;
a second switching circuit for selectively outputting any one of data from the delay circuit of the third stage and data from the third multiplier; and
an adder for adding output data from the second multiplier, output data from the first switching circuit, and output data from the second switching circuit.

77. The decompressing device according to claim 75, wherein the multiplying/adding circuit comprises:
a first multiplying/adding circuit which includes
a first multiplier for multiplying output data from the delay circuit of the first stage by −1;
a second multiplier for multiplying output data from the delay circuit of the second stage by 8; and
an adder for adding output data from the first multiplier, output data from the second multiplier, and output data from the delay circuit of the third stage;
a second multiplying/adding circuit which includes
a third multiplier for multiplying output data from the delay circuit of the second stage by 8;
a fourth multiplier for multiplying output data from the delay circuit of the third stage by −1; and
an adder for adding output data from the third multiplier, output data from the fourth multiplier, and output data from the delay circuit of the first stage; and
a switching circuit for selectively outputting any one of data from the first multiplying/adding circuit and data from the second multiplying/adding circuit.

78. The decompressing device according to claim 75, wherein the multiplying/adding circuit comprises:

a first multiplier for multiplying output data from the delay circuit of the first stage by −1;
a second multiplier for multiplying output data from the delay circuit of the second stage by 8;
a third multiplier for multiplying output data from the delay circuit of the third stage by −1;
a first adder for adding output data from the first multiplier, output data from the second multiplier, and output data from the delay circuit of the third stage;
a second adder for adding output data from the second multiplier, output data from the third multiplier, and output data from the delay circuit of the first stage; and
a switching circuit for selectively outputting any one of data from the first adder and data from the second adder.

79. The decompressing device according to claim 75, wherein the delay circuits of the three stages and the multiplying/adding circuit are designed as an oversampling circuit, and in the decompressing device at least two oversampling circuits are connected so as to have a cascade connection.

80. A decompressing device, comprising:
delay circuits of several stages into which discrete thinned-out data produced by a compressing device can be inputted, each of the delay circuits delaying the inputted thinned-out data in sequence;
a multiplying/adding circuit for performing weighted addition on the discrete thinned-out data outputted from each of the delay circuits to produce interpolation data for the thinned-out data, the weighted addition being performed according to a value of a digital basic function; and
an averaging circuit for producing average data of adjacent interpolation data values outputted from the multiplying/adding circuit,
wherein the compressing device comprises:
delay circuits of several stages for sequentially delaying each sampling data inputted therein in sequence; and
a multiplying/adding circuit for performing weighted addition on data outputted from each of the circuits, the weighted addition being performed according to a value of a digital basic function, whereby thinned-out data is produced from the sequentially inputted sampling data.

81. The decompressing device according to claim 80, wherein the delay circuits of the several stages and the multiplying/adding circuit are designed as an oversampling circuit, and in the decompressing device at least two oversampling circuits are connected so as to have a cascade connection.

82. A decompressing device, comprising:
delay circuits of four stages into which discrete thinned-out data produced by a compressing device can be inputted, each of the delay circuits delaying the inputted thinned-out data in sequence; and
a multiplying/adding circuit for performing weighted addition on data outputted from each of the delay circuits to produce interpolation data for the thinned-out data, the weighted addition being performed according to a value of a digital basic function,
wherein the compressing device comprises:
delay circuits of four stages for sequentially delaying each sampling data inputted therein in sequence;
a multiplying/adding circuit for performing weighted addition on data outputted from each of the delay circuits, the weight addition being performed according to a value of a digital basic function, whereby thinned-out data is produced from the sequentially inputted sampling data.

83. The decompressing device according to claim 82, wherein the multiplying/adding circuit comprises:
a first multiplier for multiplying output data from the delay circuit of the first stage by −1;
a second multiplier for multiplying output data from the delay circuit of the second stage by 9;
a third multiplier for multiplying output data from the delay circuit of the third stage by 9;
a fourth multiplier for multiplying output data from the delay circuit of the fourth stage by −1;
an adder for adding output data from the first to fourth multipliers; and
a switching circuit for selectively outputting any one of data from the adder and the thinned-out data to be inputted into the delay circuit of the first stage.

84. The decompressing device according to claim 82, wherein the multiplying/adding circuit comprises:
a first adder for adding output data from the delay circuit of the first stage and output data from the delay circuit of the fourth stage;
a second adder for adding output data from the delay circuit of the second stage and output data from the delay circuit of the third stage;
a first multiplier for multiplying output data from the first adder by −1;
a second multiplier for multiplying output data from the second adder by 9;
a third adder for adding output data from the first adder and output data from the second adder; and
a switching circuit for selectively outputting any one of data from the third adder and the thinned-out data to be inputted into the delay circuit of the first stage.

85. The decompressing device according to claim 82, wherein the delay circuits of the four stages and the multiplying/adding circuit are designed as an oversampling circuit, and in the decompressing device at least two oversampling circuits are connected so as to have a cascade connection.

86. A decompressing device, comprising:
delay circuits of five stages into which discrete thinned-out data produced by a compressing device can be inputted, each of the delay circuits delaying the inputted thinned-out data in sequence; and
a multiplying/adding circuit for performing weighted addition on the thinned out data outputted from each of the delay circuits to produce interpolation data for the thinned-out data, the weighted addition being performed according to a value of a digital basic functions
wherein the compression device comprises:
delay circuits of seven stages for sequentially delaying each sampling data inputted therein in sequence; and
a multiplying/adding circuit for performing addition on data outputted from each of the delay circuits, the weighted addition being performed according to a value of a digital basic function, whereby thinned-out data is produced from the sequentially inputted sampling data.

87. The decompressing device according to claim 86, wherein the multiplying/adding circuit comprises:
a first multiplying/adding circuit which includes
a first multiplier for multiplying output data from the delay circuit of the first stage by −1;
a second multiplier for multiplying output data from the delay circuit of the second stage by 9;
a third multiplier for multiplying output data from the delay circuit of the third stage by 25;
a fourth multiplier for multiplying output data from the delay circuit of the fourth stage by −1; and an adder for adding output data from the first to fourth multipliers;

a second multiplying/adding circuit which includes a fifth multiplier for multiplying output data from the delay circuit of the second stage by −1;

a sixth multiplier for multiplying output data from the delay circuit of the fourth stage by 9;

a seventh multiplier for multiplying output data from the delay circuit of the fifth stage by −1; and an adder for adding output data from the third multiplier and the fifth to seventh multipliers; and a switching circuit for selectively outputting any one of data from the first multiplying/adding circuit and data from the second multiplying/adding circuit.

88. A decompressing method, comprising the steps of:

successively inputting thinned-out data produced by a compressing method; and performing an interpolation process with respect to the inputted discrete thinned-out data to produce interpolation data for said discrete thinned-out data, in which in the interpolation process, weighted addition is performed on thinned-out data on a target sample point and thinned-out data on several sample points around said target sample point, the weighted addition being performed according to a value of a digital basic function, wherein the compressing method comprises:

sequentially inputting sampling data as target of compression; and performing weighted addition with respect to the inputted sampling data, the weighted addition being performed on sampling data on a target sample point and sampling data on several sample point around said target sample point, and the weighted addition being performed according to a value of a digital basic function, whereby thinned-out data is produced from the sequentially inputted sampling data.

89. The decompressing method according to claim 88, wherein each discrete thinned-out data is replaced with two interpolation data each of which has been produced by the weighted addition according to a value of the digital basic function.

90. The decompressing method according to claim 89, further comprising the step of performing an averaging operation with respect to the interpolation data produced through the weighted addition, wherein the averaging operation is performed on adjacent discrete interpolation data.

91. The decompressing method according to claim 88, wherein another weighted addition is further performed with respect to the interpolation data already produced through the weighted addition, in which said further weighted addition is performed on interpolation data on a target sample point and interpolation data on several sample points around said target sample point, the further weighted addition being performed according to a value of the digital basic function, whereby further interpolation data for the already produced interpolation data on said target sample point is produced.

92. A computer-readable medium containing computer code thereon for a decompressing program which, when executed, causes a computer to carry out steps recited in the method of claim 88.

93. A record medium readable by a computer, on which a program for making the computer to execute each of the steps of a decompressing method claimed in claim 88 is recorded.

94. A compressing/decompressing system, comprising:

a compression part into which sampling data can be sequentially inputted as a target of compression to perform a compression process on the sampling data, the compression process comprising the steps of:

sequentially inputting the sampling data therein; and performing weighted addition with respect to the inputted sampling data, the weighted addition being performed on sampling data on a target sample point and sampling data on several sample points around said target sample point, and the weighted addition being performed according to a value of a digital basic function, whereby thinned-out data is produced from the sequentially inputted sampling data; and a decompression part into which said thinned-out data can be inputted in sequence to perform a decompression process on the thinned-out data, the decompression process comprising the steps of:

sequentially inputting the thinned-out data therein; and performing weighted addition with respect to the sequentially inputted thinned-out data, the weighted addition being performed on thinned-out data on a target sample point and thinned-out data on several sample points around said target sample point, and the weighted addition being performed according to a value of the digital basic function, whereby interpolation data for the sequentially inputted thinned-out data is produced.

95. The compressing/decompressing system according to claim 94, wherein the compression process further comprises the step of replacing sampling data with zero data, in which among the discrete sampling data successively inputted as a target of compression, the sampling data to be replaced has an absolute value smaller than a predetermined value; and wherein the weighted addition is performed on the sampling data subjected to the data replacement process.

96. The compressing/decompressing system according to claim 94, wherein the compression process further comprises the step of performing a rounding operation to round a lower-order bit of the produced thinned-out data;

wherein the decompression process further comprises the step of performing an inverse rounding operation on the sequentially inputted thinned-out data in a manner reversed from the rounding operation; and wherein the weighted addition is performed on the thinned-out data subjected to the inverse rounding operation.

97. The compressing/decompressing system according to claim 96, wherein the rounding operation by the compression part is an operation in which data values before and after the rounding operation have a non-linear relationship; and wherein the compression process further comprises the step of performing a data replacement process with respect to the thinned-out data produced through the rounding operation, in which in the replacement process, when a predetermined number or more of data having absolute values of zero are outputted in the rounding operation, a set of said predetermined number of zero data is replaced with a pair of a value of −0 and a value indicating the number of successive zero, and then the thinned-out data including a replacement result is outputted from the compression part.

* * * * *